(12) United States Patent  
Aspar et al.

(10) Patent No.: US 7,902,038 B2
(45) Date of Patent: *Mar. 8, 2011

(54) DETACHABLE SUBSTRATE WITH CONTROLLED MECHANICAL STRENGTH AND METHOD OF PRODUCING SAME

(75) Inventors: Bernard Aspar, Rives (FR); Hubert Moriceau, Saint-Egreve (FR); Olivier Rayssac, Grenoble (FR); Bruno Ghyselen, Seyssinet (FR)

(73) Assignee: Commissariat A l'Energie Atomique, Paris (FR)

( * ) Notice: Subject to any disclaimer, the term of this patent is extended or adjusted under 35 U.S.C. 154(b) by 329 days.

This patent is subject to a terminal disclaimer.

(21) Appl. No.: 10/474,984

(22) PCT Filed: Apr. 11, 2002

(86) PCT No.: PCT/FR02/01268
§ 371 (c)(1),
(2), (4) Date: Jun. 10, 2004

(87) PCT Pub. No.: WO02/084722
PCT Pub. Date: Oct. 24, 2002

(65) Prior Publication Data
US 2004/0222500 A1    Nov. 11, 2004

(30) Foreign Application Priority Data

Apr. 13, 2001 (FR) .................................. 01 05130

(51) Int. Cl.
*H01L 23/58* (2006.01)
(52) U.S. Cl. ... 438/455; 438/958; 257/629; 257/E21.568
(58) Field of Classification Search .................. 257/629, 257/632, 631, 630, 626, 627, 618, E21.568, 257/E21.57, E21.602; 438/455, 458, 456, 457, 958, 406, 459
See application file for complete search history.

(56) References Cited

U.S. PATENT DOCUMENTS

| 3,901,423 A | 8/1975 | Hillberry et al. |
| 3,915,757 A | 10/1975 | Engel |
| 3,957,107 A | 5/1976 | Altoz et al. |

(Continued)

FOREIGN PATENT DOCUMENTS

EP    0 355 913    2/1990

(Continued)

OTHER PUBLICATIONS

Weigand, M. et al., "Wafer Bonding of Silicon Wafers Covered with Various Surface Layers," *Sensors and Actuators*, 86 (2000), pp. 91-95, Elsevier Science B. V.

(Continued)

*Primary Examiner* — Thomas L Dickey
*Assistant Examiner* — Fazli Erdem
(74) *Attorney, Agent, or Firm* — Brinks Hofer Gilson & Lione

(57) ABSTRACT

The invention relates to a method for production of a detachable substrate, comprising a method step for the production of an interface by means of fixing, using molecular adhesion, one face of a layer on one face of a substrate, in which, before fixing, a treatment stage for at least one of said faces is provided, rendering the mechanical hold at the interface at such a controlled level to be compatible with a subsequent detachment.

19 Claims, 6 Drawing Sheets

U.S. PATENT DOCUMENTS

| | | |
|---|---|---|
| 3,993,909 A | 11/1976 | Drews et al. |
| 4,006,340 A | 2/1977 | Gorinas |
| 4,028,149 A | 6/1977 | Deines et al. |
| 4,039,416 A | 8/1977 | White |
| 4,074,139 A | 2/1978 | Pankove |
| 4,107,350 A | 8/1978 | Berg et al. |
| 4,108,751 A | 8/1978 | King |
| 4,121,334 A | 10/1978 | Wallis |
| 4,170,662 A | 10/1979 | Weiss et al. |
| 4,179,324 A | 12/1979 | Kirkpatrick |
| 4,244,348 A | 1/1981 | Wilkes |
| 4,252,837 A | 2/1981 | Auton |
| 4,254,590 A | 3/1981 | Eisele et al. |
| 4,274,004 A | 6/1981 | Kanai |
| 4,342,631 A | 8/1982 | White et al. |
| 4,346,123 A | 8/1982 | Kaufmann |
| 4,361,600 A | 11/1982 | Brown |
| 4,368,083 A | 1/1983 | Bruel et al. |
| 4,412,868 A | 11/1983 | Brown et al. |
| 4,452,644 A | 6/1984 | Bruel et al. |
| 4,468,309 A | 8/1984 | White |
| 4,471,003 A | 9/1984 | Cann |
| 4,486,247 A | 12/1984 | Ecer et al. |
| 4,490,190 A | 12/1984 | Speri |
| 4,500,563 A | 2/1985 | Ellenberger et al. |
| 4,508,056 A | 4/1985 | Bruel et al. |
| 4,536,657 A | 8/1985 | Bruel |
| 4,539,050 A | 9/1985 | Kramler et al. |
| 4,542,863 A | 9/1985 | Larson |
| 4,566,403 A | 1/1986 | Fournier |
| 4,567,505 A | 1/1986 | Pease |
| 4,568,563 A | 2/1986 | Jackson et al. |
| 4,585,945 A | 4/1986 | Bruel et al. |
| 4,630,093 A | 12/1986 | Yamaguchi et al. |
| 4,684,535 A | 8/1987 | Heinecke et al. |
| 4,704,302 A | 11/1987 | Bruel et al. |
| 4,717,683 A | 1/1988 | Parrillo et al. |
| 4,764,394 A | 8/1988 | Conrad |
| 4,837,172 A | 6/1989 | Mizuno et al. |
| 4,846,928 A | 7/1989 | Dolins et al. |
| 4,847,792 A | 7/1989 | Barna et al. |
| 4,853,250 A | 8/1989 | Boulos et al. |
| 4,887,005 A | 12/1989 | Rough et al. |
| 4,894,709 A | 1/1990 | Phillips et al. |
| 4,904,610 A | 2/1990 | Shyr |
| 4,920,396 A | 4/1990 | Shinohara et al. |
| 4,929,566 A | 5/1990 | Beitman |
| 4,931,405 A | 6/1990 | Kamijo et al. |
| 4,948,458 A | 8/1990 | Ogle |
| 4,952,273 A | 8/1990 | Popov |
| 4,956,698 A | 9/1990 | Wang |
| 4,960,073 A | 10/1990 | Suzuki et al. |
| 4,975,126 A | 12/1990 | Margail et al. |
| 4,982,090 A | 1/1991 | Wittmaack |
| 4,996,077 A | 2/1991 | Moslehi et al. |
| 5,013,681 A | 5/1991 | Godbey et al. |
| 5,015,353 A | 5/1991 | Hubler et al. |
| 5,034,343 A | 7/1991 | Rouse et al. |
| 5,036,023 A | 7/1991 | Dautremont-Smith et al. |
| 5,110,748 A | 5/1992 | Sarma |
| 5,120,666 A | 6/1992 | Gotou |
| 5,138,422 A | 8/1992 | Fujii et al. |
| 5,198,371 A | 3/1993 | Li |
| 5,200,805 A | 4/1993 | Parsons et al. |
| 5,232,870 A | 8/1993 | Ito et al. |
| 5,234,535 A | 8/1993 | Beyer et al. |
| 5,242,863 A | 9/1993 | Xiang-Zheng et al. |
| 5,250,446 A | 10/1993 | Osawa et al. |
| 5,256,581 A | 10/1993 | Foerstner et al. |
| 5,259,247 A | 11/1993 | Bantien |
| 5,300,788 A | 4/1994 | Fan et al. |
| 5,310,446 A | 5/1994 | Konishi et al. |
| 5,400,458 A | 3/1995 | Rambosek |
| 5,405,802 A | 4/1995 | Yamagata et al. |
| 5,413,951 A | 5/1995 | Ohori et al. |
| 5,494,835 A | 2/1996 | Bruel |
| 5,524,339 A | 6/1996 | Gorowitz et al. |
| 5,559,043 A | 9/1996 | Bruel |
| 5,567,654 A | 10/1996 | Beilstein, Jr. et al. |
| 5,611,316 A | 3/1997 | Oshima et al. |
| 5,618,739 A | 4/1997 | Takahashi et al. |
| 5,622,896 A | 4/1997 | Knotter et al. |
| 5,633,174 A | 5/1997 | Li |
| 5,661,333 A | 8/1997 | Bruel et al. |
| 5,714,395 A | 2/1998 | Bruel |
| 5,804,086 A | 9/1998 | Bruel |
| 5,811,348 A | 9/1998 | Matsushita et al. |
| 5,817,368 A | 10/1998 | Hashimoto |
| 5,854,123 A | 12/1998 | Sato et al. |
| 5,863,830 A | 1/1999 | Bruel et al. |
| 5,863,832 A | 1/1999 | Doyle et al. |
| 5,877,070 A | 3/1999 | Goesele et al. |
| 5,882,987 A * | 3/1999 | Srikrishnan ............... 438/458 |
| 5,897,331 A | 4/1999 | Sopori |
| 5,909,627 A | 6/1999 | Egloff |
| 5,920,764 A | 7/1999 | Hanson et al. |
| 5,953,622 A | 9/1999 | Lee et al. |
| 5,966,620 A | 10/1999 | Sakaguchi et al. |
| 5,981,400 A * | 11/1999 | Lo .............................. 438/745 |
| 5,985,412 A * | 11/1999 | Gosele ........................ 428/172 |
| 5,993,677 A | 11/1999 | Biasse et al. |
| 5,994,207 A | 11/1999 | Henley et al. |
| 6,010,591 A | 1/2000 | Gösele |
| 6,013,563 A | 1/2000 | Henley et al. |
| 6,013,954 A | 1/2000 | Hamajima |
| 6,020,252 A | 2/2000 | Aspar et al. |
| 6,033,974 A | 3/2000 | Henley et al. |
| 6,048,411 A | 4/2000 | Henley et al. |
| 6,054,363 A | 4/2000 | Sakaguchi et al. |
| 6,054,370 A | 4/2000 | Doyle |
| 6,057,212 A * | 5/2000 | Chan et al. ................. 438/455 |
| 6,071,795 A | 6/2000 | Cheung et al. |
| 6,096,433 A | 8/2000 | Kikuchi et al. |
| 6,103,597 A | 8/2000 | Aspar et al. |
| 6,103,599 A | 8/2000 | Henley et al. |
| 6,118,181 A * | 9/2000 | Merchant et al. .......... 257/757 |
| 6,127,199 A | 10/2000 | Inoue |
| 6,146,979 A | 11/2000 | Henley et al. |
| 6,150,239 A | 11/2000 | Goesele et al. |
| 6,159,323 A | 12/2000 | Joly |
| 6,190,998 B1 | 2/2001 | Bruel et al. |
| 6,198,159 B1 | 3/2001 | Hosoma et al. |
| 6,200,878 B1 | 3/2001 | Yamagata et al. |
| 6,204,079 B1 * | 3/2001 | Aspar et al. .................. 438/25 |
| 6,316,333 B1 | 11/2001 | Bruel et al. |
| 6,362,082 B1 | 3/2002 | Doyle et al. |
| 6,417,075 B1 | 7/2002 | Haberger et al. |
| 6,429,104 B1 | 8/2002 | Auberton-Herve |
| 6,513,564 B2 | 2/2003 | Bryan et al. |
| 6,534,380 B1 | 3/2003 | Yamauchi et al. |
| 6,645,831 B1 * | 11/2003 | Shaheen et al. ............ 438/455 |
| 6,645,833 B2 | 11/2003 | Brendel |
| 6,653,207 B2 * | 11/2003 | Ohya et al. ................. 438/458 |
| 6,727,549 B1 | 4/2004 | Doyle |
| 6,756,285 B1 * | 6/2004 | Moriceau et al. .......... 438/455 |
| 6,756,286 B1 | 6/2004 | Moriceau et al. |
| 6,764,936 B2 | 7/2004 | Daneman et al. |
| 2004/0209441 A1 * | 10/2004 | Maleville et al. .......... 438/455 |
| 2004/0222500 A1 * | 11/2004 | Aspar et al. ................ 257/629 |
| 2005/0029224 A1 * | 2/2005 | Aspar et al. .................. 216/33 |

FOREIGN PATENT DOCUMENTS

| | | |
|---|---|---|
| EP | 0 410 679 A1 | 1/1991 |
| EP | 0 504 714 | 9/1992 |
| EP | 0 533 551 A1 | 3/1993 |
| EP | 0 293 049 B1 | 9/1993 |
| EP | 0 660 140 | 6/1995 |
| EP | 0 665 588 A1 | 8/1995 |
| EP | 0 703 609 | 3/1996 |
| EP | 0 754 953 B1 | 1/1997 |
| EP | 0 793 263 A2 | 9/1997 |
| EP | 0 801 419 A1 | 10/1997 |
| EP | 0 807 970 A1 | 11/1997 |
| EP | 0849788 A2 | 6/1998 |
| EP | 0 889 509 A2 | 1/1999 |
| EP | 0 898 307 * | 2/1999 |
| EP | 0 917 193 A1 | 5/1999 |

| | | |
|---|---|---|
| EP | 0 938 129 A1 | 8/1999 |
| EP | 0 902 843 B1 | 3/2000 |
| EP | 0 989 593 A2 | 3/2000 |
| EP | 0 994 503 A1 | 4/2000 |
| EP | 1 050 901 A2 | 11/2000 |
| EP | 1 059 663 A2 | 12/2000 |
| FR | 2 671 472 A1 | 7/1992 |
| FR | 2 681 472 | 3/1993 |
| FR | 2 558 263 | 7/1995 |
| FR | 2 725 074 | 3/1996 |
| FR | 95 08882 | 6/1996 |
| FR | 2 736 934 | 1/1997 |
| FR | 2 767 604 | 8/1997 |
| FR | 2 748 850 A1 | 11/1997 |
| FR | 2 748 851 | 11/1997 |
| FR | 2 771 852 A1 | 12/1997 |
| FR | 2 758 907 A1 | 7/1998 |
| FR | 2 767 416 A1 | 2/1999 |
| FR | 2 773 261 | 7/1999 |
| FR | 2 774 510 A1 | 8/1999 |
| FR | 2 781 925 A1 | 2/2000 |
| FR | 2 796 491 | 1/2001 |
| FR | 2 797 347 | 2/2001 |
| GB | 2 211 991 A | 7/1989 |
| JP | 53-104156 | 9/1978 |
| JP | 58 31519 | 2/1983 |
| JP | 59-54217 | 3/1984 |
| JP | 62265717 | 11/1987 |
| JP | 101004013 | 1/1989 |
| JP | 08017777 | 1/1990 |
| JP | 04199504 | 7/1992 |
| JP | 4199504 | 7/1992 |
| JP | 07-254690 | 10/1995 |
| JP | 7-302889 | 11/1995 |
| JP | 8133878 | 5/1996 |
| JP | 09-213594 | 8/1997 |
| JP | 09-307719 | 11/1997 |
| JP | 10163166 | 6/1998 |
| JP | 10233352 | 9/1998 |
| JP | 11045862 | 2/1999 |
| JP | 11074208 | 3/1999 |
| JP | 11087668 | 3/1999 |
| JP | 11-145436 | 5/1999 |
| JP | 11317577 | 11/1999 |
| RU | 128757 | 6/2000 |
| WO | WO 95/20824 A1 | 8/1995 |
| WO | WO 99/08316 A1 | 2/1999 |
| WO | WO 99/35674 A1 | 7/1999 |
| WO | WO 99/39378 A1 | 8/1999 |
| WO | WO 00/48238 A1 | 8/2000 |
| WO | WO 00/63965 A1 | 10/2000 |
| WO | WO 01/11930 A2 | 2/2001 |
| WO | WO 01/43168 A2 | 6/2001 |

OTHER PUBLICATIONS

Theodore, N. David et al., TFSOI With Improved Oxidation Resistance (to Reduce Isolation Induced Stresses and Leakage), Motorola (bulletin) XP 000691920, *Technical Developments*, Nov. 1996, pp. 158-159.

Japanese Final Office Action date Oct. 25, 2007 for Japanese Patent Application No. 2002-581572.

Agarwal et al, " Efficient Production of Silicon-On-Insulator Films by Co-Implantation of HE+ with H+", *Applied Physics Letters*, vol. 72, No. 9, 1988, pp. 1086-1088.

Agarwal, Aditya et al. "Efficient Production of Silicon-On-Insulator Films by Co-Implantation of He$^+$ with H$^{+}$"—Proceedings 1997 IEEE International SOI Conference, Oct. 1997—pp. 44-45.

Ahn, K. Y., et al., "Growth, Shrinkage, And Stability of Interfacial Oxide Layers Between Directly Bonded Silicon Wafers", *Applied Physics A.*, vol. 50, 1990, pp. 85-94.

Alley et al., "Surface Roughness Modification of Interfacial Contacts in Polysilicon Microstructures", Proceedings of the 7$^{th}$ International Conference on Solid-State Sensors and Actuators, *Transducers '93*, Pacifico, Yokohama Japan. Jun. 7-10, 1993, pp. 288-291.

Almedia et al. "Bond formation in ion beam synthesized amorphous gallium nitride", *Elsevier, This Solid Films*, 343-344 1999, pp. 632-636.

Ascheron, C., "A Comparative Study of Swelling, Radiation, Strain and Radiation Damage of High-Energy Proton-bombarded GaAs, GaP, InP, SI and Ge Single Crystals, Nuclear Instruments and Methods in Physics Research", *Nuclear Instruments and Methods In Physics Research* B36, (1989), 1637172.

Ascheron, C., "A Study of Proton Bombardment Induced Swelling of GaP Single Crystals", *Phys. stat. sol.* (a) 92, (1985), pp. 169.

Ascheron, C., "Gettering a Copper in Proton-and Helium-Bombarded Buried Regions of Gallium Phosphide", *Phys. stat. sol.* (a), vol. 106, 1988, pp. 73-79.

Ascheron, C., "Investigations of Hydrogen Implanted GaP Single Crystals by Means of Particle Induced 7-Spectroscopy, Infrared Spectroscopy, and Turyherford Backscattering Channeling Technique" *Phys. stat. sol.* (a) 89, (1985), pp. 549.

Ascheron, C., "Proton Beam Modification of Selected AIIIBV Compounds", *Phys. stat. sol.* (a) 124, (1991), pp. 11.

Ascheron, C. et al, "Proton Bombardment Induced Swelling of GaP", 1985, pp. 169-176.

Ascheron, C., "Swelling, Strain, and Radiation Damage of He+ Implanted GaP", *Phys. stat. sol.* (a) 96, 1986, pp. 555-562. (1986).

Asheron, C., "The Effect of Hydrogen Implantation Induced Stress on GaP Single Crystals", *Nuclear Instruments and Methods in Physics Research*, B28 (1987), pp. 350-359.

Aspar et al., "The Generic Nature of the Smart-Cut© Process for Thin-Film Transfer", *Journal of Electronic Materials*, vol. 30, No. 7, Mar. 2001, pp. 834-840.

Aspar et al., Smart-Cut®: The basic fabrication process for UNIBOND® SOI wafers, *SEMI* 1996, pp. 37-46.

Aspar et al., U.S. App. No. 09/777,516, also Pub. No. US 2001/0007789 A1 with copy of allowed claims, Published Jul. 12, 2001.

Aspar et al., U.S. App. No. 10/784,601, including pending claims, filed Feb. 23, 2004.

Aspar, B. "Basic Mechanisms Involved in the Smart-Cut Process", 1997, pp. 223-240.

Aspar, B. et al, "Characterization of SOI substrates: Application to Recent SIMOX and UNIBOND Wafers," *Electrochemical Society Proceedings*, vol. 96-3, pp. 99-111.

Aspar, B. et al, "Transfer of Structured and Patterned Thin Silicon Films Using the Smart-Cut Process", 1996, pp. 1985-1986.

Aspar, B. et al., "Ultra Thin Buried Oxide Layers Formed by Low Dose SIMOX Processes", Proc. 6$^{th}$ International Conference on SOI Technology and Devices, *Electro. Soc.*, vol. 94, No. 11, 1994, pp. 62.

Auberton-Herve, A. J. et al, "A New Sal Material: Smart-Cut", 1996, pp. 214-219.

Auberton-Herve, A.J. et al, "SOI Materials for ULSI Applications", *Semiconductor International*, Oct. 1995, 5 pps.

Blöchl P.E. et al., First-Principles Calculations of Diffusion Coefficients: Hydrogen in Silicon, *Physical Review Letters*, vol. 64, No. 12, 1990, pp. 1401-1404.

Borgati, Stephen P., "The Root-Mean-Square", Boston College, Nov. 16, 1998, Obtained from the Internet at: <http://www.analytictech.com/mb313/rootmean.htm>.

Bruel, M. et al., (vol. 99-1) Meeting Abstract No. 333, "Single Crystal Semiconductor Layer Delamination and Transfer Through Hydrogen Implantation", The 195$^{th}$ Meeting of the Electrochemical Society, May 2-6, 1999, Seattle, Washington.

Bruel, Michel, "Application of Hydrogen Ion Beams to Silicon on Insulator Material Technology", *Nuclear Instruments and Methods in Physics Research*, B108, 1996, pp. 313-319.

Bruel, M. et al., "Smart-Cut: A New Silicon on Insulator Material Technology Based on Hydrogen Implantation and Wafer Bonding", 1997, pp. 1636-164, Col. 36, Part 1, No. 3B.

Bruel, M. "Smart-Cut Process: The Way to Unibond S.O.I. Wafers", 1996, pages unknown.

Bruel, M. et al, "Smart-Cut": A Promising New SOI material technology, *Proceedings 1994 IEEE, International Sal Conference*, Oct. 1995, pp. 178-179.

Bruel, M. et al, "Smart-Cut-a new SOI Material Technology based on hydrogen Implantation and wafer bonding," *CEA*, 1996, 24 pages.

Bruel, M., "Silicon on insulator Material Technology", *Electronic Letters*; 31 (1995) Jul. 6; No. 14; pp. 1201-1202.

Bruel, M., "Silicon-an-Insulator", *European Semiconductor*, Mar. 1997.

Camperi-Ginestet et al., "Alignable Epitaxial Liftoff of GaAs Materials With Selective Deposition Using Polyimide Diaphragms", *IEEE Transactions Photonics Technology Letters*, vol. 3, No. 12, 1991, pp. 1123-1126.

Canham et al. "Radiative Recombination Channels due to Hydrogen In Crystalline Silicon", *Materials Science and Engineering*, B4 (1989) pp. 41-45.

Carter et al., "Applications of Ion Beams to Materials", *Inst. Phys. Conf. Ser.*, No. 28, Chapter 1, 1976, pp. 30-36.

Carter, G. et al., The Collection of Ions Implanted in Semiconductors: II Range Distributions Derived From Collection and Sputter-Etch Curves, *Radiation Effects*, 1972, vol. 16, pp. 107-114.

Cassidy, Victor M., "Ion Implantation Process Toughens Metalworking Tools," *Modern Metals*, 1984, pp. 65-67.

Cerofolini et al., "Hydrogen-Related Complexes as the Stressing Species in High- Fluence, Hydrogen-Implanted, Single-Crystal Silicon" *Physical Review B*, vol. 46, No. 4, 1992, pp. 2061-2070.

Cerofini et al., "Ultradense Gas Bubbles in Hydrogen-or-Helium-Implanted (or Co-Implanted) Silicon", *Materials Science and Engineering*, B71, 2000, pp. 196-202.

Cerofolini et al., "Hydrogen and Helium Bubbles in Silicon", *Material Science and Engineering 2000*—Reports: A Review Journal, Published by Elsevier Science S.A. 2000, pp. 1-52.

Chu et al, "Radiation Damage of 50-250 keV Hydrogen Ions in Silicon", *Ion Implantation in Semiconductors*, eds. F. Chernob et al., Plenum New York 1976, pp. 483-492.

Chu, et al. "Ion Implantation In Semiconductors", Chernow, Borders and Brice, Pirnum Press, New York and London. Radiation Damage of 50-250 keV Hydrogen Ions in Silicon, 1976, pp. 483-491.

Chu, P.K. et al., "Plasma Immersion Ion Implantation-A Fledgling Technique for Semiconductor Processing", Materials Science and Engineering Reports, *A Review Journal*, vol. R17, Nos. 6-7, Nov. 30, 1996, pp. 207-280.

Cowern, N. et al., "Transport Diffusion of Ion-Implanted B In Si: Dose, Time, and Matrix Dependence of Atomic and Electrical Profiles", *J. Appl. Phys.*, vol. 68, No. 12, 1990, pp. 6191-6198.

Cristoloveanu, S. et al, "Electrical Properties of Unibond Material", *Electrochemical Society Proceedings*, vol. 96-3, pp. 142-147.

Csepregl, L. et al. "Regrowth Behavior of Ion-Implanted Amorphous Layers on <111> Silicon", *Applied Physics Letters*, vol. 2, 1976, pp. 92-93.

Cullis, A.G. et al. "Comparative study of annealed neon-, argon-, and krypton-ion implantation damage in silicon,"*J. Appl. Phys.*, 49(10), Oct. 1978, pp. 5188-5198.

Demeester, et al., "Epitaxial Lift-Off and Its Applications", *Semicond. Sci. Technol.*, vol. 8, 1993, pp. 1124-1135.

Denteneer, P. et al., Hydrogen Diffusion and Passivation of Shallow Impurities in Crystalline Silicon, *Materials Science Forum*, Trans Tech Publications, Switzerland, vols. 38-41, 1989, pp. 979-984.

Denteneer, P. et al., "Structure and Properties of Hydrogen-Impurity Pairs in Elemental Semiconductors", *Physical Review Letters*, vol. 62, No. 16, 1989, pp. 1884-1888.

DiCioccio, et al.,"Silicon carbide on Insulator formation using the Smart Cut process", *Electronics Letters*, vol. 32, No. 12, Jun. 6, 1996, pp. 144-145.

Diem et al., "SOI 'SIMOX': From Bulk to Surface Micromachining, A New Age For Silicon Sensors and Actuators", *Sensors and Actuators*, vol. A 46-47, 1995, pp. 8-16.

Dirks, A. G. et al., "Columnar Microstructure In Vapor DEuropesited Thin Films ", *Thin Solid Films*, vol. 47, 1977, pp. 219-233.

Duo, et al., "Comparison Between The different Implantation orders in H+ and He+ Co-implantation", *J. Phys. D. Appl. Phys.* vol. 34, 2001, pp. 477-482.

Eaglesham, White, Feldman, Moriya And Jacobson, "Equilibrium Shape of Si," *Physical Review Letters*, vol. 70, No. 11, Mar. 15, 1993, pp. 1643-1646.

EerNisse, E., "Compaction of ion-implanted fused silica", *Journal of Applied Physics*, vol. 45, No. 1, Jan. 1974.

EerNisse, E.P., "Role of Integrated Lateral Stress In Surface Deformation of He-Implanted Surfaces" *Journal of Applied Physics*, vol. 48, No. 1, Jan. 1977, pp. 9-17.

Evans, J.H., "An Interbubble Fracture Mechanism Of Blister Formation On Helium-Irradiated Metals" *Journal of Nuclear Materials*, 68, 1977, pp. 129-140.

Feijoo et al., "Prestressing of Bonded Wafers", vol. 92-7, 1992, pp. 230-238.

Feng et al., "Generalized Formula for Curvature Radius and Layer Stresses Caused by Thermal Strain In Semiconductor Multilayer Structures", *J. Appl. Phys.*, vol. 54, No. 1, 1983, pp. 83-85.

Garnier, D. M., "The Fabrication Of A Partial Soi Substrate", Proceedings of the $9^{th}$ International Symposium On Silicon On Isolator Technology and Devices, vol. 99, Chap. 54, 1990, 73-78.

Gerasimenko, N., "Infrared Absorption of Silicon Irradiated by Protons", *Phys. stat.sol.* (b) 90, (1978), pp. 689-695.

Ghandi, Sorab, "VLSI Fabrication Princiles-Silicon And Gallium Arsenide",*Rensselaer Polytechnic Institute*, 1983, John Wiley & Sons publishers, pp. 135.

Goesele et al., "Semiconductor Wafer Bonding", Science and Technology, ECS Series, *Annual Review of Material Science*, vol, 28, New Jersey, 1999, pp. 215-241.

Greenwald, A.C., "Pulsed-electron-beam annealing of ion-implantation damage", *J. Appl. Phys.* 50(2), Feb. 1978, pp. 783-786.

Grovenor, C.R.M., *Microelectronic Materials*, pp. 73-75 (1989).

Guilhalmenc, C. et al, "Characterization By Atomic Force Microscopy of the SOI Layer Topography in Low Dose SIMOX Materials", *Materials Science and Engineering*, B46, 1997, pp. 29-32.

Haisma et al., Silicon-on-Insulator Wafer Bonding-Wafer Thinning Technological Evaluations, *JAPANese Journal of Applied Physics*, 28, 1989, Aug., No. 8, Part 1, Tokyo, Japan, pp. 1426-1443.

Hamaguchi et al., "Device Layer Transfer Technique using Chemi-Mechanical Polishing", *JAPANese Journal of Applied Physics*, 23,(1984), Oct., No. 10, Part 2, Tokyo, Japan, pp. L815-L817.

Hamaguchi et al., "Novel LSI/SOI Wafer Fabrication Using Device Layer Transfer Technique", *Proc. IEDM*, 1985, pp. 688-691.

Henttinen et al., "Mechanically Induced Si Layer Transfer if Hydrogen-Implanted Si-Wafers", *American Institute of Physics*, vol. 76, No. 17, 2000, pp. 2370-2372.

Hulett, D.M. et al., "Ion Nitriding and Ion Implantation: A Comparison," *Metal Progress*, 1985, pp. 18-21.

IBM Technical Disclosure Bulletin, *Isolation by Inert Ion Implantation*, 1986, vol. 29 No. 3, pp. 1416.

IBM Technical Disclosure Bulletin, *SOI Interposer Structure XP 000627972*, Jul. 1996, vol. 39 No. 7, pp. 1-5.

Jaussaud, C. et al., Microstructure of Silicon Implanted With High Dose Oxygen Ions, *Appl. Phys. Lett.*, vol. 48, No. 11, 1985, pp. 1064-1066.

Johnson, "High Fluence Deuteron Bombardment of Silicon", *Radiation Effects*, vol. 32, pp. 159-167.

Jones, K. S. et al., "A Systematic Analysis of Defects in Ion Implanted Silicon", *Applied Physics A.*, vol. 45, 1988 pp. 1-34.

Jones et al., "Enhanced elimination of implantation damage upon exceeding the solid solubility", *J. App. Phys.*, vol. 62, No. 10, 1987, pp. 4114-4117.

Kamada et al, Observation of Blistering and Amorphization on Germanium Surface After 450 keV Ar+ION Bombardment, *Radiation Effects*, vol. 28, 1976, pp. 43-48.

Klem, J.F., "Characteristics of Lift-Off Fabricated AlGaAs/InGaAs Single-Strained-Quantum Well Structures On Glass and Silicon Substrates", *Inst. Phys. Conf.* Ser. No. 96: Chapter 6, (1989), pp. 387-392.

Komarov et al., Crystallographic Nature and Formation Mechanisms of Highly Irregular Structure in Implanted and Annealed S1, Layers*Radiation Effects*, vol. 42, 1979, pp. 169-178.

Leti Outline-A New SOI Material Technology, 1996 (Author Unknown), pages unknown.

Li, J., "Novel Semiconductor Substrate Formed by Hydrogen Ion Implantation into Silicon," Appl. Phys. Lett., vol. 55, No. 21, Nov. 20, 1989, pp. 2223-2224.

Ligeon, E., "Hydrogen Implantation in Silicon Between 1.5 and 60 KeV", *Radiation Effects 1976*, vol. 27, pp. 129-137.

Liu et al. "Ion Implantation in GaN At Liquid-Nitoigen Temperature: Structural Characteristics and Amorphization", *Physical Review B of The American Physical Society*, vol. 57, No. 4, 1988, pp. 2530-2535.

Lu, X., et al., "SOI Material Technology Using Plasma Immersion ION Implantation", Proceedings 1996 IEEE International SOI Conference, Oct. 1996, pp. 48-49.

Maleville, C. et al, "Physical Phenomena involved in the Smart-Cut Process", *Electrochemical Society Proceeding*, vol. 96-3, pp. 34-46.

Maleville, C. et al, "Wafer Bonding and Hi-Implantation Mechanisms Involved In The Smart-Cut Technology", 1997, pp. 14-19.

Manuaba, A., "Comparative Study on Fe32Ni36CrI4P12B 6 Metallic Glass and its Polycrystalline Modification bombarded by 2000 keV Helium Ions with High Fluence" *Nuclear Instruments and Methods*, (1982) pp. 409-419.

Mastrangelo, C. et al., "Suppression of Stiction in MEMS", *Proceedings of the Materials Research Society Seminar*, vol. 605, 2000, pp. 1-12.

Matsuda et al., "Large Diameter Ion Beam Implantation System," *Nuclear Instruments and Methods*, vol. B21, 1987, pp. 314-316.

Matsuo et al., "Abnormal solid solution and activation behavior in GA-implanted Si(100)", *Appl. Phys. Lett.*, vol. 51, No. 24, 1987, pp. 2037-2039.

Mishima, Y. and T. Yagishita, T. "Investigation of the bubble formation mechanism in a-Si:H films by Fourier-transform infrared microspectroscopy" *J. Appl. Phys.*, vol. 64, No. 8, Oct. 15, 1988, pp. 3972-3974.

Miyagawa, S. et al, "Helium Reemission During Implantation of Silicon Carbide", 1982, pp. 2302-2306.

Miyagawa, S., "Surface structure of silicon carbide Irradiated with helium ions with mono energy and continuous energy distributions" *J. Appl. Phys.* 53(12), Dec. 1982, pp. 8697-8705.

Monemar, B. "Shallow Impurities in Semiconductors 1998", Proceedings of the Third International Conference in Sweden, Aug. 10-12, 1988, No. 95, pp. 493-499.

Moreau, Wayne M., "Semiconductor Lithography, Principles, Practices, and Materials," Plenum Press, 1988. Table of Contents only.

Moriceau, H. et al, A New Characterization Process Used to Qualify SOI Films 1991 pp. 173-178.

Moriceau, H. et al, "A New Characterization Process Used to Qualify SOI Films", 1991 pp. 173-178.

Moriceau, H. et al. "Cleaning and Polishing As Key Steps for Smart-Cut SOI Process", Proceedings 1996 IEEE SOI Conference, Oct. 1996.

Moriceau, H. et al, "The Smart-Cut Process as a Way to Achieve Specific Film Thickness in Sal Structures", 1997, pages unknown.

Moriceau et al., (vol. 99-1) Meeting Abstract No. 405, "A New Characterization Process Used to Qualify SOI Films", The 195$^{th}$ Meeting of the Electrochemical Society, May 2-6, 1999, Seattle, Washington.

Munteanu, D. et al, "Detailed Characterization of Unibond Material", 1997, pp. 395-398.

Myers, D. R., "The effects of Ion-Implantation damage on the first order Raman spectra GaPa)" *J. Appl. Phys.* 54(9), Sep. 1977.

Nethling. J. et al, "Identification of Hydrogen Platelets in ProtonBombarded GaAs", 1985, pp. 941-945.

Nichols C. S et al., "Properties of Hydrogen in Crystalline Silicon Under Compression and Tension", *Physical Review Letters*, vol. 63, No. 10, 1989, pp. 1090-1093.

Nicoletti, S. et al., "Bi-Epitaxial YBCO Grain Boundry Josephson Junctions on SrTiO3 and Sapphire Substrates", *Physics C269*, 1996, pp. 255-267.

Office Action (NF) U.S. Appl. No. 10/468,223—Dated Oct. 5, 2005.
Office Action (F) U.S. Appl. No. 10/468,223—Dated May 3, 2006.
Office Action (NF) U.S. Appl. No. 10/468,223—Dated Jan. 10, 2007.
Office Action (F) U.S. Appl. No. 10/468,223—Dated Jul. 20, 2007.
Office Action (NF) U.S. Appl. No. 10/468,223—Dated Feb. 11, 2008.
Office Action (F) U.S. Appl. No. 10/468,223—Dated Oct. 29, 2008.
Office Action (NF) U.S. Appl. No. 10/468,223—Dated Jun. 25, 2009.
Office Action (NF) U.S. Appl. No. 10/540,303—Dated Dec. 18, 2007-Issued.
Office Action (NF) U.S. Appl. No. 10/561,299—Dated Mar. 26, 2008.
Office Action (F) U.S. Appl. No. 10/561,299—Dated Dec. 9, 2008.
Office Action (F) U.S. Appl. No. 10/561,299—Dated May 11, 2009.
Office Action (F) U.S. Appl. No. 10/561,299—Dated Nov. 16, 2009.
Office Action (NF) U.S. Appl. No. 10/561,299—Dated Nov. 27, 2009.
Office Action (NF) U.S. Appl. No. 10/565,621—Dated May 15, 2007.
Office Action (F) U.S. Appl. No. 10/565,621—Dated Feb. 11, 2008.
Office Action (NF) U.S. Appl. No. 10/565,621—Dated Sep. 12, 2008.
Office Action (F) U.S. Appl. No. 10/565,621—Dated Mar. 12, 2009.

Ono et al., "Orientation Dependence of Flaking of Ion Irradiated Aluminum Single Crystals", *Japanese Journal of Applied Physics*, vol. 25, No., 10, 1986, pp. 1475-1480.

Paszti, E, "Flaking and Wave-Like Structure on Metallic Glasses Induced by Me-Energy Helium Ions", *Nuclear Instruments and Methods*, vol. 209/210, (1983), pp. 273-280.

Picraux, S. Thomas et al., "Ion Implantation of Surfaces," *Scientific American*, vol. 252, No. 3, pp. 102-113 1985.

Pollentier, et al., "Fabrication of High-Radiance LEDs by Epitaxial Lift-Off", *SPIE*, vol. 1361, 1990, pp. 1056-1062.

Popov, V.P. et al., "Blistering On A Silicon Surface in the Process of Sequential Hydrogen/Helium ION Co-Iplantation"—Optoeleciron-ics Instrumentation and Data Processing, No. 3, pp. 90-98—Apr. 5, 2001.

Primak, W., "Impurity Effect in the Ionization Dilation of Vitreous Silica" *J. Appl. Phys.* 39(13) 1968.

Reissue U.S. Appl. No. 10/449,786.

Renier, M. et al., "A New Low-Energy Ion Implanter for Bombardment of Cylindrical Surfaces," *Vacuum*, vol. 35, No. 12, pp. 577-578, 1985.

Roth, J., "Blistering and Bubble Formation" *Inst. Phys. Conf.* Ser. No. 28, 1976: Chapter 7, pp. 280-293.

Sah, Chih-Tang et al., "Deactivation of the Boron Acceptor in Silicon by Hydrogen," *Appl. Phys. Lett.* 43, (2), Jul. 1983, pp. 204-206.

Saint-Jacques R. G., "La Formation des Cloques", *Nuclear Instruments and Methods*, No. 209/210, North Holland Publishing Co., 1983, pp. 333-343.

Schnell et al., "Plasma Surface Texturization for Multicrystaline Silicon Solar Cells", *IEEE*, XXVIII, Photovoltaic Conference, 2000, pp. 367-370.

Shintani, A. et al., "Temperature dependence of stresses in chemical deposited vitreous films", *J. Appl. Phys.*, vol. 51, No. 8, 1980, pp. 4197.

Silicon-On-Insulator, *European Semiconductor*, Mar. 1997, pp. 17 and 18.

Sioshansi, Piran, "Ion Beam Modification of Materials for Industry," *Thin Solid Film*, vol. 118, 1984, pp. 61-71.

Snyman, H. C., "Transmission Electron Microscopy of Extended Crystal Defects in Proton Bombarded and Annealed GaAs", *Radiation Effects*, 1983, vol. 69, pp. 199-230.

Snyman, H. C. et al, "Void Formation in Annealed Proton-Bombarded GaAs", 1981, pp. 243-245.

Stein, Myers and Follstaedt, "Infrared Spectroscopy of chemically bonded hydrogen at voids and defects in silicon", *J. Appl. Phys.* 73(b6), Mar. 15, 1993, pp. 2755-2764.

Stephen, D., "Investigation of Lattice Strain in Proton-Irradiated GaP by a Modified Auleytner Technique" *Phys. stat. sol.* (a) 87, 1985, pp. 589-596.

Suzuki et al., "High-Speed and Low Power n+—p+ Double-Gate SOI CMOS", *IEICE Trans. Electron.*, vol. E78-C, No. 4, 1995, pp. 360-367.

Sze, S.M., VLSI Technology, 2.sup.nd Ed., 1988, pp. 9-10.

Tan, T. Y. et al., "On Oxygen Precipitation Retardation/Recovery Phenomena, Nucleation Incubation Phenomena and The Exigent-Accomodation-Volume Factor of Precipitation", Proceedings of the 5$^{th}$ International Symposium On Silicon Materials Science and Technology, *Semiconductor Silicon 198 Electrochem. Soc.*, New Jersey, 1986, pp. 864-873.

Terada, K. et al., "A New Dram Cell With A Transistor On A Lateral Epitaxial Silicon Layer (Tole Cell)", *IEEE Transactions On Electron Device*, vol. 37, No. 9, 1990, pp. 2052-2057.

Tong et al., "Low Temperature SI Layer Splitting", Proceedings 1997 IEEE International SOI Conference, Oct. 1997, pp. 126-127.

Tonini, Monelli, Cornl, Ottaviani, Frabboni, Canteri, Queirolo, "Hydrogen Interaction with phosphorus ion implantated silicon", *Ion Implantation Technology -94*, pp. 801-804.

Tzeng, J.C., "A Novel Self-Aligned Oxgyen (Salox) Implanted SOI Mosfet Device Structure" *Nuclear Instruments and Methods in Physics Research* B2, 1987, pp. 112-115.

U.S. Dept. of Energy, "The Fusion Connection: Contributions to Industry, Defense, and Basic Science Resulting From Scientific Advances Made in the Magnetic Fusion Energy Program", *Plasma Coating*, pp. 6-7, 1985.

Van de Walle, C. "Structural Identification of Hydrogen and Muonium Centers in Silicon First Principles Calculations of Hyperfine Parameters", *Physical Review Letters*, vol. 60, No. 26, 1988, pp. 2761-2764.

Van de Walle, C. "Theoretical Aspects of Hydrogen in Crystalline Semiconductors", *Physica B*, Holland, vol. 170, No. 15, 1991, pp. 21-32.

Van de Walle, C. "Theory of Hydrogen Diffusion and Reactions in Crystalline Silicon", *Physical Review Letters*, vol. 64, No. 6, 1980, pp. 669-672.

Van de Walle, C. "Theory of Hydrogen Diffusion and Reactions in Crystalline Silicon", *Physical Review B*, vol. 39, No. 15, 1989, pp. 10 791-10 808, plus diagrams.

Van Swijgenhoven et al. "Helium Bubble and Blister Formation for Nickel and An AMorphous Fe-Ni-Mo-B Alloy During 5 kev He-+- Irradiation at Temperatures Between 200 K and 600", *Nuclear Instruments and Methods*, 209/210, 1983, pp. 461-468.

Veldkamp, W.B. et al., "Binary Optics," *Scientific American*, 1992, pp. 50-55.

Venezia et al., "The Role of Implantation Damage in the Production of Silicon-On-Insulator Films by Co-Implantation of $He^+$ and $H^+$", Electrochemical Society Proceedings vol. 98-1, 1998—pp. 1384-1395.

Wemple, S.H., "Optical and channeling studies of ion-bombarded GaP", *J. Appl. Phys.*, vol. 45, No. 4, Apr. 1974, pp. 1578-1588.

Whitton, J. L. et al., "The Collection of Ions Implanted in Semiconductors: 1 Saturations Effects", *Radiation Effects*, Scotland, vol. 16, 1972, pp. 101-105.

Wiegand, M. et al., "Wafer Bonding of Silicon Wafers Covered With Various Surface Layers", *Sensors and Actuators*, Elsevier Science B.V., vol. 86, 2000, pp. 91-95.

Williams J. et al., "Annealing behaviour of high-dose rare-gas implantations into silicon", from Application of Ion Beans to Materials, 1975, Chap. 1, *Inst. Phys. Conf. Ser. No. 28*, 1976, pp. 30-36.

Wittmaack et al., "High Fluence Retention of Noble Gases Implanted in Silicon" *Radiation Effects*, vol. 39, 1978, pp. 81-95.

Wolf, Stanley Ph.D., Silicon Processing for the VLSI Era (vol. 2), Lattice Press, 1990, pp. 66-79.

Wong et al., "Integration of GaN Thin Films With Dissimilar Substrate Materials by Pd-In Metal Bonding and Laser Lift-Off", Journal of Electronic Materials, vol. 28, No. 12, 1999, pp. 1409-1413.

Yamaguchi H. et al., "Intelligent Power IC With Partial Soi Structure", *Jpn. J. Appl. Phys.*, vol. 34, 1995, pp. 864-868.

Yee et al., "Polysilicon Surface-Modification Technique to Reduce Sticking of Microstructures", *Sensors and Actuators* A 52, 1996, pp. 145-150.

Yun et al., "Fractional Implantation Area Effects on Patterned Ion-Cut Silicon Layer Transfer", Dept. of Electrical Eng, and Computer Sciences, University of California, Berkley, CA, 94720, USA, 1999 IEEE International SOI Conference, Oct, 1999, pp. 129-130.

U.S. District Court District of Delaware (Wilmington) Civil Docket for Case #: 1:08-cv-00292-SLR—(19 pgs).

Complaint filed with Jury Demand against MEMC Electronic Materials Inc.—Magistrate Consent Notice to Pltf. (Filing fee $ 350, receipt No. 152004.)—filed by SOITEC Silicon On Insulator Technologies SA, Commissariat a LEnergie Atomique. (Attachments: # 1 Exhibit 1, # 2 Exhibit 2, # 3 Exhibit 3, # 4 Civil Cover Sheet, # 5 Acknowledgement of Consent Form) (sns, ) (Entered: May 20, 2008) (47 pgs).

Notice of Availability of a U.S. Magistrate Judge to Exercise Jurisdiction (sns, ) (Entered: May 20, 2008) (1 pg).

Report to the Commissioner of Patents and Trademarks for Patent/Trademark Number(s) RE39,484 E; 6,809,009; 7,067,396 B2; (sns, ) (Entered: May 20, 2008) (1 pg).

Summons Returned Executed by SOITEC Silicon On Insulator Technologies SA, Commissariat a LEnergie Atomique. MEMC Electronic Materials Inc. served on May 19, 2008, answer due Jun. 9, 2008. (Kraft, Denise) (Entered: May 20, 2008) (2 pgs).

Motion for Pro Hac Vice Appearance of Attorney George W. Neuner, Alan M. Spiro, Brian M. Gaff and Carolyn D'Agincourt—filed by SOITEC Silicon On Insulator Technologies SA, Commissariat a LEnergie Atomique. (Attachments: # 1 Certificate of Compliance Certification by Counsel To Be Admitted Pro Hac Vice, # 2 Certificate of Compliance Certification by Counsel To Be Admitted Pro Hac Vice, # 3 Certificate of Compliance Certification by Counsel To Be Admitted Pro Hac Vice, # 4 Certificate of Compliance Certification by Counsel To Be Admitted Pro Hac Vice, # 5 Certificate of Service)(Kraft, Denise) (Entered: May 23, 2008) (6 pgs).

Stipulation to Extend Time Answer to Complaint to Jul. 9, 2008—filed by MEMC Electronic Materials Inc.. (Rogowski, Patricia) (Entered: Jun. 5, 2008) (1 pg).

Motion for Pro Hac Vice Appearance of Attorney Robert M. Evans, Jr., David W. Harlan, Richard L. Brophy, Marc W. Vander Tuig—filed by MEMC Electronic Materials Inc.. (Attachments: # 1 Certification of Robert M. Evans, Jr., # 2 Certification of David W. Harlan, # 3 Certification of Richard L. Brophy, # 4 Certification of Marc W. Vander Tuig)(Rogowski, Patricia) (Entered: Jun. 9, 2008) (6 pgs).

Motion for Pro Hac Vice Appearance of Attorney Michael L. Brody, Richard P. Gilly, Gail J. Standish, Marcus T. Hall and Jason S. Charkow—filed by SOITEC Silicon On Insulator Technologies SA. (Attachments: # 1 Certification By Counsel to be Admitted Pro Hac Vice, # 2 Certification By Counsel to be Admitted Pro Hac Vice, # 3 Certification By Counsel to be Admitted Pro Hac Vice, # 4 Certification By Counsel to be Admitted Pro Hac Vice, # 5 Certification by Counsel to be Admitted Pro Hac Vice)(Kraft, Denise) (Entered: Jun. 10, 2008) (8 pgs).

Disclosure Statement pursuant to Rule 7.1 filed by SOITEC Silicon On Insulator Technologies SA, Commissariat a LEnergie Atomique. (Attachments: # 1 Certificate of Service)(Kraft, Denise) (Entered: Jun. 16, 2008) (3 pgs).

Motion to Dismiss Based upon or, in the Alternative, Motion for a More Definite Statement—filed by MEMC Electronic Materials Inc. (Rogowski, Patricia) (Entered: Jul. 9, 2008) (4 pgs).

Opening Brief in Support re 10 Motion to Dismiss Based upon or, in the Alternative, Motion for a More Definite Statement filed by MEMC Electronic Materials Inc..Answering Brief/Response due date per Local Rules is Jul. 28, 2008. (Rogowski, Patricia) (Entered: Jul. 9, 2008) (15 pgs).

Disclosure Statement pursuant to Rule 7.1 filed by MEMC Electronic Materials Inc. (Rogowski, Patricia) (Entered: Jul. 9, 2008) (3 pgs).

Answering Brief in Opposition re 10 Motion to Dismiss Based upon or, in the Alternative, Motion for a More Definite Statement filed by Commissariat a L'Energie Atomique. Reply Brief due date per Local Rules is Aug. 7, 2008. (Attachments: # 6 Exhibit A, # 7 Exhibit B, # Certificate of Service) (Kraft, Denise) (Modified on Jul. 29, 2008 (lid). (Entered: Jul. 28, 2008) (29 pgs).

Sealed Reply Brief re 10 Motion to Dismiss Based upon or, in the Alternative, Motion for a More Definite Statement filed by MEMC Electronic Materials Inc. (Rogowski, Patricia) (Entered: Aug. 7, 2008).

Redacted Reply Brief re 14—re 10 Motion to Dismiss Based upon or, in the Alternative, Motion for a More Definite Statement filed by MEMC Electronic Materials Inc. (Attachments: # 1 Exhibit 2, # 2 Exhibit 3, # 3 Exhibit 4, # 4 Exhibit 5, # 5 Unreported Cases, # 6 Certificate of Service) (Rogowski, Patricia) Modified on Aug. 8, 2008 (lid). (Entered: Aug. 7, 2008) (98 pgs).

Memorandum Order denying 10 Motion to Dismiss Based upon or, in the Alternative, Motion for a More Definite Statement filed by MEMC Electronic Materials Inc., Order, Setting Hearings Telephonic Scheduling Conference set for Mar. 12, 2009 at 9:00 A.M. Signed by Judge Sue L. Robinson on Feb. 20, 2009. (nmf) (Entered: Feb. 20, 2009) (6 pgs).

Motion for Pro Hac Vice Appearance of Attorney B. Scott Eidson—filed by MEMC Electronic Materials Inc. (Attachments: # 1 Exhibit Certification by Counsel to be Admitted Pro Hac Vice)(Rogowski, Patricia) (Entered: Feb. 23, 2009) (4 pgs).
Notice of Service of Plaintiffs' Initial Disclosures Pursuant to Fed. R. Civ. P. 26(a)(1) by SOITEC Silicon On Insulator Technologies SA, Commissariat a L'Energie Atomique. (Attachments: # 1 Certificate of Service) (Kraft, Denise) (Entered: Feb. 27, 2009) (4 pgs).
Answer to 1 Complaint, with Jury Trial Demanded, Counterclaim against all plaintiffs by MEMC Electronic Materials Inc.. (Attachments: # 1 Exhibit A)(Rogowski, Patricia) (Entered: Mar. 6, 2009) (55 pgs).
Notice of Service of MEMC Electronic Materials, Inc.'s Initial Disclosures by MEMC Electronic Materials Inc. (Rogowski, Patricia) (Entered: Mar. 6, 2009) (3 pgs).
Proposed Order Proposed Scheduling Order re 16 Memorandum and Order, Set Hearings, by SOITEC Silicon On Insulator Technologies SA, Commissariat a 'LEnergie Atomique. (Kraft, Denise) (Entered: Mar. 10, 2009) (7 pgs).
Letter to the Honorable Sue L. Robinson from Denise Seastone Kraft, Esq. regarding [Proposed] Scheduling Order—re 21 Proposed Order, 16 Memorandum and Order, Set Hearings,. (Kraft, Denise) (Entered: Mar. 10, 2009) (1 pg).
Stipulation to Extend Time to Respond or Otherwise Plead to Defendant's Counterclaim to Apr. 7, 2009—filed by SOITEC Silicon On Insulator Technologies SA, Commissariat a L'Energie Atomique. (Attachments: # 1 Certificate of Service)(Kraft, Denise) (Entered: Mar. 11, 2009) (2 pgs).
Proposed Order Revised Scheduling Order re 21 Proposed Order, 16 Memorandum and Order,, Set Hearings, by SOITEC Silicon On Insulator Technologies SA, Commissariat a L'Energie Atomique. (Kraft, Denise) (Entered: Mar. 12, 2009) (7 pgs).
Letter to the Honorable Sue L. Robinson from Denise Seastone Kraft regarding Revised Scheduling Order Pursuant to Mar. 12, 2009 Telephonic Scheduling Conference—re 24 Proposed Order. (Kraft, Denise) (Entered: Mar. 12, 2009) (1 pg).
Scheduling Order: Case referred to the Magistrate Judge for the purpose of exploring ADR. Joiner of Parties due by Aug. 14, 2009. Amended Pleadings due by Aug. 14, 2009. Discovery due by Apr. 23, 2010. Discovery Conference set for Jun. 25, 2009 4:30 PM in Courtroom 6B before Judge Sue L. Robinson. Dispositive Motions due by Jun. 25, 2010. Answering Brief due Jul. 16, 2010. Reply Brief due Jul. 30, 2010. Oral Argument set for Aug. 27, 2010 9:30 AM in Courtroom 6B before Judge Sue L. Robinson. Claim Construction Opening Briefs due by Jun. 18, 2010. Response Briefs due Jul. 9, 2010. Final Pretrial Conference set for Oct. 14, 2010 4:30 PM in Courtroom 6B before Judge Sue L. Robinson. Jury Trial set for Oct. 25, 2010 9:30 AM in Courtroom 6B before Judge Sue L. Robinson. Signed by Judge Sue L. Robinson on Mar. 16, 2009. (nmf) (Entered: Mar. 16, 2009) (7 pgs).
Order Setting Teleconference: Telephone Conference set for Mar. 23, 2009 at 11:00 AM before Judge Mary Pat Thynge to discuss ADR. Signed by Judge Mary Pat Thynge on Mar. 16, 2009. (cak) (Entered: Mar. 16, 2009) (4 pgs).
Order Setting Teleconference: a teleconference has been scheduled for Monday, Jun. 1, 2009 at 10:00 a.m. with Magistrate Judge Thynge to discuss the status of the case and the parties negotiations. Counsel for MEMC shall initiate the teleconference call to 302-573-6173. It Is Further Ordered that the Court is holding Sep. 10, Sep. 14 and Sep. 15, 2009 as possible mediation dates. Counsel are to advise Judge Thynge by Mar. 30, 2009 if any of these dates works for everyone to schedule the mediation. Signed by Judge Mary Pat Thynge on Mar. 23, 2009. (cak) (Entered: Mar. 23, 2009) (2 pgs).
Order Setting Mediation Conferences: Mediation Conference Tentatively set for Sep. 15, 2009 at 10:00 AM in Courtroom 2B before Judge Mary Pat Thynge. See order for details. Signed by Judge Mary Pat Thynge on Mar. 24, 2009. (cak) (Entered: Mar. 24, 2009) (6 pgs).
Motion to Dismiss Based upon Fed. R. Civ. P. 12(b)(1) and (6) and Article III of the United States Constitution—filed by SOITEC Silicon On Insulator Technologies SA, Commissariat a LEnergie Atomique. (Attachments: # 1 Text of Proposed Order, # 2 Certificate of Service)(Kraft, Denise) (Entered: Apr. 7, 2009) (5 pgs).
Opening Brief in Support re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution filed by SOITEC Silicon On Insulator Technologies SA, Commissariat a L'Energie Atomique Answering Brief/Response due date per Local Rules is Apr. 27, 2009. (Attachments: # 1 Certificate of Service)(Kraft, Denise) (Entered: Apr. 7, 2009) (13 pgs).
Answer to 19 Answer to Complaint, Counterclaim Partial Answer to Defendant's Counterclaims, Affirmative Defenses and Soitec Counterclaims, Counterclaim against MEMC Electronic Materials Inc. By SOITEC Silicon On Insulator Technologies SA, Commissariat a LEnergie Atomique. (Attachments: # 1 Certificate of Service)(Kraft, Denise) (Entered: Apr. 7, 2009) (18 pgs).
Notice of Service of First Request for Production of Documents and Things Directed to Commissariat a L'Energie Atomique; First Request for Production of Documents and Things Directed to SOITEC Silicon On Insulator Technologies, S.A. And SOITEC USA, Inc.; and First Set of Interrogatories Directed to SOITEC Silicon On Insulator Technologies, S.A., SOITEC USA, Inc. And Commissariat a L'Energie Atomique by MEMC Electronic Materials Inc. (Rogowski, Patricia) (Entered: Apr. 14, 2009) (3 pgs).
Stipulation to Extend Time Defendant to File Answering Brief in Opposition to Plaintiffs' Partial Motion to Dismiss Counterclaim Counts II, III, IV, V, and VIII to May 6, 2009—filed by MEMC Electronic Materials Inc. (Rogowski, Patricia) (Entered: Apr. 21, 2009) (3 pgs).
Answer to 32 Answer to Counterclaim,,, of S.O.I. TEC Silicon on Insulator Technologies, S.A. and SOITEC U.S.A., Inc. by MEMC Electronic Materials Inc. (Rogowski, Patricia) (Entered: Apr. 23, 2009) (4 pgs).
Stipulation to Extend Time Answering Brief in Opposition to Plaintiffs' Partial Motion to Dismiss Counterclaim Counts II, III, IV, V and VIII to May 15, 2009—filed by MEMC Electronic Materials Inc.. (Rogowski, Patricia) (Entered: May 6, 2009) (3 pgs).
Notice of Service of Soitec's First Set of Interrogatories (Nos. 1-17) and Soitec's First Set of Requests for Production of Documents and Things (Nos. 1-132) by SOITEC Silicon On Insulator Technologies SA, Commissariat a LEnergie Atomique. (Attachments: # 1 Certificate of Service)(Kraft, Denise) (Entered: May 6, 2009) (2 pgs).
Stipulation to Extend Time for Defendant to File an Answering Brief in Opposition to Plaintiffs' Partial Motion to Dismiss Counterclaim Counts II, III, IV, V, and VIII; and Stipulation to Extend Time for Plaintiffs to File Responses to MEMC's First Requests for Production of Documents and to MEMC's First Set of Interrogatories to May 29, 2009—filed by SOITEC Silicon On Insulator Technologies SA, Commissariat a L'Energie Atomique. (Attachments: # 1 Certificate of Service)(Kraft, Denise) (Entered: May 13, 2009).
Notice of Service of (1) Subpoena to Hayes Soloway, P.C., (2) Subpoena to Pearne & Gordon, LLP, (3) Subpoena to Brinks Hofer Gilson & Lione, and (4) Subpoena to Winston & Strawn by MEMC Electronic Materials Inc. (Rogowski, Patricia) (Entered: May 14, 2009) So Ordered—re 38 Stipulation to Extend Time. Set Briefing Schedule: re 30 Motion to Dismiss. (Answering Brief due May 29, 2009.) (Refer to Stipulation for Further Details.). Signed by Judge Sue L. Robinson on May 15, 2009. (lid) (Entered: May 15, 2009).
Stipulation to Extend Time for Defendant to File Its Answering Brief until Jun. 5, 2009 by MEMC Electronic Materials Inc.. (Rogowski, Patricia) (Entered: May 28, 2009) So Ordered, re 40 Stipulation, Set Briefing Schedule: re 30 Motion to Dismiss Based upon Fed. R. Civ. P. 12(b)(1) and (6) and Article III of the United States Constitution. (Answering Brief due Jun. 5, 2009.). Signed by Judge Sue L. Robinson on May 29, 2009. (nmf) (Entered: May 29, 2009).
Notice of Service of (1) Soitec's Objections and Responses to MEMC's First Set of Interrogatories; (2) Soitecs Objections and Responses to MEMC's First Request For Production of Documents and Things; (3) CEAs Objections and Responses to MEMC's First Set of Interrogatories; and (4) CEAs Objections and Responses to MEMC's First Request For Production of Documents and Things by SOITEC Silicon On Insulator Technologies SA, Commissariat a L'Energie Atomique. (Attachments: # 1 Certificate of Service) (Kraft, Denise) (Entered: May 29, 2009).
Stipulation to extend date to Jun. 19, 2009 by which defendant may file an answering brief in opposition to plaintiffs' Partial Motion to Dismiss Counterclaim Counts II, III, IV, V, and VIII by MEMC Electronic Materials Inc.. (Rogowski, Patricia) (Entered: Jun. 5, 2009).

Notice of Service of MEMC's Answers to SOITEC's First Set of Interrogatories (Nos. 1-17) and MEMC's Responses to SOITEC's First Set of Requests for Production of Documents and Things (Nos. 1-132) by MEMC Electronic Materials Inc.. (Rogowski, Patricia) (Entered: Jun. 5, 2009) So Ordered—re 42 Stipulation to Extend Time. Set Briefing Schedule: re 30 Motion to Dismiss. (Answering Brief due Jun. 19, 2009.). Signed by Judge Sue L. Robinson on Jun. 8, 2009. (lid) (Entered: Jun. 8, 2009).

Notice of Service of Soitec's Second Set of Requests for Production of Documents and Things (Nos. 133-135) re 41 Notice of Service,, by SOITEC Silicon On Insulator Technologies SA, Commissariat a L'Energie Atomique. Related document: 41 Notice of Service,, filed by SOITEC Silicon On Insulator Technologies SA, Commissariat a L'Energie Atomique. (Attachments: # 1 Certificate of Service)(Kraft, Denise) (Entered: Jun. 11, 2009).

Letter to Honorable Sue L. Robinson from Patricia Smink Rogowski regarding Transmitting Form of Protective Order. (Attachments: # 1 Form of Protective Order, # 2 Exhibit Exhibit A to Form of Protective Order)(Rogowski, Patricia) (Entered: Jun. 16, 2009).

Notice of Service of MEMC's Second Request for Production of Documents and Things Directed to S.O.I.TEC Silicon on Insulator Technologies, S.A. And Soitec USA, Inc. By MEMC Electronic Materials Inc. (Rogowski, Patricia) (Entered: Jun. 16, 2009) Set/Reset Hearings: Discovery Conference re-set per joint request of counsel for Sep. 16, 2009 8:30 AM in Courtroom 6B before Judge Sue L. Robinson. (nmf) (Entered: Jun. 18, 2009).

Stipulation to Extend Time Defendant's Answering Brief in Opposition to Plaintiffs' Partial Motion to Dismiss Counterclaim Counts II, III, IV, V, and VIII to Jul. 2, 2009—filed by MEMC Electronic Materials Inc.. (Rogowski, Patricia) (Entered: Jun. 19, 2009) So Ordered—re 47 Stipulation to Extend Time. Set Briefing Schedule: re 30 Motion to Dismiss (Answering Brief due Jul. 2, 2009.). Signed by Judge Sue L. Robinson on Jun. 23, 2009. (lid) (Entered: Jun. 23, 2009) So Ordered, re 45 Protective Order. Signed by Judge Sue L. Robinson on Jun. 30, 2009. (nmf) (Entered: Jun. 30, 2009).

Notice of by SOITEC Silicon On Insulator Technologies SA, Commissariat a L'Energie Atomique re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution *Notice of Withdrawal of Plaintiffs' Partial Motion to Dismiss Counterclaim Counts II, III, IV, V, and VIII* (Attachments: # 1 Certificate of Service)(Kraft, Denise) (Entered: Jul. 2, 2009).

Notice of Service of MEMC's Responses to SOITEC's Second Set of Requests for Production of Documents and Things Directed to MEMC by MEMC Electronic Materials Inc..(Rogowski, Patricia) (Entered: Jul. 14, 2009).

Stipulation and [Proposed] Order to File an Amended Complaint by SOITEC Silicon On Insulator Technologies SA, Commissariat a LEnergie Atomique. (Attachments: # 1 Exhibit A, # 2 Certificate of Service)(Kraft, Denise) (Entered: Jul. 16, 2009).

Notice of Service of Soitec's Objections and Responses to MEMC's Second Request For Production of Documents and Things Directed To Soitec re 46 Notice of Service by SOITEC Silicon On Insulator Technologies SA, Commissariat a LEnergie Atomique. Related document: 46 Notice of Service filed by MEMC Electronic Materials Inc. (Attachments: # 1 Certificate of Service)(Kraft, Denise) (Entered: Jul. 16, 2009).

Notice of Withdrawal of Docket Entry 51 by SOITEC Silicon On Insulator Technologies SA, Commissariat a L'Energie Atomique re 51 Notice of Service, (Attachments: # 1 Certificate of Service)(Kraft, Denise) (Entered: Jul. 17, 2009).

Notice of Service of SOITEC's Objections and Responses to MEMC's Second Request for Production of Documents and Things Directed to SOITEC re 46 Notice of Service by SOITEC Silicon On Insulator Technologies SA, Commissariat a L'Energie Atomique. Related document: 46 Notice of Service filed by MEMC Electronic Materials Inc.. (Attachments: # 1 Certificate of Service)(Kraft, Denise) (Entered: Jul. 17, 2009).

Notice of Service of MEMC Electronic Materials, Inc.'s Second Set of Interrogatories Directed to S.O.I.TEC Silicon On Insulator Technologies, S.A., SOITEC USA, Inc. and Commissariat a L'Energie Atomique by MEMC Electronic Materials Inc..(Rogowski, Patricia) (Entered: Jul. 17, 2009).

Notice of Service of Soitec's Production of Documents Bates Numbered SCEA 00000001 to SCEA 00002442 by SOITEC Silicon On Insulator Technologies SA, Commissariat a L'Energie Atomique. (Attachments: # 1 Certificate of Service)(Kraft, Denise) (Entered: Jul. 17, 2009) So Ordered, re 50 Stipulation. Signed by Judge Sue L. Robinson on Jul. 20, 2009. (nmf) (Entered: Jul. 20, 2009).

Notice of Service of MEMC's Production of Documents Bates Numbered MEMC0300000 to MEMC0306530 by MEMC Electronic Materials Inc. (Rogowski, Patricia) (Entered: Jul. 20, 2009).

First Amended Complaint *for Patent Infringement* against MEMC Electronic Materials Inc.—filed by SOITEC Silicon On Insulator Technologies SA, Commissariat a L'Energie Atomique. (Attachments: # 1 Exhibit Exhibit 1, # 2 Exhibit Exhibit 2, # 3 Exhibit Exhibit 3, # 4 Exhibit Exhibit 4, # 5 Certificate of Service)(Kraft, Denise) (Entered: Jul. 21, 2009).

Notice of Service of Soitec S.A.'s Second Set of Interrogatories (Nos. 18-22) and CEA's First Set of Interrogatories (Nos. 1-11) by SOITEC Silicon On Insulator Technologies SA, Commissariat a L'Energie Atomique. (Attachments: # 1 Certificate of Service)(Kraft, Denise) (Entered: Jul. 23, 2009).

Notice of Service of S.O.I.TEC Silicon on Insulator Technologies, S.A. and Commissariat A Lenergie Atomique Supplemental Production of Documents Bates Numbered SLIT 00000001 to SLIT 00049728 re 43 Notice of Service, by SOITEC Silicon On Insulator Technologies SA, Commissariat a LEnergie Atomique. Related document: 43 Notice of Service, filed by MEMC Electronic Materials Inc.. (Attachments: # 1 Certificate of Service)(Kraft, Denise) (Entered: Jul. 27, 2009).

Answer to Amended Complaint Answer to 57 Amended Complaint, with Under Federal Rule of Civil Procedure 38, MEMC demands a trial by jury on all issues so triable., Counterclaim against all plaintiffs by MEMC Electronic Materials Inc.. (Attachments: # 1 Exhibit A, # 2 Certificate of Service)(Rogowski, Patricia) (Entered: Aug. 3, 2009).

Notice of Service of MEMC's Production of Documents Bates Numbered MEMC0300000—MEMC0337055 by MEMC Electronic Materials Inc. (Rogowski, Patricia) (Entered: Aug. 5, 2009).

Notice of Service of S.O.I.TEC Silicon on Insulator Technologies, S.A. and Commissariat a L Energie Atomique's Revised Supplemental Production of Documents Bates Numbered SLIT00000001—SLIT0004886; SLIT00004931 SLIT00004985; SLIT00005169 SLIT00005174; SLIT00005241 SLIT00006368; and SLIT00006886—SLIT00049728 re 59 Notice of Service, by SOITEC U.S.A., Inc., SOITEC Silicon On Insulator Technologies SA, Commissariat a LEnergie Atomique. Related document: 59 Notice of Service, filed by SOITEC Silicon On Insulator Technologies SA, Commissariat a LEnergie Atomique. (Attachments: # 1 Certificate of Service)(Kraft, Denise) (Entered: Aug. 6, 2009).

Stipulation to Extend Time to Answer or Otherwise Respond to MEMC's Amended Counterclaims to Aug. 31, 2009—filed by SOITEC Silicon On Insulator Technologies SA, SOITEC U.S.A., Inc., Commissariat a L'Energie Atomique. (Attachments: # 1 Certificate of Service)(Kraft, Denise) (Entered: Aug. 25, 2009).

Notice of Service of S.O.I.TEC Silicon on Insulator Technologies, S.A. and Commissariat a L'Energie Atomique's Supplemental Production of Documents Bates Numbered SOIT 00000001 to SOIT 00003528 and SLIT 00049729 to SLIT 00060612 by SOITEC Silicon On Insulator Technologies SA, SOITEC U.S.A., Inc., Commissariat a L'Energie Atomique. (Attachments: # 1 Certificate of Service)(Kraft, Denise) (Entered: Aug. 25, 2009).

Notice of Service of MEMC's Production of Documents Bates Numbered MEMC0337056 to MEMC0337503 and MEMC0337504-MEMC0338047 by MEMC Electronic Materials Inc..(Rogowski, Patricia) (Entered: Aug. 26, 2009).

Notice of Service of (1) SOITECs Supplemental Responses to MEMC Electronic Materials, Inc's First Set of Interrogatories; and (2) CEAs Supplemental Responses to MEMC Electronic Materials, Inc.s First Set of Interrogatories re 41 Notice of Service,, by SOITEC Silicon On Insulator Technologies SA, SOITEC U.S.A., Inc., Commissariat a L'Energie Atomique. Related document: 41 Notice of Service,, filed by SOITEC Silicon On Insulator Technologies SA, Commissariat a L'Energie Atomique. (Attachments: # 1 Certificate of Service)(Kraft, Denise) (Entered: Aug. 26, 2009).
Notice of Service of MEMC's Supplemental Answers to SOITEC's First Set of Interrogatories by MEMC Electronic Materials Inc.. (Rogowski, Patricia) (Entered: Aug. 27, 2009) So Ordered- re 63 Stipulation to Extend Time. Set/Reset Answer Deadlines: SOITEC Silicon On Insulator Technologies SA answer due Aug. 31, 2009; Commissariat a L'Energie Atomique answer due Aug. 31, 2009; SOITEC U.S.A., Inc. answer due Aug. 31, 2009. Signed by Judge Sue L. Robinson on Aug. 27, 2009. (lid) (Entered: Aug. 27, 2009).
Answer to 60 Answer to Amended Complaint, Counterclaim,,, Counterclaim *Reply to Defendant's Amended Counterclaims, Counterclaims and Affirmative Defenses* against MEMC Electronic Materials Inc. by SOITEC Silicon On Insulator Technologies SA, Commissariat a L'Energie Atomique, SOITEC U.S.A., Inc.. (Attachments: # 1 Certificate of Service)(Kraft, Denise) (Entered: Aug. 31, 2009).
Notice of Service of MEMC's Third Set of Interrogatories Directed to S.O.I.TEC Silicon On Insulator Technologies, S.A., SOITEC USA, Inc., and Commissariat a L'Energie Atomique by MEMC Electronic Materials Inc. (Rogowski, Patricia) (Entered: Sep. 1, 2009).
Answer to 68 Answer to Counterclaim,,, by MEMC Electronic Materials Inc..(Rogowski, Patricia) (Entered: Sep. 14, 2009). Minute Entry for proceedings held before Judge Sue L. Robinson—Discovery Conference held on Sep. 16, 2009. (Court Reporter V. Gunning.) (nmf) (Entered: Sep. 16, 2009).
Notice of Service of Soitec S.A.'s Third Set of Interrogatories (Nos. 23-27) re 58 Notice of Service, by SOITEC Silicon On Insulator Technologies SA, SOITEC U.S.A., Inc., Commissariat a LEnergie Atomique. Related document: 58 Notice of Service, filed by SOITEC Silicon On Insulator Technologies SA, Commissariat a LEnergie Atomique. (Attachments: # 1 Certificate of Service)(Kraft, Denise) (Entered: Sep. 22, 2009).
Notice of Service of MEMC Electronic Materials Inc.'S Answers to SOITEC S.A.'S Second Set of Interrogatories (Nos. 8-22) and MEMC Electronic Materials, Inc.'S Answers to CEA'S First Set of Interrogatories (Nos. 1-11) by MEMC Electronic Materials Inc.. (Rogowski, Patricia) (Entered: Oct. 16, 2009).
Notice of Service of S.O.I.TEC Silicon on Insulator Technologies, S.A. And Commissariat a L'Energie Atomique's Supplemental Production of Documents Bates Numbered SOIT 00003529 to SOIT 00004244 by SOITEC Silicon On Insulator Technologies SA, SOITEC U.S.A., Inc., Commissariat a LEnergie Atomique. (Attachments: # 1 Certificate of Service)(Kraft, Denise) (Entered: Oct. 16, 2009).
Notice of Service of S.O.I.TEC Silicon on Insulator Technologies, S.A. and Commissariat a L'Energie Atomique's Supplemental Production of Documents Bates Numbered SOIT 00003258.001-.057; SOIT 00003342.001-.007; SOIT 00003343.001-.009; (Con't)— SOIT 00003409.001-.015; and SOIT 00003469.001-.015 by SOITEC Silicon On Insulator Technologies SA, SOITEC U.S.A., Inc., Commissariat a LEnergie Atomique. (Attachments: # 1 Certificate of Service)(Kraft, Denise) (Entered: Oct. 16, 2009).
Notice of Service of SOITEC/CEA Parties' Objections and Responses to MEMC Electronic Materials, Inc.'s Second Set of Interrogatories by SOITEC Silicon On Insulator Technologies SA, SOITEC U.S.A., Inc., Commissariat a LEnergie Atomique. (Attachments: # 1 Certificate of Service)(Kraft, Denise) (Entered: Oct. 16, 2009).
Notice of Service of S.O.I.TEC Silicon On Insulator Technologies, S.A. And Commissariat LEnergie Atomique Supplemental Production of Documents Bates Numbered SOIT 00004245 to SOIT 00205027 by SOITEC Silicon On Insulator Technologies SA, SOITEC U.S.A., Inc., Commissariat a LEnergie Atomique. (Attachments: # 1 Certificate of Service)(Kraft, Denise) (Additional attachment(s) added on Oct. 23, 2009: # 2 revised) (lid). Modified on Oct. 23, 2009 (lid). (Entered: Oct. 16, 2009).
Motion to Bifurcate *the Issues of Willfulness and Damages for Purposes of Discovery and Trial and proposed Form of Order*—filed by MEMC Electronic Materials Inc.. (Rogowski, Patricia) (Entered:

Oct. 20, 2009). Correcting Entry: Docket clerk deleted D.I. 78 (opening brief) due to document being filed improperly. Counsel is advised to re-file document using the Opening Brief event code rather than the combined opening and answering brief event code. (lid) (Entered: Oct. 21, 2009).
Opening Brief in Support re 77 Motion to Bifurcate *the Issues of Willfulness and Damages for Purposes of Discovery and Trial and proposed Form of Order* filed by MEMC Electronic Materials Inc.. Answering Brief/Response due date per Local Rules is Nov. 9, 2009. (Attachments: # 1 Exhibit A, # 2 Exhibit B, # 3 Exhibit C)(Rogowski, Patricia) (Entered: Oct. 21, 2009).
Notice of Service of MEMC's Production of Documents Bates Numbered MEMC0338048-MEMC0345027 by MEMC Electronic Materials Inc..(Rogowski, Patricia) (Entered: Oct. 23, 2009).
Notice of Service of S.O.I.TEC Silicon On Insulator Technologies, S.A. and Commissariat a L'Energie Atomique Supplemental Production of Replacement Documents Bates Numbered SCEA 00001337 to SCEA 00001339; SCEA 00002434 to SCEA 00002439; SOIT 00007961; SOIT 00006718 to SOIT 00006727; and SOIT 00007595 to SOIT 00007598 by SOITEC Silicon On Insulator Technologies SA, SOITEC U.S.A., Inc., Commissariat a LEnergie Atomique. (Attachments: # 1 Certificate of Service)(Kraft, Denise) (Entered: Oct. 23, 2009) Correcting Entry: Pursuant to request of counsel, correct pdf of D.I. 76 has been attached and text of entry has been modified to correct bates No. (lid) (Entered: Oct. 23, 2009).
Notice of Service of of S.O.I.TEC Silicon On Insulator Technologies, S.A. and Commissariat a L'Energie Atomique's Supplemental Production of Documents Bates Numbered SOIT 00205028 to SOIT 00206175; SCEA 00002443 to SCEA 00003974; and SLIT 00060613 to SLIT 00063784 by SOITEC Silicon On Insulator Technologies SA, SOITEC U.S.A., Inc., Commissariat a LEnergie Atomique. (Attachments: # 1 Certificate of Service)(Kraft, Denise) (Entered: Oct. 28, 2009).
Notice of Service of MEMC'S Answers TOSOITEC S.A.'S Third Set of Interrogatories (Nos. 23-27) by MEMC Electronic Materials Inc..(Rogowski, Patricia) (Entered: Oct. 28, 2009).
Notice of Service of S.O.I.TEC Silicon On Insulator Technologies, S.A. and Commissariat a L'Energie Atomique's Supplemental Production Of Documents Bates Numbered SOIT 00206176 to SOIT 00206183 by SOITEC Silicon On Insulator Technologies SA, SOITEC U.S.A., Inc., Commissariat a LEnergie Atomique. (Attachments: # 1 Certificate of Service)(Kraft, Denise) (Entered: Oct. 28, 2009).
Notice of Service of SOITEC/CEA Parties' Objections and Responses to MEMC Electronic Materials, Inc.'s Third Set of Interrogatories by SOITEC Silicon On Insulator Technologies SA, SOITEC U.S.A., Inc., Commissariat a LEnergie Atomique. (Attachments: # 1 Certificate of Service)(Kraft, Denise) (Entered: Oct. 29, 2009).
U.S. District Court District of Delaware (Wilmington) Civil Docket for Case #: 1:08-cv-00292-SLR—(54 pgs).
Cross Motion to Bifurcate *all Collateral Issues*—filed by SOITEC Silicon On Insulator Technologies SA, SOITEC U.S.A., Inc., Commissariat a LEnergie Atomique. (Attachments: # 1 Text of Proposed Order, # 2 Certificate of Service)(Kraft, Denise) (Entered: Nov. 9, 2009).
Answering Brief in Opposition re 85 Cross Motion to Bifurcate *all Collateral Issues*, 77 Motion to Bifurcate *the Issues of Willfulness and Damages for Purposes of Discovery and Trial and proposed Form of Order* filed by SOITE Silicon On Insulator Technologies SA, Commissariat a LEnergie Atomique.Reply Brief due date per Local Rules is Nov. 20, 2009. (Attachments: # 1 Exhibit, # 2 Exhibit, # 3 Exhibit, # 4 Exhibit, # 5 Exhibit, # 6 Exhibit, # 7 Exhibit, # 8 Exhibit, # 9 Exhibit, # 10 Exhibit, # 11 Exhibit, # 12 Declaration, # 13 Certificate of Service)(Kraft, Denise) (Entered: Nov. 9, 2009).
Notice of Service of CEA's Second Set of Interrogatories (Nos. 12-16) by SOITEC Silicon On Insulator Technologies SA, SOITEC U.S.A., Inc., Commissariat a LEnergie Atomique. (Attachments: # 1 Certificate of Service)(Kraft, Denise) (Entered: Nov. 11, 2009) Correcting Entry: Pursuant to request of counsel, Exhibit A to D.I. 86 has been deleted and will be re-filed under seal by counsel at a later time (lid) (Entered: Nov. 12, 2009).

Sealed Exhibit re 86 Answering Brief in Opposition,, by SOITEC Silicon On Insulator Technologies SA, SOITEC U.S.A., Inc., Commissariat a LEnergie Atomique. (Attachments: # 1 Certificate of Service)(Kraft, Denise) (Entered: Nov. 12, 2009).
Reply Brief re 77 Motion to Bifurcate *the Issues of Willfulness and Damages for Purposes of Discovery and Trial and proposed Form of Order* filed by MEMC Electronic Materials Inc.. (Attachments: # 1 Exhibit 1, # 2 Exhibit 2, # 3 Exhibit 3)(Rogowski, Patricia) (Entered: Nov. 17, 2009).
Answering Brief in Opposition re 85 Cross Motion to Bifurcate *all Collateral Issues* filed by MEMC Electronic Materials Inc..Reply Brief due date per Local Rules is Dec. 3, 2009. (Rogowski, Patricia) (Entered: Nov. 19, 2009).
Notice of Service of S.O.I.TEC Silicon On Insulator Technologies, S.A. and Commissariat a L'Energie Atomique's Supplemental Production of Documents Bates Numbered SOIT 00206184 to SOIT 00206997 by Commissariat a LEnergie Atomique, SOITEC Silicon On Insulator Technologies SA, SOITEC U.S.A., Inc.. (Attachments: # 1 Certificate of Service)(Kraft, Denise) (Entered: Nov. 23, 2009).
Notice of Service of (1) Subpoena in a Civil Case to J. William Dockrey; (2) Subpoena in a Civil Case to Allan Fanucci, Esq.; (3) Amended Notice of Videotaped Deposition of Saeed Pirooz; (4) Notice of Videotaped Deposition of Commissariat a L'Energie Atomique; and (5) Notice of Videotaped Deposition of S.O.I.TEC Silicon on Insulator Technologies, S.A. and Soitec U.S.A., Inc. By MEMC Electronic Materials Inc..(Rogowski, Patricia) (Entered: Nov. 30, 2009).
Notice of Service of S.O.I.TEC Silicon On Insulator Technologies, S.A. and Commissariat a L'Energie Atomique's Supplemental Production of Documents Bates Numbered BHRO00000001 to BHRO00036157 by Commissariat a LEnergie Atomique, SOITEC Silicon On Insulator Technologies SA, SOITEC U.S.A., Inc.. (Attachments: # 1 Certificate of Service)(Kraft, Denise) (Entered: Dec. 2, 2009).
Reply Brief re 85 Cross Motion to Bifurcate *all Collateral Issues* filed by Commissariat a LEnergie Atomique, SOITEC Silicon On Insulator Technologies SA, SOITEC U.S.A., Inc.. (Attachments: # 1 Exhibit Declaration of Marcus T. Hall in Support of Plaintiffs' Reply Re: Cross-Motion to Bifurcate all Collateral Issues)(Kraft, Denise) (Entered: Dec. 3, 2009).
Notice of Service of S.O.I.TEC Silicon On Insulator Technologies, S.A. and Commissariat a L'Energie Atomique's Production of Three Boxes of Wafer Samples by Commissariat a LEnergie Atomique, SOITEC Silicon On Insulator Technologies SA, SOITEC U.S.A., Inc.. (Attachments: # 1 Certificate of Service)(Kraft, Denise) (Entered: Dec. 8, 2009). Set Hearings: Discovery Conference set for Dec. 21, 2009 4:00 PM in Courtroom 6B before Judge Sue L. Robinson. (nmf) (Entered: Dec. 9, 2009).
Notice of Service of (1) Six Cartons of 300 MM Wafer Samples and 1 Carton of 200 MM Wafer Samples; (2) Documents Marked MEMC0345028-MEMC0345084; (3) Documents Marked MEMC0345085-MEMC0345133; (4) MEMC'S Answers to CEA'S Second Set of Interrogatories (Nos. 12-16); and (5) MEMC'S First Set of Requests for Admission to S.O.I.TEC Silicon On Insulator Technologies, S.A. and SOITEC USA, Inc. by MEMC Electronic Materials Inc..(Rogowski, Patricia) (Entered: Dec. 14, 2009).
Motion for Leave to File *Stipulated Motion for Leave to File a Sur-Reply Brief in Support of MEMC's Motion to Bifurcate*—filed by MEMC Electronic Materials Inc.. (Attachments: # 1 Exhibit 1)(Rogowski, Patricia) (Entered: Dec. 14, 2009).
Redacted Version of 88 Exhibit to a Document *Cross Motion to Bifurcate all Collateral Issues* by Commissariat a LEnergie Atomique, SOITEC Silicon On Insulator Technologies SA, SOITEC U.S.A., Inc.. (Kraft, Denise) (Entered: Dec. 14, 2009). So Ordered- re 97 Motion for Leave to File. Signed by Judge Sue L. Robinson on Dec. 16, 2009. (lid) (Entered: Dec. 16, 2009).
Sur-Reply Brief re 77 Motion to Bifurcate *the Issues of Willfulness and Damages for Purposes of Discovery and Trial and proposed Form of Order* MEMC's Sur-Reply Brief in Support of Its Motion to Bifurcate the Issues of Willfulness and Damages for Purposes of Discovery and Trial filed by MEMC Electronic Materials Inc.. (Rogowski, Patricia) (Entered: Dec. 16, 2009).

Notice of Service of S.O.I.TEC Silicon On Insulator Technologies, S.A. and Commissariat a L'Energie Atomique's Supplemental Production of Documents Bates Numbered SOIT 00207008 to SOIT 00207591 by SOITEC Silicon On Insulator Technologies SA, SOITEC U.S.A., Inc.. (Attachments: # 1 Certificate of Service)(Kraft, Denise) (Entered: Dec. 17, 2009). Minute Entry for proceedings held before Judge Sue L. Robinson—Conference held on Dec. 21, 2009. (Court Reporter V. Gunning.) (nmf) (Entered: Dec. 22, 2009). Oral Order by Judge Sue L. Robinson in open court on Dec. 21, 2009 granting 77 Motion to Bifurcate *the Issues of Willfulness and Damages for Purposes of Discovery and Trial and proposed Form of Order*, denying 85 Cross Motion to Bifurcate *all Collateral Issues*. (nmf) (Entered: Dec. 22, 2009).
Notice of Service of S.O.I.TEC Silicon on Insulator Technologies, S.A. and Commissariat L'Energie Atomique's Production 12 of CD-ROM Documents Bates Numbered SOIT 00207008 to SOIT 00207591 by Commissariat a LEnergie Atomique, SOITEC Silicon On Insulator Technologies SA, SOITEC U.S.A., Inc..(Kraft, Denise) (Entered: Dec. 22, 2009).
Notice of Service of S.O.I.TEC Silicon on Insulator Technologies, S.A. and Commissariat L'Energie Atomique's Supplemental Production of Documents Bates Numbered BHRO00036158 to BHRO00036584, served on Dec. 11, 2009; and S.O.I.TEC Silicon on Insulator Technologies, S.A. and Commissariat L'Energie Atomique's Supplemental Production of Documents Bates Numbered BHRO00036585 to BHRO00036731, served on Dec. 18, 2009 by SOITEC Silicon On Insulator Technologies SA, SOITEC U.S.A., Inc.. (Attachments: # 1 Certificate of Service)(Kraft, Denise) (Entered: Dec. 22, 2009). Correcting Entry: Pursuant to conversation docket clerk deleted Notice of filing due to document being filed improperly. Counsel will re-file document at a later time. (lid) (Entered: Jan. 4, 2010).
Notice of Service of S.O.I.TEC Silicon on Insulator Technologies, S.A. and Soitec USA, Inc.'s Objections and Responses to MEMC's Nov. 25, 2009 Notice of 30(b)(6) Deposition of Soitec, and Commissariat a l'Energie Atomique's Objections and Responses to MEMC's Nov. 25, 2009 Notice of 30(b)(6) Deposition of CEA by Commissariat a LEnergie Atomique, SOITEC Silicon On Insulator Technologies SA, SOITEC U.S.A., Inc.. (Attachments: # 1 Certificate of Service)(Kraft, Denise) (Entered: Jan. 4, 2010).
Stipulation to Amend Scheduling Order re 26 Scheduling Order,,, by MEMC Electronic Materials Inc.. (Rogowski, Patricia) (Entered: Jan. 6, 2010).
Notice of Service of S.O.I.TEC Silicon on Insulator Technologies, S.A. and Commissariat L'Energie Atomique's Production of Documents Bates Numbered HS0000001 to HS0000792 by Commissariat a LEnergie Atomique, SOITEC Silicon On Insulator Technologies SA, SOITEC U.S.A., Inc.. (Attachments: # 1 Certificate of Service)(Kraft, Denise) (Entered: Jan. 6, 2010).
Notice of Service of Documents Marked (1) MEMC0345134-MEMC0391283 and (2) MEMC0391284-MEMC0413109 by MEMC Electronic Materials Inc..(Rogowski, Patricia) (Entered: Jan. 7, 2010). So Ordered- re 104 Stipulation Amending Scheduling Order. Order- Setting Scheduling Order Deadlines ( Claims Construction Opening Brief due by Jun. 18, 2010., Discovery due by Jun. 18, 2010.)(Refer to Stipulation for Further Details). Signed by Judge Sue L. Robinson on Jan. 7, 2010. (lid) (Entered: Jan. 7, 2010).
Notice of Service of S.O.I.TEC Silicon on Insulator Technologies, S.A. and Soitec USA, Inc.'s Responses to MEMC Electronic Materials, Inc.'s First Set of Requests for Admission by Commissariat a LEnergie Atomique, SOITEC Silicon On Insulator Technologies SA, SOITEC U.S.A., Inc.. (Attachments: # 1 Certificate of Service)(Kraft, Denise) (Entered: Jan. 11, 2010).
Notice of Service of Documents Marked MEMC0413110-MEMC0459972 by MEMC Electronic Materials Inc..(Rogowski, Patricia) (Entered: Jan. 13, 2010).
Notice of Service of Notice of Videotaped Depositions of Emmanuel Huyghe, Clotilde Turleque, Christophe Maleville and Hubert Moriceau by MEMC Electronic Materials Inc..(Rogowski, Patricia) (Entered: Jan. 14, 2010).
Notice of Service of Notice of Videotaped Deposition of Norman Soloway by MEMC Electronic Materials Inc..(Rogowski, Patricia) (Entered: Jan. 14, 2010).

Notice of Service of Notice of Videotaped Depositions of (1) Emmanuel Arene, (2) Bruno Ghyselen, (3) Thierry Barge, (4) Chrystelle Legahe, (5) Konstantine Bourdelle, (6) Andre-Jacques Auberton-Herve, (7) Bernard Aspar, (8) Thierry Poumeyrol, and (9) Michel Bruel by MEMC Electronic Materials Inc..(Rogowski, Patricia) (Entered: Jan. 20, 2010).

Notice of Service of S.O.I.TEC Silicon on Insulator Technologies, S.A. and Commissariat L'Energie Atomique's Production 16 of CD-ROM Documents Bates Numbered SOIT 00207592 to SOIT 00218102 by Commissariat a LEnergie Atomique, SOITEC Silicon On Insulator Technologies SA, SOITEC U.S.A., Inc.. (Attachments: # 1 Certificate of Service)(Kraft, Denise) (Entered: Jan. 20, 2010).

Motion for Pro Hac Vice Appearance of Attorney Laura K. Carter—filed by Commissariat a LEnergie Atomique, SOITEC Silicon On Insulator Technologies SA, SOITEC U.S.A., Inc.. (Attachments: # 1 Text of Proposed Order, # 2 Certification, # 3 Certificate of Service)(Kraft, Denise) (Entered: Jan. 21, 2010). So Ordered- re 113 Motion for Pro Hac Vice Appearance of Attorney Laura K. Carter. Signed by Judge Sue L. Robinson on Jan. 26, 2010. (lid) (Entered: Jan. 26, 2010).

Notice of Service of S.O.I.TEC Silicon on Insulator Technologies, S.A. and Commissariat L'Energie Atomique's Production 17 of CD-Rom Documents Bates Numbered SOIT 00218103 to SOIT 00219113 by Commissariat a LEnergie Atomique, SOITEC Silicon On Insulator Technologies SA, SOITEC U.S.A., Inc.. (Attachments: # 1 Certificate of Service)(Kraft, Denise) (Entered: Jan. 27, 2010).

Notice of Service of S.O.I.TEC Silicon on Insulator Technologies, S.A. and Commissariat L'Energie Atomique's Production of Documents Bates Numbered SOIT 00219114 to SOIT 00219229 by Commissariat a LEnergie Atomique, SOITEC Silicon On Insulator Technologies SA, SOITEC U.S.A., Inc.. (Attachments: # 1 Certificate of Service)(Kraft, Denise) (Entered: Jan. 27, 2010).

Notice of Service of Documents Marked (1) MEMC0459973-MEMC-0526213; (2) MEMC0526214-MEMC-0526273; and (3) MEMC0484547-MEMC0526213 by MEMC Electronic Materials Inc..(Rogowski, Patricia) (Entered: Jan. 29, 2010).

Notice of Service of Six DVDs Containing Documents Marked MEMC0526274-MEMC0582949 by MEMC Electronic Materials Inc..(Rogowski, Patricia) (Entered: Feb. 2, 2010).

Notice of Service of Documents Marked MEMC0582950—MEMC0618792 by MEMC Electronic Materials Inc..(Rogowski, Patricia) (Entered: Feb. 8, 2010).

Notice of Service of Documents Marked (1) MEMC0618793-MEMC0697890 and (2) MEMC0697891-MEMC0715676 by MEMC Electronic Materials Inc..(Rogowski, Patricia) (Entered: Feb. 12, 2010).

Notice of Service of Documents Marked MEMC0715677-MEMC0772697 by MEMC Electronic Materials Inc..(Rogowski, Patricia) (Entered: Feb. 18, 2010).

Notice of Service of Notice of Videotaped Deposition by MEMC Electronic Materials Inc..(Rogowski, Patricia) (Entered: Feb. 19, 2010).

Notice of Service of S.O.I.TEC Silicon On Insulator Technologies, S.A. and Commissariat Lnergie Atomiques Production 19 of CD-ROM Documents Bates Numbered SOIT 00219230—Soit 00242462, SOIT 00242514—SOIT 00271070, SOIT 00271093—Soit 00277765, SOIT 00277802—SOIT 00280854 by Commissariat a LEnergie Atomique, SOITEC Silicon On Insulator Technologies SA, SOITEC U.S.A., Inc.. (Attachments: # 1 Certificate of Service)(Kraft, Denise) (Entered: Mar. 2, 2010).

Notice of Service of S.O.I.TEC Silicon On Insulator Technologies, S.A. and Commissariat Lnergie Atomiques Production 20 of CD-ROM Documents Bates Numbered SOIT 00280855—SOIT 00310785 by Commissariat a LEnergie Atomique, SOITEC Silicon On Insulator Technologies SA, SOITEC U.S.A., Inc.. (Attachments: # 1 Certificate of Service)(Kraft, Denise) (Entered: Mar. 2, 2010).

Notice of Service of S.O.I.TEC Silicon On Insulator Technologies, S.A. and Commissariat Lnergie Atomiques Production 21 of CD-ROM Documents Bates Numbered SCEA 00003975—SCEA 00004146 and SOIT 00310786—Soit 00336534 by Commissariat a LEnergie Atomique, SOITEC Silicon On Insulator Technologies SA, SOITEC U.S.A., Inc.. (Attachments: # 1 Certificate of Service)(Kraft, Denise) (Entered: Mar. 2, 2010).

Notice of Service of S.O.I.TEC Silicon On Insulator Technologies, S.A. and Commissariat Lnergie Atomiques Production 22 of CD-ROM Documents Bates Numbered SCEA 00004147—SCEA 00031465 and SOIT 00336535—SOIT 00355547 and SOIT 00355554—SOIT 00359693 by Commissariat a LEnergie Atomique, SOITEC Silicon On Insulator Technologies SA, SOITEC U.S.A., Inc.. (Attachments: # 1 Certificate of Service)(Kraft, Denise) (Entered: Mar. 2, 2010).

Notice of Service of S.O.I.TEC Silicon On Insulator Technologies, S.A.'s Fourth Set of Interrogatories (Nos. 28-29) Directed to MEMC Electronic Materials, Inc. by Commissariat a LEnergie Atomique, SOITEC Silicon On Insulator Technologies SA, SOITEC U.S.A., Inc.. (Attachments: # 1 Certificate of Service)(Kraft, Denise) (Additional attachment(s) added on Mar. 24, 2010: # 1 Certificate of Service) (fms). (Entered: Mar. 3, 2010).

Stipulation to Amend Scheduling Order re 26 Scheduling Order,,, by MEMC Electronic Materials Inc.. (Rogowski, Patricia) (Entered: Mar. 12, 2010). So Ordered- re 127 Stipulation to Amend Scheduling Order. Order-Setting Scheduling Order Deadlines ( Claims Construction Opening Brief due by Jun. 18, 2010., Discovery due by Jun. 18, 2010.) (Refer to Stipulation for Details). Signed by Judge Sue L. Robinson on Mar. 15, 2010. (lid) (Entered: Mar. 15, 2010).

Notice of Service of (1) MEMC Electronic Materials, Inc.'s Second Set of Requests for Admission Directed to Plaintiffs and (2) MEMC Electronic Materials, Inc.'s Fourth Set of Interrogatories Directed to S.O.I.TEC Silicon on Insulator Technologies, S.A., SOITEC USA, Inc. And Commissariat A L'Energie Atomique by MEMC Electronic Materials Inc..(Rogowski, Patricia) (Entered: Mar. 23, 2010). Correcting Entry: Per request of counsel, the pdf attached to D.I. 126 (Notice of Service of S.O.I.TEC Silicon On Insulator Technologies, S.A.'s Fourth Set of Interrogatories (Nos. 28-29) Directed to MEMC Electronic Materials, Inc. by Commissariat a LEnergie Atomique, SOITEC Silicon On Insulator Technologies SA, SOITEC U.S.A., Inc.) has been deleted and replaced with the proper attachment with the correct date. (fms) (Entered: Mar. 24, 2010). Correcting Entry: Per request of counsel, D.I. 129 has been deleted and will be re-filed at a later time. (lid) (Entered: Mar. 29, 2010).

Notice of Service of S.O.I.TEC Silicon On Insulator Technologies, S.A.'s Production 23 Bates Numbered SOIT 00359694 and SOIT 00359695, including Wafer Samples by SOITEC Silicon On Insulator Technologies SA. (Attachments: # 1 Certificate of Service)(Kraft, Denise) (Entered: Mar. 29, 2010).

Notice of Service of S.O.I.TEC Silicon On Insulator Technologies, S.A.'s Production 24 of CD-ROM Documents Bates Numbered SOIT 00359696—SOIT 00419315 by SOITEC Silicon On Insulator Technologies SA. (Attachments: # 1 Certificate of Service)(Kraft, Denise) (Entered: Apr. 1, 2010).

Notice of Service of Electronic Production of OCR Text Files related to: (1) S.O.I.TEC Silicon on Insulator Technologies, S.A.'s Production 19 Bates Numbered SOIT 00219230—SOIT 00242462; SOIT 00242514—SOIT 00271070; SOIT 00271093—SOIT 00277765; SOIT 00277802—Soit 00280854; (2) S.O.I.TEC Silicon on Insulator Technologies, S.A.'s Production 20 Bates Numbered SOIT 00280855—SOIT 00310785; and (3) S.O.I.TEC Silicon on Insulator Technologies, S.A. and Commissariat a L'Energie Atomique's Production 22 Bates Numbered SCEA 00004147—SCEA 00031465; SOIT 00336535—SOIT 00355547; and SOIT 00355554—SOIT 00359693 by Commissariat a LEnergie Atomique, SOITEC Silicon On Insulator Technologies SA. (Attachments: # 1 Certificate of Service)(Kraft, Denise) (Entered: Apr. 7, 2010).

Notice of Service of (1) Documents marked MEMC0772698-MEMC0775891; (2) Documents marked CRAV00000001-CRAV00000098; and (3) Document marked MEMC0775892 by MEMC Electronic Materials Inc..(Rogowski, Patricia) (Entered: Apr. 7, 2010).

Notice of Service of MEMC Electronic Materials, Inc.'S Supplemental Answer to CEA'S First Set of Interrogatories, MEMC'S Answers to SOITEC S.A.'S Fourth Set of Interrogatories (Nos. 28-29), and MEMC'S Supplemental Answers to SOITEC S.A.'S Third Set of Interrogatories (No. 23) by MEMC Electronic Materials Inc.. (Rogowski, Patricia) (Entered: Apr. 7, 2010). Set Hearings: Discovery Conference set for Apr. 23, 2010 9:30 Am in Courtroom 6B before Judge Sue L. Robinson. (nmf) (Entered: Apr. 21, 2010).

Notice of Service of S.O.I.TEC Silicon On Insulator Technologies, S.A.'s Production of Documents Bates Numbered SOIT 00419316 (updated from previously produced documents Bates numbered SOIT 00000159—SOIT 00000161) by SOITEC Silicon On Insulator Technologies SA. (Attachments: # 1 Certificate of Service)(Kraft, Denise) (Entered: Apr. 22, 2010). Minute Entry for proceedings held before Judge Sue L. Robinson—Discovery Conference held on Apr. 23, 2010. (Court Reporter V. Gunning.) (nmf) (Entered: Apr. 23, 2010).

Notice of Service of S.O.I.TEC Silicon On Insulator Technologies, S.A. and Commissariat a L'Energie Atomique's electronic production of: (1) Production #25 Bates Numbered SCEA00031466-SCEA00032999; SOIT00419316-SOIT00422470; and SOIT00422478-SOIT00461551; (2) Production #26 Bates Numbered SCEA00033000-SCEA00165680; SCEA00165686-SCEA00167229; SCEA00167232-SCEA00167288; and SOIT00461552-SOIT00474611; and (3) Production #27 Bates Numbered SCEA00167289-SCEA00167291; and SOIT00474611-SOIT00476375 by Commissariat a LEnergie Atomique, SOITEC Silicon On Insulator Technologies SA. (Attachments: # 1 Certificate of Service)(Kraft, Denise) (Entered: Apr. 29, 2010).

Notice of Service of Commissariat a L'Energie Atomique's Production #28 of CD-ROM Documents Bates Numbered SCEA00167292-SCEA00167308 by Commissariat a LEnergie Atomique. (Attachments: # 1 Certificate of Service)(Kraft, Denise) (Entered: Apr. 29, 2010).

Notice of Service of (1) Notice of Videotaped Deposition (Michael Bruel) and (2) Notice of Videotaped Deposition (S.O.I.TEC Silicon on Insulator Technologies, S.A. and SOITEC USA, Inc.) by MEMC Electronic Materials Inc..(Rogowski, Patricia) (Entered: May 3, 2010).

Notice of Service of (1) DVD Containing Video Marked CRA V00000099; (2) CD Containing Documents Marked MEMC0775893-MEMC0775948; (3) CD Containing Documents Marked MEMC0775949-MEMC0775954; and (4) DVD Containing Documents Marked MEMC0775955-MEMC0781961 by MEMC Electronic Materials Inc..(Rogowski, Patricia) (Entered: May 3, 2010).

Notice of Service of Commissariat a L'Energie Atomique's Production #29 of CD-ROM Documents Bates Numbered SCEA 00167309—SCEA 00167315 by Commissariat a LEnergie Atomique. (Attachments: # 1 Certificate of Service)(Kraft, Denise) (Entered: May 3, 2010).

Notice of Service of (1) S.O.I. TEC Silicon On Insulator Technologies, S.A., SOITEC, USA, Inc., and Commissariat a L'Energie Atomique's Responses to MEMC's Fourth Set of Interrogatories; and (2) S.O.I. TEC Silicon On Insulator Technologies, S.A., and Commissariat a L'Energie Atomique's Responses to MEMC's Second Set of Requests for Admissions re 128 Notice of Service, by Commissariat a LEnergie Atomique, SOITEC Silicon On Insulator Technologies SA, SOITEC U.S.A., Inc.. Related document: 128 Notice of Service, filed by MEMC Electronic Materials Inc. (Attachments: # 1 Certificate of Service)(Kraft, Denise) (Entered: May 4, 2010). Reset Hearings: Oral Argument re-set per joint request of counsel for Sep. 3, 2010 9:30 AM in Courtroom 6B before Judge Sue L. Robinson. (nmf) (Entered: May 5, 2010).

Motion for Discovery Motion for the Admission of the Expert Testimony of John T. Goolkasian Relating to the Certificate of Correction for U.S. Patent No. 7,067,396—filed by MEMC Electronic Materials Inc.. (Rogowski, Patricia) (Entered: May 7, 2010).

Opening Brief in Support re 141 Motion for Discovery *Motion for the Admission of the Expert Testimony of John T. Goolkasian Relating to the Certificate of Correction for U.S. Patent No. 7,067,396* filed by MEMC Electronic Materials, Inc..Answering Brief/Response due date per Local Rules is May 24, 2010. (Attachments: # 1 Exhibit 1, # 2 Exhibit 2, # 3 Exhibit 3, # 4 Exhibit 4, # 5 Exhibit 5, # 6 Exhibit 6, # 7, Exhibit 7, # 8 Exhibit 8, # 9 Exhibit 9, # 10 Exhibit 10, # 11 Exhibit 11, # 12 Exhibit 12, # 13 Exhibit 13, # 14 Exhibit 14, # 15 Exhibit 15)(Rogowski, Patricia) (Entered May 7, 2010).

Notice of Service of CD-ROM including re-submittal of documents Bates numbered SOIT 00310798-00336526 as Document Bates numbered SOIT 00310798 in native format by SOITEC Silicon On Insulator Technologies SA. (Attachments: # 1 Certificate of Service)(Kraft, Denise) (Entered: May 20, 2010).

Notice of Service of Amended Notices of Videotaped Deposition of (1) Dr. Bernard Aspar and (2) Dr. Michel Bruel by MEMC Electronic Materials Inc..(Rogowski, Patricia) (Entered: May 21, 2010).

Answering Brief in Opposition re 141 Motion for Discovery *Motion for the Admission of the Expert Testimony of John T. Goolkasian Relating to the Certificate of Correction for U.S. Patent No. 7,067,396 Plaintiff's Answering Brief in Opposition to Defendant's Motion For the Admission of Expert Testimony of John T. Goolkasian* filed by SOITEC Silicon On Insulator Technologies SA. Reply Brief due date per Local Rules is Jun. 4, 2010. (Attachments: # 1 Certificate of Service)(Kraft, Denise) (Entered: May 24, 2010).

Declaration re 145 Answering Brief in Opposition,, *Declaration of Marcus T. Hall in Support of Plaintiff's Answering Brief in Opposition to Defendant's Motion For the Admission of Expert Testimony of John T. Goolkasian* by SOITEC Silicon On Insulator Technologies SA. (Attacments: # 1 Exhibit A, # 2 Exhibit B, # 3 Exhibit C, # 4 Exhibit D, # 5 Exhibit E, # 6 Exhibit F, # 7 Exhibit G, # 8 Exhibit H, # 9 Exhibit I, # 10 Exhibit J, # 11 Exhibit K, # 12 Exhibit L, # 13 Exhibit M, # 14 Exhibit N, # 15 Certificate of Service (Kraft, Denise) (Entered: May 24, 2010).

Letter to the Honorable Sue L. Robinson from Denise Seastone Kraft, Esq. regarding [Proposed] Third Stipulation to Amend Scheduling Order—re 26 Scheduling Order,,,. (Attachments: # 1 Text of Proposed Order)(Kraft, Denise) (Entered: May 25, 2010). Correcting Entry: Stipulation attached to D.I. 147 has been deleted due to document being filed improperly. Counsel is advised to re-file document using the Stipulation event code (lid) (Entered: May 25, 2010).

Stipulation [Proposed] Third Stipulation to Amend Scheduling Order re 26 Scheduling Order,,, 147 Letter by Commissariat a LEnergie Atomique, SOITEC Silicon On Insulator Technologies SA, SOITEC U.S.A., Inc.. (Kraft, Denise) (Entered: May 25, 2010). So Ordered—re 148 to Amend Scheduling Order. Order- Setting Scheduling Order Deadlines (Claims Construction Opening Brief due by Jun. 25, 2010., Discovery due by Jul. 30, 2010., Dispositive Motions due by Jul. 2, 2010., Answering Brief due Jul. 16, 2010., Reply Brief due Jul. 30, 2010.). Signedy by Judge Sue L. Robinson on May 26, 2010. (lid) (Entered: May 26, 2010).

Notice of Service of Expert Reports of (1) Peter Moran, (2) John T. Goolkasian, (3) Robert Averback, and (4) Pascal Bellon by MEMC Electronic Materials Inc..(Rogowski, Patricia) (Entered: Jun. 2, 2010).

Notice of Service of S.O.I.TEC Silicon On Insulator Technologies, S.A.'s Production 31 of CD-ROM Documents Bates Numbered SOIT 00476382 to SOIT 00476394 by SOITEC Silicon On Insulator Technologies SA. (Attachments: # 1 Certificate of Service)(Kraft, Denise) (Entered: Jun. 2, 2010).

Notice of Service of (1) Expert Report of Andrew Hirt; (2) Expert Report of John Bravman regarding Invalidity of United States Patent No. 5,834,812; and (3) Expert Report of John Bravman regarding Infringement by Defendant MEMC by Commissariat a LEnergie Atomique, SOITEC Silicon On Insulator Technologies SA, SOITEC U.S.A., Inc.. (Attachments: # 1 Certificate of Service)(Kraft, Denise) (Entered: Jun. 2, 2010).

Reply Brief in Support of 141 Motion for Discovery Motion for the Admission of the Expert Testimony of John T. Goolkasian Relating to the Certificate of Correction for U.S. Patent No. 7,067,396 filed by MEMC Electronic Materials Inc.. (Attachments: # 1 Exhibit 1, # 2 Exhibit 2, # 3 Exhibit 3, # 4 Exhibit 4, # Exhibit 5, # 6 Exhibit 6)(Rogowski, Patricia) Modified on Jun. 4, 2010 (lid). (Entered: Jun. 4, 2010).

Notice of Service of S.O.I.TEC Silicon On Insulator Technologies, S.A.'s Production 32 of CD-ROM Documents Bates Numbered SOIT 00476395 to SOIT 00476441 by SOITEC Silicon On Insulator Technologies SA. (Attachments: # 1 Certificate of Service)(Kraft, Denise) (Entered: Jun. 7, 2010).

Statement re 148 Stipulation *Joint Claim Construction Statement* by Commissariat a LEnergie Atomique, SOITEC Silicon On Insulator Technologies SA, SOITEC U.S.A., Inc.. (Attachments: # 1 Certificate of Service)(Kraft, Denise) (Entered: Jun. 14, 2010).

Claim Construction Chart by Commissariat a LEnergie Atomique, SOITEC Silicon On Insulator Technologies SA, SOITEC U.S.A., Inc.. (Attachments: # 1 Certificate of Service)(Kraft, Denise) (Entered: Jun. 14, 2010).
Notice of Service of (1) S.O.I.TEC Silicon On Insulator Technologies, S.A.'s Production 33 of CD-ROM Documents Bates Numbered SOIT 00476442 to SOIT 00476456; and (2) S.O.I.TEC Silicon On Insulator Technologies, S.A.'s Production 33 Supplement including CD-ROM Documents Bates Numbered SOIT 00476442 to SOIT 00476456 (duplicates of Production 33) and SOIT 00476457 (Burg Translations, Inc. Certification) by SOITEC Silicon On Insulator Technologies SA. (Attachments: # 1 Certificate of Service)(Kraft, Denise) (Entered: Jun. 15, 2010).
Sur-Reply Brief re 141 Motion for Discovery Motion for the Admission of the Expert Testimony of John T. Goolkasian Relating to the for U.S. Patent No. 7,067,396 *Surreply by Plaintiffs to Motion by Defendant for the Admission of Expert Testimony of John T. Goolkasian* filed by SOITEC Silicon On Insulator Technologies SA. (Attachments: # 1 Certificate of Service)(Kraft, Denise) (Entered: Jun. 15, 2010).
Declaration re 157 Sur-Reply Brief, *Declaration of Marcus T. Hall in Support of Surreply by Plaintiffs to Motion by Defendant for the Admission of Expert Testimony of John T. Goolkasian* by SOITEC Silicon On Insulator Technologies SA. (Attachments: # 1 Exhibit A, # 2 Exhibit B, # 3 Exhibit C, # 4 Exhibit D, # 5 Certificate of Service)(Kraft, Denise) (Entered: Jun. 15, 2010).
Notice of Service of Videotaped Depositions for Dr. John C. Bravman and Andrew M. Hirt by MEMC Electronic Materials Inc. (Rogowski, Patricia) (Entered: Jun. 18, 2010).
Stipulation Stipulated Motion for Leave to Exceed Page Limit Under Delaware L.R. 7.1.3 by MEMC Electronic Materials, Inc.. (Rogowski, Patricia) (Entered: Jun. 21, 2010); So Ordered- re 160 Stipulated Motion for Leave to Exceed Page Limit. Signed by Judge Sue L. Robinson on Jun. 22, 2010. (lid) (Entered: Jun. 22, 2010).
Notice of Service of (1) Rebuttal Expert Report of Robert Averback; (2) Report on Characterization of Si Wafers by Transmission Electron Microscopy (Pascal Bellon); and (3) Rebuttal Expert Report of Peter Moran by MEMC Electronic Materials Inc..(Rogowski, Patricia) (Entered: Jun. 22, 2010).
Notice of Service of Supplemental Expert Report of Peter Moran by MEMC Electronic Materials Inc..(Rogowski, Patricia) (Entered: Jun. 22, 2010).
Notice of Service of Documents Marked MEMC0781986-MEMC0782012 by MEMC Electronic Materials Inc..(Rogowski, Patricia) (Entered: Jun. 23, 2010).
Notice of Service of S.O.I.TEC Silicon on Insulator Technologies, S.A. and Commissariat a L'Energie Atomique's: (1) Notice of Deposition of Dr. Peter Moran; (2) Notice of Deposition of Dr. Robert Averback; and (3) Notice of Deposition of Dr. Pascal Bellon by Commissariat a LEnergie Atomique, SOITEC Silicon On Insulator Technologies SA. (Attachments: # 1 Certificate of Service)(Kraft, Denise) (Entered: Jun. 24, 2010).
Notice of Service of S.O.I.TEC Silicon on Insulator Technologies, S.A. and Commissariat a L'Energie Atomique's List of Fact Witnesses by Commissariat a LEnergie Atomique, SOITEC Silicon On Insulator Technologies SA. (Attachments: # 1 Certificate of Service)(Kraft, Denise) (Entered: Jun. 24, 2010).
Notice of Service of S.O.I.TEC Silicon on Insulator Technologies, S.A. and Commissariat a L'Energie Atomique's: (1) Supplemental Expert Report of Andrew M. Hirt; and (2) Expert Report of John C. Bravman Regarding Non-infringement of U.S. Patent No. 5,834,812 by Commissariat a LEnergie Atomique, SOITEC Silicon On Insulator Technologies SA. (Attachments: # 1 Certificate of Service)(Kraft, Denise) (Entered: Jun. 24, 2010).
Claim Construction Opening Brief filed by MEMC Electronic Materials Inc.. (Attachments: # 1 Appendix DA0001-DA0006, # 2 Appendix DA0007-DA0032, # 3 Appendix DA0033-DA0072, # 4 Appendix DA0073-DA0112, # 5 Appendix DA0113-DA0152, # 6 Appendix DA0153-DA0192, # 7 Appendix DA0193-DA0232, # 8 Appendix DA0233-DA0272, # 9 Appendix DA0273-DA0312, # 10 Appendix DA0313-DA0352, # 11 Appendix DA0353-DA0392, # 12 Appendix DA0393-DA0432, # 13 Appendix DA0433-DA0472, # 14 Appendix DA0473-DA0512, # 15 Appendix DA0513-DA0521, # 16 Appendix DA0522-DA0545, # 17 Appendix Sealed—DA0546-DA0551, # 18 Appendix DA0552-DA0563, # 19 Appendix Sealed—DA0564-DA0566, # 20 Appendix DA0567-DA0573, # 21 Appendix Sealed—DA0574-DA0599, # 22 Appendix DA0600-DA0604, # 23 Appendix DA0605-DA0609, # 24 Appendix DA0610-DA0625, # 25 Appendix DA0626-0634, # 26 Appendix DA0635, # 27 Appendix DA0636-DA0652, # 28 Appendix Sealed—DA0653-DA0657, # 29 Appendix DA0658-DA0667, # 30 Appendix DA0668-DA0670, # 31 Appendix DA0671-DA0678, # 32 Appendix DA0679-DA0687, # 33 Appendix DA0688-DA0696, # 34 Appendix Sealed—DA0697-DA0705, # 35 Appendix Sealed—DA0706-DA0711, # 36 Appendix Sealed—DA0712-DA0714, # 37 Appendix DA0715-DA0717, # 38 Appendix DA0718-DA0719, # 39 Appendix DA0720-DA0722, # 40 Appendix DA0723-DA0732, # 41 Appendix DA0733-DA0740, # 42 Appendix DA0741-DA0749, # 43 Appendix DA0750-DA0769, # 44 Appendix DA0770-DA0781)(Rogowski, Patricia) (Entered: Jun. 25, 2010).
Claim Construction Opening Brief *Plaintiffs S.O.I.TEC Silicon on Insulator Technologies, S.A. and Commissariat a L'Energie Atomique's Opening Claim Construction Brief* filed by Commissariat a LEnergie Atomique, SOITEC Silicon On Insulator Technologies SA. (Attachments: # 1 Certificate of Service)(Kraft, Denise) (Entered: Jun. 25, 2010).
Declaration re 168 Claim Construction Opening Brief, *Declaration of Marcus T. Hall in Support of Plaintiffs S.O.I. TECc Silicon on Insulator Technologies, S.A.and Commissariat a L'Energie Atomique's Opening Claim Construction Brief* by Commissariat a LEnergie Atomique, SOITEC Silicon On Insulator Technologies SA. (Attachments: # 1 Certificate of Service)(Kraft, Denise) (Entered: Jun. 25, 2010).
Sealed Exhibit re 169 Declaration, *Exhibit A (Filed Under Seal) to Declaration of Marcus T. Hall in Support of Plaintiffs S.O.I.TEC Silicon on Insulator Technologies, S.A. and Commissariat a L'Energie Atomique's Opening Claim Construction Brief* by Commissariat a LEnergie Atomique, SOITEC Silicon On Insulator Technologies SA. (Attachments: # 1 Certificate of Service) (Kraft, Denise) (Entered: Jun. 25, 2010).
Sealed Exhibit re 169 Declaration, *Exhibit B (Filed Under Seal) to Declaration of Marcus T. Hall in Support of Plaintiffs S.O.I.TEC Silicon on Insulator Technologies, S.A. and Commissariat a L'Energie Atomique's Opening Claim Construction Brief* by Commissariat a LEnergie Atomique, SOITEC Silicon On Insulator Technologies SA. (Attachments: # 1 Certificate of Service)(Kraft, Denise) (Entered: Jun. 25, 2010).
Sealed Exhibit re 169 Declaration, *Exhibit C (Filed Under Seal) to Declaration of Marcus T. Hall in Support of Plaintiffs S.O.I.TEC Silicon on Insulator Technologies, S.A. and Commissariat a L'Energie Atomique's Opening Claim Construction Brief* by Commissariat a LEnergie Atomique, SOITEC Silicon On Insulator Technologies SA. (Attachments: # 1 Certificate of Service)(Kraft, Denise) (Entered: Jun. 25, 2010).
Notice of filing the following document(s) in paper format: Joint Appendix of Exhibits to Opening and Answering Claim Construction Briefs (1) vol. I—JA0001 to JA0533; (2) vol. II—JA0534 to JA0930; (3) vol. III—JA0931 to JA1502; (4) vol. IV—JA1503 to JA1510 (Filed Under Seal); (5) vol. V—JA1511 to JA2089; and (6) vol. VI—JA2090 to JA2557. Original document(s) to be filed with the Clerk's Office. Notice filed by Denise Seastone Kraft on behalf of Commissariat a LEnergie Atomique, SOITEC Silicon On Insulator Technologies SA (Attachments: # 1 Certificate of Service)(Kraft, Denise) (Entered: Jun. 25, 2010); Correcting Entry: Docket clerk deleted appendices to D.I. 167 due to documents being filed improperly. Counsel is advised to re-file appendices separately using the Appendix event code. Counsel is also advised that sealed documents may not be filed with public view documents. (lid) (Entered: Jun. 28, 2010).
(Document too large to file in pdf format, will file at later date by Express Mail). Appendix re 167 Claim Construction Opening Brief,,,,,, by MEMC Electronic Materials Inc..(Attachments: # 1 Appendix DA-0001—D0006, # 2 Appendix DA-0007—DA-0032, # 3 Appendix DA-0033—DA-0072, # 4 Appendix DA-0073—DA-0112, # 5 Appendix DA-0113—DA-0152, # 6 Appendix DA-0153—DA-0192, # 7 Appendix DA-0193—DA-0232, # 8 Appendix DA-0233—DA-0272, # 9 Appendix DA-0273—DA-0312, # 10 Appendix DA-0313—DA-0352, # 11 Appendix DA-0353—DA-0392, # 12 Appendix DA-0393—DA-0432, # 13 Appendix DA-0433—DA-0472, # 14 Appendix DA-0473—DA-0512, # 15 Appendix DA0513—DA-0521)(Rogowski, Patricia) (Entered: Jun. 28, 2010).
Sealed Appendix re 167 Claim Construction Opening Brief,,,,,, by MEMC Electronic Materials Inc.. (Rogowski, Patricia) (Entered: Jun. 28, 2010).
Notice of Service of S.O.I.TEC Silicon on Insulator Technologies, S.A. and Commissariat a L'Energie Atomique's Production 34 of CD-ROM Documents Bates Numbered SOIT 00476458 to SOIT 00476602 by SOITEC Silicon On Insulator Technologies SA. (Attachments: # 1 Certificate of Service)(Kraft, Denise) (Entered: Jun. 28, 2010).
Redacted Version of 175 Appendix by MEMC Electronic Materials Inc.. (Attachments: # 1 Appendix DA0522-DA0545, # 2 Appendix Appendix DA0546-DA0551, # 3 Appendix DA0552-DA0563, # 4 Appendix DA0564-DA0566, # 5 Appendix DA0567-DA0573, # 6 Appendix DA0574-DA0599, # 7 Appendix DA0600-DA0604, # 8 Appendix DA0605-DA0609, # 9 Appendix DA0610-DA0625, # 10 Appendix DA0626-DA0634, # 11 Appendix DA0635, # 12 Appendix DA0636-DA0652, # 13 Appendix DA0653-DA0657, # 14 Appendix DA0658-DA0667, # 15 Appendix DA0668-DA0670, # 16 Appendix DA0671-DA0678, # 17 Appendix DA679-DA0687, # 18 Appendix DA0688-DA0696, # 19 Appendix DA0697-DA0705, # 20 Appendix DA0706-DA-0711, # 21 Appendix DA0712-DA0714, # 22 Appendix DA0715-DA0717, # 23 Appendix DA0718-DA0719, # 24 Appendix DA0720-DA0722, # 25 Appendix DA0723-DA0732, # 26 Appendix DA0733-DA0740, # 27 Appendix DA0741-DA0749, # 28 Appendix DA0750-DA0769, # 29 Appendix DA0770-DA0781, # 30 Certificate of Service)(Rogowski, Patricia) (Entered: Jun. 28, 2010).
(Document too large to file in pdf format, will file at later date by Express Mail). Notice of filing the following document(s) in paper format: Joint Appendix of Exhibits to Opening and Answering Claim construction Briefs (1) vol. I—JA0001 to JA0533. Appendix vol. I re 173 Notice of Filing Paper Documents (Oversized document, item on file in the Clerks Office). (lid) (Entered: Jun. 28, 2010).
(Document too large to file in pdf format, will file at later date by Express Mail). Notice of filing the following document(s) in paper format: Joint Appendix of Exhibits to Opening and Answering Claim Construction Briefs (2) vol. II—JA0534 to JA0930. Appendix vol. II. re 173 Notice of Filing Paper Documents(Oversized Document, Item on File in the Clerks Office). (lid) (Entered: Jun. 28, 2010).
(Document too large to file in pdf format, will file at later date by Express Mail). Notice of filing the following document(s) in paper format: Joint Appendix of Exhibits to Opening and Answering Claim Construction Briefs (3) vol. III—JA0931 to JA1502. Appendix vol. III. re 173 Notice of Filing Paper Documents(Oversized Document, Item on file in the Clerks Office) (lid) (Entered: Jun. 28, 2010).
(Document too large to file in pdf format, will file at later date by Express Mail). Notice of filing the following document(s) in paper format: Joint Appendix of Exhibits to Opening and Answering claim Construction Briefs (4) vol. IV—JA1503 to JA1510. Appendix vol. IV. re 173 Notice of Filing Paper Documents, (Oversized document, item on file in the Clerks Office) (lid) (Entered: Jun. 28, 2010).
(Document too large to file in pdf format, will file at later date by Express Mail). Notice of filing the following document(s) in paper format: Joint Appendix of Exhibits to Opening and Answering Claim Construction Briefs (5) vol. V—JA1511 to JA2089.
(Document too large to file in pdf format, will file at later date by Express Mail). Vol. VI—JA2090 to JA2557. Original document(s) to be filed with the Clerk's Office. Notice filed by Denise Seastone Kraft on behalf of Commissariat a LEnergie Atomique, SOITEC Silicon On Insulator Technologies SA (Attachments: # 1 Certificate of Service)(Kraft, Denise) (Entered: Jun. 25, 2010).
Sealed Appendix re 168 Claim Construction Opening Brief, *Joint Appendix of Exhibits to Opening and Answering Claim Construction Briefs vol. IV of VI—filed Under Seal* by Commissariat a LEnergie Atomique, SOITEC Silicon On Insulator Technologies SA. (Attachments: # 1 Certificate of Service)(Kraft, Denise) (Entered: Jun. 28, 2010).

Notice of Service of S.O.I.TEC Silicon on Insulator Technologies, S.A.'s and Commissariat a L'Energie Atomique's List of Rebuttal Fact Witnesses by Commissariat a LEnergie Atomique, SOITEC Silicon On Insulator Technologies SA. (Attachments: # 1 Certificate of Service)(Kraft, Denise) (Entered: Jun. 30, 2010).
Notice of Service of Amended Notice of Videotaped Deposition of Dr. John C. Bravman by MEMC Electronic Materials Inc.. (Rogowski, Patricia) (Entered: Jun. 30, 2010).
Motion in Limine *SOITEC/CEA Parties' Motion to Exclude the Expert Report of Dr. Pascal Bellon and Any Related Testimony*—filed by Commissariat a LEnergie Atomique, SOITEC Silicon On Insulator Technologies SA. (Attachments: # 1 Text of Proposed Order, # 2 Certificate of Service)(Kraft, Denise) (Entered: Jul. 2, 2010).
Motion for Partial Summary Judgment *of Invalidity of the Asserted Aspar Patent Claims*—filed by MEMC Electronic Materials Inc.. (Attachments: # 1 Text of Proposed Order, # 2 Certificate of Service)(Rogowski, Patricia) (Entered: Jul. 2, 2010).
Opening Brief in Support re 186 Motion in Limine *SOITEC/CEA parties' Motion to Exclude the Expert Report of Dr. Pascal Bellon and Any Related Testimony* filed by Commissariat a LEnergie Atomique, SOITEC Silicon On Insulator Technologies SA.Answering Brief/Response due date per Local Rules is Jul. 19, 2010. (Attachments: # 1 Certificate of Service)(Kraft, Denise) (Entered: Jul. 2, 2010).
Opening Brief in Support re 187 Motion for Partial Summary Judgment *of Invalidity of the Asserted Aspart Patent Claims* filed by MEMC Electronic Materials Inc..Answering Brief/Response due date per Local Rules is Jul. 19, 2010. (Rogowski, Patricia) (Entered: Jul. 2, 2010).
Sealed Appendix re 189 Opening Brief in Support, by MEMC Electronics Materials Inc.. (Attachments: # 1 Table of Contents, # 2 Certificate of Service)(Rogowski, Patricia) (Entered: Jul. 2, 2010).
(Document too large to file in pdf format, will file at later date by Express Mail). Appendix re 186 Motion in Limine SOITEC/CEA *Parties' Motion to Exclude The Expert Report of Dr. Pascal Bellon and Any Related Testimony Plaintiffs' Omnibus Appendix to Daubert Motion and Motions for Partical Summary Jedgment Filed on Jul. 2, 2010* by Commissariat a LEnergie Atomique, SOITEC Silicon On Insulator Technologies SA. (Attachments: # 1 Appendix vol. II of XIX, # 2 Appendix vol. III of XIX, # 3 Appendix vol. IV of XIX, # 4 Appendix vol. V of XIX, # 5 Appendix vol. VII of XIX, # 6 Appendix vol. IX of XIX, # 7 Appendix vol. XI of XIX, # 8 Appendix vol. XII of XIX, # 9 Appendix vol. XIII of XIX, # 10 Appendix vol. XIV of XIX, # 11 Appendix vol. XV of XIX, # 12 Appendix vol. XVI of XIX, # 13 Appendix vol. XVIII of XIX, # 14 Certificate of Service)(Kraft, Denise) (Entered: Jul. 2, 2010).
Sealed Appendix re 186 Motion in Limine *SOITEC/CEA Parties' Motion to Exclude The Expert Report of Dr. Pascal Bellon and Any Related Testimony Plaintiffs' Omnibus Appendix to Daubert Motion and Motions for Partial Summary Judgment Filed on Jul. 2, 2010— vol. VI of XIX (Filed under Seal)* by Commissariat a LEnergie Atomique, SOITEC Silicon On Insulator Technologies SA. (Attachments: # 1 Certificate of Service)(Kraft, Denise) (Entered: Jul. 2, 2010).
Sealed Appendix re 186 Motion in Limine *SOITEC/CEA Parties' Motion to Exclude The Expert Report of Dr. Pascal Bellon and Any Related Testimony Plaintiffs' Omnibus Appendix to Daubert Motion and Motions for Partial Summary Judgment filed on Jul. 2, 2010— vol. VIII of XIX (Filed under Seal)* by Commissariat a LEnergie Atomique, SOITEC Silicon On Insulator Technologies SA. (Attachments: # 1 Certificate of Service)(Kraft, Denise) (Entered: Jul. 2, 2010).
Sealed Appendix re 186 Motion in Limine *SOITEC/CEA Parties' Motion to Exclude The Expert Report of Dr. Pascal Bellon and Any Related Testimony Plaintiffs' Omnibus Appendix to Daubert Motion and Motions for Partial Summary Judgment filed on Jul. 2, 2010— vol. X of XIX (Filed under Seal)* by Commissariat a LEnergie Atomique, SOITEC Silicon On Insulator Technologies SA. (Attachments: # 1 Certificate of Service)(Kraft, Denise) (Entered: Jul. 2, 2010).
Sealed Appendix re 186 Motion in Limine *SOITEC/CEA Parties' Motion to Exclude The Expert Report of Dr. Pascal Bellon and Any Related Testimony Plaintiffs' Omnibus Appendix to Daubert Motion* and *Motions for Partial Summary Judgment filed on Jul. 2, 2010—vol. XVII of XIX (Filed under Seal)* by Commissariat a LEnergie Atomique, SOITEC Silicon On Insulator Technologies SA. (Attachments: # 1 Certificate of Service)(Kraft, Denise) (Entered: Jul. 2, 2010).
Sealed Appendix re 186 Motion in Limine *SOITEC/CEA Parties' Motion to Exclude The Expert Report of Dr. Pascal Bellon and Any Related Testimony Plaintiffs' Omnibus Appendix to Daubert Motion and Motions for Partial Summary Judgment filed on Jul. 2, 2010—vol. XIX of XIX (Filed under Seal)* by Commissariat a LEnergie Atomique, SOITEC Silicon On Insulator Technologies SA. (Attachments: # 1 Certificate of Service)(Kraft, Denise) (Entered: Jul. 2, 2010).
Sealed Motion for Summary Judgment *SOITEC/CEA Parties' Motion for Summary Judgment: Non-Infringement (Filed under Seal)*—filed by Commissariat a LEnergie Atomique, SOITEC Silicon On Insulator Technologies SA. (Attachments: # 1 Certificate of Service)(Kraft, Denise) (Entered: Jul. 2, 2010).
Sealed Opening Brief in Support re 197 Sealed Motion for Summary Jedgment *SOITEC/CEA Parties' Motion for Summary Judgment: Non-Infringement (Filed under Seal)* Sealed Motion for Summaru Judgment *SOITEC/CEA Parties' Motion for Summary Judgment: Non-Infringment (Filed under Seal)* filed by Commissariat a LEnergie Atomique, SOITEC Silicon On Insulator Technologes SA.Answering Brief/Response due date per Local Rules is Jul. 19, 2010. (Attachments: # 1 Certificate of Service)(Kraft, Denise) (Entered: Jul. 2, 2010).
Motion for Summary Judgment *of Non-Infringement*—filed by MEMC Electronic Materials Inc.. (Attachments: # Text of Proposed Order, # 2 Certificate of Service)(Rogowski, Patricia) (Entered: Jul. 2, 2010).
Sealed Opening Brief in Support re 199 Motion for Summary Judgment *of Non-Infringement* filed by MEMC Electronic Materials Inc.. Answering Brief/Response due date per Local Rules is Jul. 19, 2010. (Attachments: # 1 Certificate of Service)(Rogowski, Patricia) (Entered: Jul. 2, 2010).
Sealed Appendix re 200 Opening Brief in Support, by MEMC Electronic Materials Inc.. (Attachments: # 1 Table of Contents, # 2 Certificate of Service)(Rogowski, Patricia) (Entered: Jul. 2, 2010).
Motion for Partial Summary Judgment *SOITEC/CEA Parties Motion for Partial Summary Judgment That the Patents in Suit Satisfy the Written Description Requirement*—filed by Commissariat a LEnergie Atomique, SOITEC Silicon On Insulator Technologies SA. (Attachments: # 1 Certificate of Service)(Kraft, Denise) (Entered: Jul. 2, 2010).
Opening Brief in Support re 202 Motion for Partial Summary Judgment *SOITEC/CEA Parties Motion for Partial Summary Judgment that the Patents in Suit Satisfy the Written Description Requirement* filed by Commissariat a LEnergie Atomique, SOITEC Silicon On Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010.
Motion for Partial Summary Judgment *Plaintiffs' Motion for Partial Summary Judgment That the Certificate of Correction for the '396 Patent is Valid*—filed by Commissariat a LEnergie Atomique, SOITEC Silicon On Insulator Technologies SA. (Attachments: # 1 Certificate of Service)(Kraft, Denise) (Entered: Jul. 2, 2010).
Opening Brief in Support re 204 Motion for Partial Summary Judgment *Plaintiffs' Motion for Partial Summary Judgment that the Certificate of Correction for the '396 Patent is Valid* filed by Commissariat a LEnergie Atomique, SOITEC Silicon On Insulator Technologies SA.Answering Brief/Response due date per Local Rules is Jul. 19, 2010. (Attachments: # 1 Certificate of Service)(Kraft, Denise) (Entered: Jul. 2, 2010).
Motion for Partial Summary Judgment *SOITEC/CEA Parties' Motion for Partial Summary Judgment That the Aspar Patents Are Not Invalid for Inequitable Conduct*—filed by Commissariat a LEnergie Atomique, SOITEC Silicon On Insulator Technologies SA, SOITEC U.S.A., Inc.. (Attachments: # 1 Text of Proposed Order, # 2 Certificate of Service)(Kraft, Denise) (Entered: Jul. 2, 2010).
Opening Brief in Support re 206 Motion for Partial Summary Judgment *SOITEC/CEA Parties' Motion for Partial Summary Judgment that the Aspar Patents are not Invalid for Inequitable Conduct* filed by Commissariat a LEnergie Atomique, SOITEC Silicon On Insulator Technologies SA, SOITEC U.S.A., Inc..Answering Brief/Response due date per Local rules is Jul. 19, 2010. (Attachments: # 1 Certificate of Service)(Kraft, Denise) (Entered: Jul. 2, 2010).
Motion for Partial Summary Judgment *Plaintiffs' Motion for Partial Summary Judgment That the Bruel Patent Does Not Anticipate the Aspar Patents* —filed by Commissariat a LEnergie Atomique, SOITEC Silicon On Insulator Technologies SA. (Attachments: # 1 Text of Proposed Order, # 2 Certificate of Service)(Kraft, Denise) (Entered: Jul. 2, 2010).
Opening Brief in Support re 208 Motion for Partial Summary Judgment *Plaintiffs' Motion for Partial Summary Judgment that the Bruel Patent Does Not Anticipate the Aspar Patents* filed by Commissariat a LEnergie Atomique, SOITEC Silicon On Insulator Technologies SA.Answering Brief/Response due date per Local Rules is Jul. 19, 2010. (Attachments: # 1 Certificate of Service)(Kraft, Denise) (Entered: Jul. 2, 2010).
Motion for Partial Summary Judgment *Soitec's Motion for Partial Summary Judgment of Invalidity of United States Patent No. 5,834,812 for Lack of Enablement*—filed by SOITEC Silicon On Insulator Technologies SA, SOITEC U.S.A., Inc.. (Attachments: # 1 Text of Proposed Order, # 2 Certificate of Service)(Kraft, Denise) (Entered: Jul. 2, 2010).
Opening Brief in Support re 210 Motion for Partial Summary Judgment *SOITEC's Motion for Partial Summary Judgment of Invalidity of United States Patent No. 5,834,812 For Lack of Enablement* filed by SOITEC Silicon On Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).
Motion for Partial Summary Judgment *SOITEC's Motion for Partial Summary Judgment for Invalidity of Asserted Claims of United States Patent No. 5,834,812 in View of Prior Art*—filed by SOITEC Silicon On Insulator Technologies SA, SOITEC U.S.A., Inc.. (Attachments: # 1 Text of Proposed Order, # 2 Certificate of Service)(Kraft, Denise) (Entered: Jul. 2, 2010).
Motion for Partial Summary Judgment *That the Best Mode Requirement is Satisfied for the Claims of the '009 and '396 Patents*—filed by Commissariat a LEnergie Atomique, SOITEC Silicon On Insulator Technologies SA. (Attachments: # 1 Text of Proposed Order, # 2 Certificate of Service)(Reed, John) (Entered: Jul. 2, 2010).
Opening Brief in Support re 212 Motion for Partial Summary Judgment *SOITEC's Motion for Partial Summary Judgment for Invalidity of Asserted Claims of United States Patent No. 5,834,812 in View of Prior Art* filed by SOITEC Silicon On Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).
Opening Brief in Support re 213 Motion for Partial Summary Judgment *That the Best Mode Requirement is Satisfied for the Claims of the '009 and '396 Patents* filed by SOITEC Silicon On Insulator Technologies SA.Answering Brief/Response due date per Local Rules is Jul. 19, 2010. (Attachments: # 1 Certificate of Service)(Reed, John) (Entered: Jul. 2, 2010).
Correcting Entry: Per request of counsel, D.I. number 216 has been deleted and will be re-filed at a later time (lid) (Entered: Jul, 7, 2010).
Correcting Entry: Per request of counsel, D.I. number 217 has been deleted and will be re-filed at a later time (lid) (Entered: Jul. 7, 2010).
Redacted Version of 200 Opening Brief in Support, by MEMC Electronic Materials Inc.. (Attachments: # 1 Certificate of Service)(Rogowski, Patricia) (Entered: Jul. 7, 2010); Correcting Entry: Per request of counsel, D.I. numbers 216 and 217 have been deleted and will be re-filed at a later time (lid) (Entered: Jul. 7, 2010).
Redacted Version of 201 Appendix by MEMC Electronic Materials Inc..(Attachments: # 1 Appendix MA0001—MA0004, # 2 Appendix MA0005—MA0010, # 3 Appendix MA0011—MA0016, # 4 Appendix MA0017—MA0020, # 5 Appendix MA0021—MA0029, # 6 Appendix MA0030—MA0045, # 7 Appendix MA0046—MA0052, # 8 Appendix MA0053—MA0078, # 9 Appendix MA0079—MA0092, # 10 Appendix MA0093—MA0129, # 11 Appendix MA0130—MA0148, # 12 Appendix MA0149—MA0160, # 13 Appendix MA0161—MA0163, # 14 Appendix MA0164—MA0167, # 15 Appendix MA0168—MA0172, # 16 Appendix MA0173—MA0183, # 17 Appendix MA0184—MA0196, # 18 Appendix MA01967—MA0207, # 19 Appendix MA0208—MA0241, # 20 Appendix MA0242—MA0245, # 21 Appendix MA0246—MA0249, # 22 Appendix MA0250—MA0252, # 23 Appendix MA0253—MA0265, # 24 Appendix MA0266—MA0281, # 25 Appendix MA0282—MA0312, # 26 Appendix MA0313—MA0359, # 27 Appendix MA0360—MA0365, # 28 Appendix MA0366, # 29 Appendix MA0367—MA0400, # 30 Appendix MA0401—MA0474, # 31 Appendix MA0475—MA0483, # 32 Certificate)(Rogowski, Patricia) (Entered: Jul. 7, 2010).

Redacted Version of 190 Appendix by MEMC Electronic Materials Inc.. (Attachments: 1 Appendix MA0484—MA0489, # 2 Appendix MA0490—MA0515, # 3 Appendix MA0516—MA0534, # 4 Appendix MA535—MA0541, # 5 Appendix MA0542—MA0550, # 6 Appendix MA0551—MA0561, # 7 Appendix MA0562—MA0564, # 8 Appendix MA0565—MA0569, # 9 Appendix MA0570—MA0574, # 10 Appendix MA0575—MA0576, # 11 Appendix MA0577—M0601, # 12 Appendix MA0602—MA0603, # 13 Appendix M0604—M0605, # 14 Appendix MA0606—MA0609, # 15 Appendix MA0610—MA0612, # 16 Appendix MA0613—MA0625, # 17 Appendix MA0626—MA0628, # 18 Appendix MA0629—MA0630, # 19 Appendix MA0631—MA0653, # 20 Appendix MA0654—MA0685, # 21 Appendix MA0686—MA0701, # 22 Appendix MA0702—MA0732, # 23 Appendix MA0733—MA0742, # 24 Appendix MA0743—MA0750, # 25 Appendix MA0751—MA0766, # 26 Appendix MA0767—MA0772, # 27 Appendix MA0773—MA0780, # 28 Appendix MA0781—MA0807, # 29 Appendix MA0808—MA0824, # 30 Appendix MA0825—MA0831.1, # 31 Appendix MA0832—MA0838, # 32 Appendix MA0839—MA0844, # 33 Appendix MA0845—MA0858, # 34 Appendix MA0859—MA0868, # 35 Appendix MA0869—MA0877, # 36 Appendix MA0878—M0884, # 37 Appendix MA0885—M0887, # 38 Appendix MA0888—MA0891, # 39 Appendix MA0892—MA0909, # 40 Appendix MA0910—MA0931, # 41 Certificate of Service)(Rogowiski, Patricia) (Entered: Jul. 7, 2010).

Redacted Version of 198 Opening Brief in Support,, *SOITEC/CEA Parties' Opening Brief in Support of Motion for Summary Judgment: Non-Infringement* by Commissariat a LEnergie Atomique, SOITEC Silicon On Insulator Technologies SA, SOITEC U.S.A., Inc.. (Kraft, Denise) (Entered: Jul. 8, 2010).

Redacted Version of 197 Sealed Motion for Summary Judgment *SOITEC/CEA Parties' Motion for Summary Judgment: Non-Infringement (Filed under Seal)*Sealed Motion for Summary Judgment *SOITEC/CEA Parties' Motion for Summary Judgment: Non-Infringement (Filed under Seal) SOITEC/CEA Parties' Motion for Summary Judgment: Non-Infringement* by Commissariat al LEnergie Atomique, SOITEC Silicon On Insulator Technologies SA, SOITEC U.S.A., Inc.. (Kraft, Denise) (Entered: Jul. 8, 2010).

Redacted Version of 192 Appendix, *Plaintiffs' Omnibus Appendix to Daubert Motion and Motions for Partial Summary Judgment filed on Jul. 2, 2010—vol. VI of XIX* by Commissariat a LEnergie Atomique, SOITEC Silicon On Insulator Technologies SA, SOITEC U.S.A., Inc.. (Kraft, Denise) (Entered: Jul. 9, 2010).

Redacted Version of 193 Appendix, *Plaintiffs' Omnibus Appendix to Daubert Motion and Motions for Partial Summary Judgment filed on Jul. 2, 2010—vol. VIII of XIX* by commissariat a LEnergie Atomique, SOITEC Silicon On Insulator Technologies SA, SOITEC U.S.A., Inc.. (Kraft, Denise) (Entered: Jul. 9, 2010).

Redacted Version of 194 Appendix, *Plaintiffs' Omnibus Appendix to Daubert Motion and Motion for Partial Summary Judgment Filed on Jul. 2, 2010—vol. X of XIX* by Commissariat a LEnergie Atomique, SOITEC Silicon On Insulator Technologies SA, SOITEC U.S.A., Inc.. (Kraft, Denise) (Entered: Jul. 9, 2010).

Redacted Version of 195 Appendix, *Plaintiffs' Omnibus Appendix to Daubert Motion and Motions for Partial Summary Judgment filed on Jul. 2, 2010—vol. XVII of XIX* by Commissariat a LEnergie Atomique, SOITEC Silicon On Insulator Technologies SA, SOITEC U.S.A., Inc.. (Kraft, Denise) (Entered: Jul. 9, 2010).

Redacted Version of 196 Appendix, *Plaintiffs' Omnibus Appendix to Daubert Motion and Motions for Partial Summary Judgment filed on Jul. 2, 2010—vol. XIX of XIX* by Commissariat a LEnergie Atomique, SOITEC Silicon On Insulator Technologies SA, SOITEC U.S.A., Inc.. (Kraft, Denise) (Entered: Jul. 9, 2010).

Claim Construction Answering Brief re 168 Claim Construction Opening Brief, filed by MEMC Electronic Materials Inc..(Attachments: # 1 Certificate of Service)(Rogowski, Patricia) (Entered: Jul. 9, 2010).

Appendix re 228 Claim Construction Answering Brief by MEMC Electronic Materials Inc.. (Attachments: # 1 Appendix DA0782_DA0783, # 2 Appendix DA0784—DA0785, # 3 Appendix DA0786, # 4 Appendix DA0787—DA0810, # 5 Appendix DA0811—DA0834, # 6 Appendix DA0835—DA0845, # 7 Appendix DA0846—DA0855, # 8 Certificate of Service)(Rogowski, Patricia) (Entered: Jul. 9, 2010).

Claim Construction Answering Brief re 168 Claim Construction Opening Brief, 228 Claim Construction Answering Brief *Plaintiffs S.O.I.TEC On Insulator Technologies, S.A. and Commissariat A Energie Atomique's Answering Claim Construction Brief* filed by Commissariat a LEnergie Atomique, SOITEC Silicon On Insulator Technologies SA, SOITEC U.S.A., Inc..(Attachments: # 1 Certificiate on Service)(Kraft, Denise) (Entered: Jul. 9, 2010).

Appendix re 230 Claim Construction Answering Brief, *Appendix to Plaintiffs S.O.I.TEC On Insulator Technologies, S.A. and Commissariat A Energie Atomique's Answering Claim Construction Brief* by Commissariat a LEnergie Atomique, SOITEC Silicon On Insulator Technologies SA. (Attachments: # 1 Certificate of Service)(Kraft, Denise) (Entered: Jul. 9, 2010).

Redacted Verion of 183 Appendix, *Joint Appendix of Exhibits to Opening and Answering Claim Construction Briefs vol. IV of VI* by Commissariat a LEnergie Atomique, SOITEC Silicon On Insulator Technologies SA. (Kraft, Denise) (Entered: Jul. 12, 2010).

Redacted Version of 170 Exhibit to a Document, *Exhibit A to Declaration of Marcus T. Hall in Support of Plaintiffs S.O.I.TEC Silicon on Insulator Technologies, S.A. and Commissariat a L'Energie Atomique's Opening Claim Construction Brief* by Commissariat a LEnergie Atomique, SOITEC Silicon On Insulator Technologies SA. (Kraft, Denise) (Entered: Jul. 12, 2010).

Redacted Version of 171 Exhibit to a Document, *Exhibit B to Declaration of Marcus T. Hall in Support of Plaintiffs S.O.I.TEC Silicon on Insulator Technologies, S.A. and Commissariat a L'Energie Atomique's Opening Claim Construction Brief* by Commissariat a LEnergie Atomique, SOITEC Silicon On Insulator Technologies SA. (Kraft, Denise) (Entered: Jul. 12, 2010).

Redacted Version of 172 Exhibit to a Document, *Exhibit C to Declaration of Marcus T. Hall in Support of Plaintiffs S.O.I.TEC Silicon on Insulator Technologies, S.A. and Commissariat a L'Energie Atomique's Opening Claim Construction Brief* by Commissariat a LEnergie Atomique, SOITEC Silicon On Insulator Technologies SA. (Kraft, Denise) (Entered: Jul. 12, 2010).

Letter to The Honorable Sue L. Robinson from Denise Seastone Kraft, Esq. regarding Courtesy CD-ROM copies of: (1) Plaintiffs' Answering Claim Construction Brief and Appendix; and (2) Plaintiffs' Daubert Motion; Plaintiffs' Motions for Partial Summary Judgment; and Plaintiffs' Omnibus Appendix to Daubert Motion and Motions for Partial Summary Judgment. (Kraft, Denise) (Entered: Jul. 12, 2010).

Notice of Service of Re-Notice of Deposition of Dr. Peter Moran on behalf of S.O.I.TEC Silicon on Insulator Technologies, S.A., Commissariat a L'Energie Atomique, and SOITEC U.S.A., Inc. by Commissariat a LEnergie Atomique, SOITEC Silicon On Insulator Technologies SA, SOITEC U.S.A., Inc.. (Attachments: # 1 Certificate of Service)(Kraft, Denise) (Entered: Jul. 13, 2010).

Fourth Stipulation to Amend Scheduling Order re 26 Scheduling Order,,, by MEMC Electronic Materials Inc.. (Rogowski, Patricia) (Entered: Jul. 15, 2010).

Answering Brief in Opposition re 186 Motion in Liminie *SOITEC/CEA Parties' Motion to Exclude the Expert Report of Dr. Pascal Bellon and any Related Testimony* filed by MEMC Electronic Materials Inc..Reply Brief due date per Local Rules is Jul. 29, 2010. (Rogowski, Patricia) (Entered: Jul. 19, 2010).

Sealed Appendix re 239 Answering Brief in Opposition, by MEMC Electronic Materials Inc.. (Attachments: # Table of Contents, # 2 Certificate of Service)(Rogowski, Patricia) (Entered: Jul. 19, 2010).

Sealed Answering Brief in Opposition re 213 Motion for Partial Summary Judgment *That the Best Mode Requirement is Satisfied for the Claims of the '009 and '096 Patents* filed by MEMC Electronic Materials Inc..Reply Brief due date per Local Rules is Jul. 29, 2010. (Rogowski, Patricia) (Entered: Jul. 19, 2010).
Answering Brief in Opposition re 208 Motion for Partial Summary Judgment *Plaintiffs' Motion for Partial Summary Judgment that the Bruel Patent does not Anticipate the Aspar Patents* filed by MEMC Electronic Materials Inc..Reply Brief due date per Local Rules is Jul. 29, 2010. (Rogowski, Patricia) (Entered: Jul. 19, 2010).
Answering Brief in Opposition re 202 Motion for Partial Summary Judgment *SOITEC/CEA Parties Motion for Partial Summary Judgment that the Patents in Suit Satisfy the Written Description Requirement* filed by MEMC Electronic Materials Inc..Reply Brief due date per Local Rules is Jul. 29, 2010. (Rogowski, Patricia) (Entered: Jul. 19, 2010).
Answering Brief in Opposition re 204 Motion for Partial Summary Judgment *Plaintiffs' Motion for Partial Summary Judgment that the Certificate of Correction for the '396 Patent is Valid* filed by MEMC Electronic Materials Inc..Reply Brief due date per Local Rules is Jul. 29, 2010. (Rogowski, Patricia) (Entered: Jul. 19, 2010).
Answering Brief in Opposition re 210 Motion for Partial Summary Judgment *SOITEC's Motion for Partial Summary Judgment of Invalidity of United States Patent No. 5,834,812 for Lack of Enablement* filed by MEMC Electronic Materials Inc..Reply Brief due date per Local Rules is Jul. 29, 2010. (Rogowski, Patricia) (Entered: Jul. 19, 2010).
Answering Brief in Opposition re 212 Motion for Partial Summary Judgment *SOITEC's Motion for Partial Summary Judgment for Invalidity of Asserted Claims of United States Patent No. 5,834,812 in View of Prior Art* filed by MEMC Electronic Materials Inc..Reply Brief due date per Local Rules is Jul. 29, 2010. (Rogowski, Patricia) (Entered: Jul. 19, 2010).
Sealed Answering Brief in Opposition re 187 Motion for Partial Summary Judgement *of Invalidity of the Asserted Aspar patent Claims Plantiffs' Answering Brief in Opposition to Defendant's Motion for Partial summary Judgment of Invalidity of the Asserted Aspar Claims—Filed under Seal* filed by Commissariat a LEnergie Atomique, SOITEC Silicon On Insulator Technologies SA. Reply Brief due date per Local Rules is Jul. 29, 2010. (Attachments: # 1 Certificate of Service)(Kraft, Denise) (Entered: Jul. 19, 2010).
Appendix re 247 Answering Brief in Opposition,, *Appendix to Plaintiffs' Answering Brief in Opposition to Defendant's Motion for Partial Summary Judgment of Invalidity of the Asserted Aspar Claims (PA-1103—PA-1156)* by Commissariat a LEnergie Atomique, SOITEC Silicon On Insulator Technologies SA. (Attachments: # 1 Exhibit PA-1103—PA-1109—Filed Under Seal, # 2 Exhibit PA-1110—PA-1118—Filed Under Seal, # 3 Exhibit PA-1119—PA-1130—Filed Under Seal, # 4 Exhibit PA-1131—PA-1143—Filed Under Seal, # 5 Exhibit PA-1144—PA-1156, # 6 Certificate of Service)(Kraft, Denise) (Entered: Jul. 19, 2010).
Sealed Answering Brief in Opposition re 197 Sealed Motion for Summary Judgment *SOITEC/CEA Parties' Motion for Summary Judgment: Non-Infringement (Filed under Seal)*Sealed Motion for Summary Judgment *SOITEC/CEA Parties' Motion for Summary Judgment: Non-Infringement (Filed under Seal)* filed by MEMC Electronic Materials Inc..Reply Bried due date per Local Rules is Jul. 29, 2010. (Rogowski, Patricia) (Entered: Jul. 19, 2010).
Sealed Answering Brief in Opposition re 199 Motion for Summary Judgment *of Non-Infringement Soitec's Brief in Opposition to Defendant's Motion for Summary Judgment on Non Infringement* filed by Commissariat a LEnergie Atomique, SOITEC Silicon On Insulator Technologies SA.Reply Brief due date per Local Rules is Jul. 29, 2010. (Attachments: # 1 Certificate of Service)(Kraft, Denise) (Entered: Jul. 19, 2010).
Sealed Appendix re 250 Answering Brief in Opposition, *Appendix to Plaintiffs' Answering Brief in Opposition to Defendant's Motion for Summary Judgment of Non-Infringement* by Commissariat a LEnergie Atomique, SOITEC Silicon On Insulator Technologies SA. (Attachments: # 1 Exhibit PA-1157—PA-1159 Filed under Seal, # 2 Exhibit PA-1160—PA-1165 Filed under Seal, # 3 Exhibit PA-1166—PA-1168 Filed under Seal, # 4 Exhibit PA-1169—PA-1185 Filed under Seal, # 5 Exhibit PA-1186—PA-1189) (Kraft, Denise) (Entered: Jul. 19, 2010).
Appendix re 250 Answering Brief in Opposition, *Appendix to Plaintiffs' Answering Brief in Opposition to Defendant's Motion for Summary Judgment of Non-Infringement* by Commissariat a LEnergie Atomique, SOITEC Silicon On Insulator Technologies SA. (Attachments: # 1 Exhibit PA-1190—PA-1191, # 2 Certificate of Service)(Kraft, Denise) (Entered: Jul. 19, 2010).
Sealed Answering Brief in Opposition re 206 Motion for Partial Summary Judgment *SOITEC/CEA Parties' Motion for Partial Summary Judgment that the Aspar Patents are not Invalid for Inequitable conduct* filed by MEMC Electronic Materials Inc..Reply Brief due date per Local Rules is Jul. 29, 2010. (Rogowski, Patricia) (Entered: Jul. 19, 2010); Correcting Entry: Docket clerk deleted sealed exhibits 1-4 attached to D.I. 248 due to documents being filed improperly. Counsel is advised that sealed and public documents may not be filed together and to re-file documents using the Exhibit to a document event code indicating that documents are under seal. (lid) (Entered: Jul. 20, 2010).
Sealed Appendix re 247 Answering Brief in Opposition,, *Appendix to Plaintiffs' Answering Brief in Opposition to Defendant's Motion for Partial summary Judgment of Invalidity of the Asserted Aspar Claims (PA-1103—PA-1143 Filed under Seal)* by Commissariat a LEnergie Atomique, SOITEC Silicon On Insulator Technologies SA. (Attachments: # 1 Exhibit PA-1103—PA-1109 Filed under Seal, # 2 Exhibit PA-1110—PA-1118 Filed under Seal, # 3 Exhibit PA-1119—PA-1130 Filed under Seal, # 4 Exhibit PA-1131—PA-1143, # 5 Certificate of Service)(Kraft, Denise) (Entered: Jul. 20, 2010).
Notice of Service of Documents Marked MEMC0782013—MEMC0782178 by MEMC Electronic Materials Inc..(Rogowski, Patricia) (Entered: Jul. 21, 2010).
Letter to The Honorable Sue L. Robinson from Denise Seastone Kraft regarding courtesy CD-ROM copies of: (1) Plantiffs Answering Brief in Opposition to Defendants Motion for Partial Summary Judgment of Invalidity of the Asserted Aspar Claims and Appendix; and (2) Soitecs Brief in Opposition to Defendants Motion for Summary Judgment of Non-Infringement and Appendix. (Kraft, Denise) (Entered: Jul. 21, 2010); So ordered- re 238 Stipulation to Amend Scheduling Order. Order- Setting Scheduling Order Deadlines (Reply Brief due Jul. 30, 2010.) (Refer to Stipulation for Details). Signed by Judge Sue L. Robinson on Jul. 22, 2010. (lid) (Entered: Jul. 22, 2010).
Redacted Version of 241 Answering Brief in Opposition, *to Plaintiffs' Motion for Partial Summary Judgment that the Best Mode Requirement is Satisfied for the Claims of the '009 and '396 Patents* by MEMC Electronic Materials Inc.. (Rogowski, Patricia) (Entered: Jul. 26, 2010).
Redacted Version of 249 Answering Brief in Opposition, *to Plaintiffs' Motion for Summary Judgment on the Infringement of U.S. Patent No. 5,834,812* by MEMC Electronic Materials Inc.. (Rogowski, Patricia) (Entered: Jul. 26, 2010).
Redacted Version of 253 Answering Brief in Opposition, *to Plaintiffs' Motion for Partial Summary Judgment that the Aspar Patents are not Invalid for Inequitable Conduct* by MEMC Electronic Materials Inc.. (Rogowski, Patricia) (Entered: Jul. 26, 2010).
(Document too large to file in pdf format, will file at later date by Express Mail). Redacted Version of 240 Appendix by MEMC Electronic Materials Inc.. (Attachments: # 1 Appendix MA0932—MA0985, # 2 Appendix MA0986—MA1039.22, # 3 Appendix MA1040—MA1144, # 4 Appendix MA1145—MA1200, # 5 Appendix MA1201—MA1265, # 6 Appendix MA1265.1—MA1338, # 7 Appendix MA1339—MA1547, # 8 Appendix MA1548—MA1627, # 9 Appendix MA1628—MA1693, # 10 Appendix MA1694—MA1953, # 11 Appendix MA1954—MA2127, # 12 Appendix MA2128—MA2206, # 13 Appendix MA2207—MA2253, # 14 Appendix MA2254—MA2273, # 15 Appendix MA2274—MA2333, # 16 Appendix MA2334—MA2337, # 17 Appendix MA2338—MA2342, # 18 Appendix MA2343—MA2346, # 19 Appendix MA2347—M2351, # Certificate of Service)(Rogowski, Patricia) (Entered: Jul. 26, 2010).
Sealed Answering Brief in Opposition re 213 Motion for Partial Summary Judgment *that the Best Mode Requirement is Satisfied for* the Claims of the '009 and '396 Patents Corrected Version of D.I. 241 filed by MEMC Electronic Materials Inc..Reply Brief due date per Local Rules is Aug. 5, 2010. (Rogowski, Patricia) (Entered: Jul. 26, 2010).

Redacted Version of 261 Answering Brief in Opposition, *to Plaintiffs' Motion for Partial Summary Judgment that the Best Mode Requirement is Satisfied for the Claims of the '009 and '396 Patents (Corrected Version of D.I. 241)* by MEMC Electronic Materials Inc.. (Rogowski, Patricia) (Entered: Jul. 26, 2010).

Redacted Version of 250 Answering Brief in Opposition *to Soitec's Brief in Opposition to Defendant's Motion for Summary Judgment on Non-Infringement* by Commissariat a LEnergie Atomique, SOITEC Silicon On Insulator Technologies SA. (Attachments: # 1 Certificate of Service)(Kraft, Denise) (Entered: Jul. 26, 2010).

Redacted Version of 247 Answering Brief in Opposition,, *to Plaintiffs' Answering Brief in Opposition to Defendant's Motion for Partial Summary Judgment of In validity of the Asserted Aspar Claims* by Commissariat a LEnergie Atomique, SOITEC Silicon On Insulator Technologies SA. (Attachments: # 1 Certificate of Service)(Kraft, Denise) (Entered: Jul. 26, 2010).

Redacted Version of 254 Appendix,, *to Appendix to Plaintiffs' Answering Brief in Opposition to Defendant's Motion for Partial summary Judgment of Invalidity of the Asserted Aspar Claims* (PA-1103—PA-1143 by Commissariat a LEnergie Atomique, SOITEC Silicon On Insulator Technologies SA. (Kraft, Denise) (Entered: Jul. 26, 2010).

Redacted Version of 251 Appendix,, *to Appendix to Plaintiffs' Answering Brief in Opposition to Defendant's Motion for Summary Judgment of Non-Infringement* by Commissariat a LEnergie Atomique, SOITEC Silicon On Insulator Technologies SA. (Kraft, Denise) (Entered: Jul. 26, 2010).

Sealed Reply Brief re 187 Motion for Partial summary Judgment *of Invalidity of the Asserted Aspar Patent Claims* filed by MEMC Electronic Materials Inc.. (Attachments: # 1 Certificate of Service)(Rogowski, Patricia) (Entered: Jul. 30, 2010).

Reply Brief re 204 Motion for Partial Summary Judgment *Plaintiffs' Motion for Partial Summary Judgment that the Certificate of correction for the '396 Patent is Valid Reply Brief in Support of Plaintiffs' Motion for Partial Summary Judgment that the Certificate of Correction for the '396 Patent is Valid* filed by commissariat a LEnergie Atomique, SOITEC Silicon On Insulator Technologies SA. (Attachments: # 1 Certificate of Service)(Kraft, Denise) (Entered: Jul. 30, 2010).

Sealed Appendix re 267 Reply Brief *in Support of MEMC's Motion for Partial Summary Judgment of Invalidity of the Asserted Aspar Patent Claims* by MEMC Electronic Materials Inc.. (Attachments: # 1 Table of Contents, # 2 Certificate of Service)(Rogowski, Patricia) (Entered: Jul. 30, 2010).

Declaration re 268 Reply Brief, *Declaration of Marcus T. Hall in Support of Reply Brief in Support of Plaintiffs' Motion for Partial Summary Judgment that the Certificate of Correction for the '396 patent is Valid* by Commissariat a LEnergie Atomique, SOITEC Silicon On Insulator Technolgies SA. (Attachments: # 1 Exhibit A, # 2 Certificate of Service)(Kraft, Denise) (Entered: Jul. 30, 2010).

Sealed Reply Brief re 199 Motion for Summary Judgment *of Non-Infrigement* filed by MEMC Electronic Materials Inc.. (Attachments: # 1 Certificiate of Service)(Rogowski, Patricia) (Entered: Jul. 30, 2010).

Appendix re 268 Reply Brief, *Omnibus Appendix to Plaintiffs' Reply Briefs in Support of Plantiffs' Daubert Motion and Motions for Partial summary Judgment* (PA-1192—PA-1261) by Commissariat a LEnergie Atomique, SOITEC Silicon On Insulator Technologies SA. (Attachments: # 1 Exhibit PA-1199—PA-1204, # 2 Exhibit PA-1205—PA1206, # 3 Exhibit PA-1206.1, # 4 Exhibit PA-1231—PA-1237, # 5 Exhibit PA-1238—PA-1245, # 6 Exhibit PA-1246—PA-1257, # 7 Exhibit PA-1258—PA-1261, # 8 Certificate of Service)(Kraft, Denise) (Entered: Jul. 30, 2010).

Sealed Appendix re 271 Reply Brief *in Support of MEMC's Motion for Summary Judgment of Non-Infringement* by MEMC Electronic Materials Inc.. (Attachments: # 1 Table of Contents, # 2 Certificate of Service)(Rogowski, Patricia) (Entered: Jul. 30, 2010).

Sealed Appendix re 272 Appendix,, *Omnibus Appendix to Plaintiffs' Reply Briefs in Support of Plaintiffs' Daubert Motion and Motions for Partial Summary Judgment* (PA-1192—PA-1198 and PA-1207—PA-1230 Filed Under Seal) by Commissariat a LEnergie Atomique, SOITEC Silicon On Insulator Technologies SA. (Attachments: # 1 Exhibit PA-1192—PA-1198 (Filed under Seal), # 2 Exhibit PA-1207—PA-1217 (Filed under Seal) # 3 Exhibit PA-1218—Pa-1230 (Filed under Seal), # 4 Certificate of Service)(Kraft, Denise) (Entered: Jul. 30, 2010).

Reply Brief re 210 Motion for Partial Summary Judgment *SOITEC's Motion for Partial Summary Judgment of Invalidity of United States Patent No. 5,834,812 for Lack of Enablement Reply Brief in Support of SOITEC's Motion for Partial Summary Judgment of Invalidity of United States Patent No. 5,834,812 for Lack of Enablement* filed by SOITEC Silicon On Insulator Technologies SA, SOITEC U.S.A., Inc..(Attachments: # 1 Certificate of Service)(Kraft, Denise) (Entered: Jul. 30, 2010).

Reply Brief re 212 Motion for Partial Summary Judgment *SOITEC's Motion for Partial Summary Judgment for Invalidity of Asserted Claims of United States Patent No. 5,834,812 in View of Prior Art Reply Brief in Support of SOITEC's Motion for partial Summary Judgment for Invalidity of Asserted Claims of United States Patent No. 5,834,812 in View of Prior Art* filed by SOITEC Silicon On Insulator Technologies SA, SOITEC U.S.A., Inc.. (Attachments: # 1 Exhibit A, # 2 Exhibit B, # 3 Certificate of Service)(Kraft, Denise) (Entered: Jul. 30, 2010).

Reply Brief re 186 Motion in Limine *SOITEC/CEA Parties' Motion to Exclude the Expert Report of Dr. Pascal Bellon and any Related Testimony Reply Brief in Suport of SOITEC/CEA Parties' Motion to Exclude the Expert Report of Dr. Pascal Bellon and any Related Testimony* filed by Commissariat a LEnergie Atomique, SOITEC Silicon On Insulator Technologies SA. (Attachments: # 1 Certificate of Service)(Kraft, Denise) (Entered: Jul. 30, 2010).

Sealed Reply Brief re 197 Sealed Motion for Summary Judgment *SOITEC/CEA Parties' Motion for Summary Judgment: Non-Infringement (Filed Under Seal)* Sealed Motion for Summary Judgment *SOITEC/CEA Parties' Motion For Summary Judgment: Non-Infringement (Filed Under Seal) Reply Brief in Support of SOITEC/CEA Parties' Motion for Summary Judgment: Non-Infringement (Filed Under Seal)* filed by Commissariat a LEnergie Atomique, SOITEC Silicon On Insulator Technologies SA. (Attachments: # 1 Certificate of Service)(Kraft, Denise) (Entered: Jul. 30, 2010).

Sealed Reply Brief re 213 Motion for Partial Summary Judgment *that the Best Mode Requirement is Satisfied for the Claims of the '009 and '396 Patents Reply Brief in Support of Plaintiffs' Motion for Partial summary Judgment that the Best Mode Requirement is Satisfied for the Claims of the '009 and '396 Patents (Filed under Seal)* filed by Commissariat a LEnergie Atomique, SOITEC Silicon On Insulator Technologies SA. (Attachments: # 1 Certificate of Service)(Kraft, Denise) (Entered: Jul. 30, 2010).

Reply Brief re 202 Motion for Partial summary Judgement *SOITEC/CEA parties Motion for Partial Summary Judgment that the Patents in Suit Satisfy the Written Description Requirement Reply Bried in Support of SOITEC/CEA Parties' Motion for Partial Summary Judgment that the Patents in Suit Satisfy the Written Description Requirement* filed by Commissariat a LEnergie Atomique, SOITEC Silicon On Insulator Technologies SA. (Attachments: # 1 Certificate of Service)(Kraft, Denise) (Entered: Jul. 30, 2010).

Sealed Reply Brief re 208 Motion for Partial Summary Judgment *Plaintiffs' Motion for Partial Summary Judgment that the Bruel patent does not anticipate the Aspar patents Reply Brief in Support of Plaintiffs' Motion for Partial Summary Judgment that the Bruel Patent does not anticipate the Aspar Patents (Filed under Seal)* filed by Commissariat a LEnergie Atomique, SOITEC Silicon On Insulator Technologies SA. (Attachments: # 1 Certificate of Service)(Kraft, Denise) (Entered: Jul. 30, 2010).

Sealed Reply Brief re 206 Motion for Partial Summary Judgment *SOITEC/CEA Parties' Motion for Partial Summary Judgment that the Aspar Patents are not Invalid for Inequitable Conduct Reply Brief in Support of SOITEC/CEA Parties' Motion for Partial Summary Judgment that the Aspar Patents are not Invalid for Inequitable Conduct (Filed under Seal)* filed by Commissariat a LEnergie Atomique, SOITEC Silicon On Insulator Technologies SA, SOITEC U.S.A., Inc.. (Attachments: # 1 Certificate of Service)(Kraft, Denise) (Entered: Jul. 30, 2010).

Letter to The Honorable Sue L. Robinson from Denise Seastone Kraft, Esq. regarding Courtesy CD-ROM copies of Plaintiffs' Reply to Daubert Motion and Motions for Partial Summary Judgment, and Plaintiffs' Omnibus Appendix to the Replies. (Kraft, Denise) (Entered: Aug. 2, 2010).

Redacted version of 269 Appendix To Reply Brief in Support of MEMC's Motion for Partial Summary Judgment of Invalidity of the Asserted Aspar Patent Claims by MEMC Electronic Materials Inc.. (Attachments: # 1 Appendix Table of Contents, # 2 Appendix MA2453_MA2479, # 3 Certificate of Service)(Rogowski, Patricia) (Entered: Aug. 3, 2010).

Redacted version of 273 Appendix Reply Brief in Support of MEMC's Motion for Summary Judgment of Non-Infringement by MEMC Electronic Materials Inc.. (Attachments: # 1 Appendix Table of Contents, # 2 Appendix MA2352—MA2361, # 3 Appendix MA2362—MA2371, # 4 Appendix MA2372—MA2381, # 5 Appendix MA2382—MA2391, # 6 Appendix MA2392—MA2399, # 7 Appendix MA2400—MA2404, # 8 Appendix MA2405—MA2422, # 9 Appendix MA2423—MA2425, # 10 Appendix MA2426—MA2427, # 11 Appendix MA2428—MA2430, # 12 Appendix MA2431—MA2440, # 13 Appendix MA2441—MA2448, # 14 Appendix MA2449—MA2452, # 15 Appendix MA2452.1—MA2452.9, # 16 Certificate of Service)(Rogowski, Patricia) (Entered: Aug. 3, 2010).

Letter to the Honorable Sue L. Robinson from Patricia Smink Rogowski regarding CD-ROM copies of (1) MEMC's Claim Construction Briefing, (2) MEMC's Briefs in Support of MEMC's Motion for Summary Judgment, and (3) MEMC's Briefs in Opposition to Soitec's Summary Judgment Motions. (Rogowski, Patricia) (Entered: Aug. 3, 2010).

Redacted version of 267 Reply Brief in Support of MEMC's Motion for Partial Summary Judgment of Invalidity of the Asserted Aspar Patent Claims by MEMC Electronic Materials Inc.. (Rogowski, Patricia) (Entered: Aug. 3, 2010).

Redacted version of 271 Reply Brief in Support of MEMC's Motion for Summary Judgment of Non-Infringement by MEMC Electronic Materials Inc.. (Rogowski, Patricia) (Entered: Aug. 3, 2010).

* cited by examiner

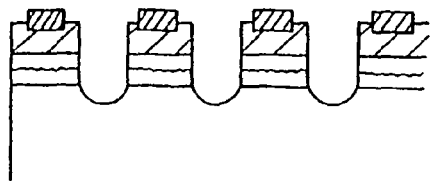
Fig.16
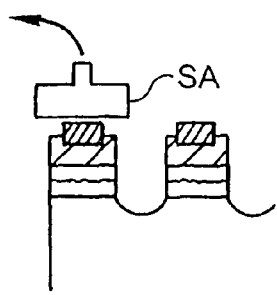
Fig.17
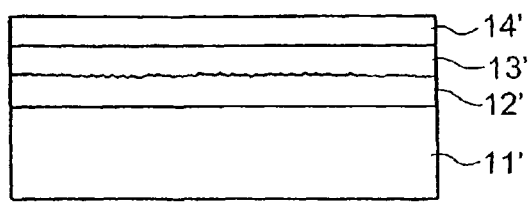
Fig.18
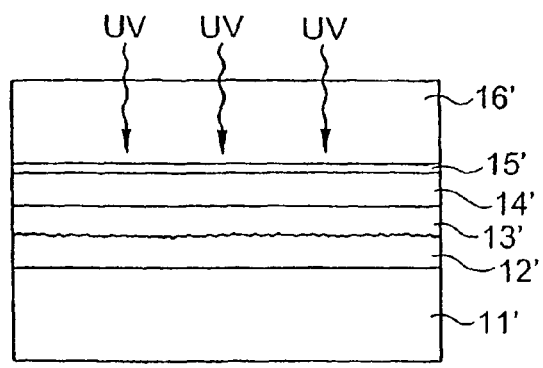
Fig.19
Fig.20
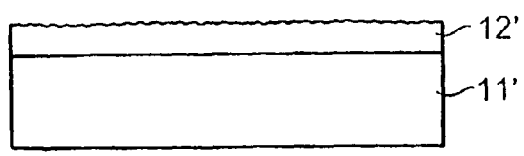
Fig.21
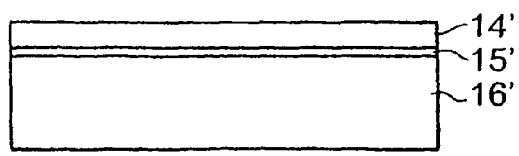

DETACHABLE SUBSTRATE WITH CONTROLLED MECHANICAL STRENGTH AND METHOD OF PRODUCING SAME

FIELD OF THE INVENTION

This application claims priority to French Patent Application No. 0105130 filed Apr. 13, 2001.

The invention relates to a method of assembling two microelectronic wafers and the resulting structure. It finds applications in the fabrication of thin layer substrates and in transferring layers or components onto supports of any kind.

DESCRIPTION OF THE PRIOR ART

Increasingly, components must be integrated onto supports different from those used to produce them.

Components on plastics material substrates or on flexible substrates may be cited, for example. By component is meant any micro-electronic, opto-electronic or sensor (for example chemical, mechanical, thermal, biological or biochemical sensor) device that is completely or partly "processed", i.e. completely or partly produced.

A layer transfer method can be used to integrate the components onto flexible supports.

There are many other examples of applications in which layer transfer techniques can provide a suitable solution for integrating components or layers onto a support that is a priori different from that used for their production. In the same line of thinking, layer transfer techniques are also very useful when it is required to isolate a thin layer, with or without components, from its original substrate, for example by separating or eliminating the latter. Still in the same line of thinking, turning over a thin layer and transferring it onto another support provides engineers with valuable freedom to design structures that would otherwise be impossible. Sampling and turning over thin films can be used to produce buried structures, for example, such as buried capacitors for dynamic random access memory (DRAM) where, in contradistinction to the usual situation, the capacitors are formed first and then transferred onto another silicon substrate before fabricating the remainder of the circuits on the new substrate. Another example relates to the production of transistor structures referred to as double gate structures. The first gate of the CMOS transistor is produced on a substrate using a conventional technology and then turned over and transferred to a second substrate to produce the second gate and finish the transistor, thereby leaving the first gate buried in the structure (see, for example, K. Suzuki, T. Tanaka, Y. Tosaka, H. Horie and T. Sugii, "High-Speed and Low-Power n+-p+ Double-Gate SOI CMOS", IEICE Trans. Electron., vol. E78-C, 1995, pp. 360-367).

The requirement to isolate a thin layer from its original substrate is encountered in the field of light-emitting diodes (LED), for example, for instance as reported in the documents W. S Wong et al., Journal of Electronic MATERIALS, page 1409, Vol. 28, No 12, 1999 and I. Pollentier et al., page 1056, SPIE Vol. 1361 Physical Concepts of Materials for Novel Opto-electronic Device Applications I (1990). One of the objects here is to improve the control of extraction of the emitted light. Another object relates to the fact that in this particular example the sapphire substrate used to produce the epitaxial stack is a posteriori bulky, in particular because it is electrically insulative, which prevents making electrical contacts. To be able to remove afterwards the sapphire substrate, which was advantageous for the phase of growing the material, would thus appear to be desirable.

An identical situation is encountered in the field of applications to telecommunications and microwaves, for example. In this situation, it is preferable for the components to be finally integrated onto a support having a high resistivity, typically at least several kohms.cm. However, a highly resistive substrate is not necessarily available at the same cost and with the same quality as the standard substrates usually employed. In the case of silicon, 200 and 300 mm silicon wafers of standard resistivity are available, whereas for resistivities greater than 1 kohm.cm, there is very little on offer in the 200 mm size and nothing at all in the 300 mm size. One solution consists in producing the components on an original structure including a standard substrate (for example of p-type silicon having a resistivity from 14 to 22 ohm.cm) and then, during the final process steps, transferring a thin layer containing the components onto a glass, quartz, sapphire, etc. insulative substrate.

From a technical point of view, the major benefit of these transfer operations is to decorrelate the properties of the layer in which the components are formed and those of the final support, and they are consequently beneficial in many other situations.

There may also be cited situations in which the original substrate that is beneficial for the production of the components is excessively costly. In the case of silicon carbide, for example, offering improved performance (higher temperatures of use, significantly improved maximum powers and frequencies of use, etc.), but whose cost compared to silicon is very high, it would be beneficial to transfer a thin layer of the costly original substrate (in this instance silicon carbide) onto the inexpensive final substrate (here silicon), and to recover the remainder of the costly original substrate for re-use, possibly after a recycling operation. The transfer operation can be carried out before, during or after the production of the components.

The above techniques can also prove beneficial in all fields in which obtaining a thin final substrate is important for the final application. Power applications in particular may be cited, whether for reasons associated with the evacuation of heat or because in some cases the current must flow through the thickness of the substrates with losses that are to a first approximation proportional to the thickness through which the current passes. Smart card applications for which a thin substrate is required for reasons of flexibility may also be cited. For these applications, the circuits are produced on thick or standard thickness original substrates, which has the advantage, firstly, of good mechanical resistance to the various process steps, and, secondly, of conforming to standards with regard to their use on certain production equipment. The final thinning is then achieved by detachment. This detachment can be accompanied by transfer to another support. In some cases the transfer to another support is not indispensable, especially if the final thickness aimed at during thinning is sufficient to produce self-supporting structures.

Various techniques can be used to transfer layers from one support to another. In some cases, the assembly of the layer and the support can be temporary. This is the case, for example, when using for the thin layer transfer handle substrates whose function is to provide a guaranteed hold during the transfer or during various treatments to which the layer is subjected before the transfer. On this subject see the document by T. Hamagushi et al., IEDM 1985, p. 688-691. A problem then arises in choosing the means employed to assemble the layer and the substrate. The adhesion means must in particular be sufficiently strong to fulfill their role and in particular to resist the stresses imposed by the treatments applied to the portion to be transferred. Also, it must be possible to separate the assembly in order to free the layer to be transferred. There are additional stresses (thermal, mechanical, etc.) on the adhesion means when components (micro-electronic, opto-electronic, mechanical, piezoelectric, superconductor, or magnetic components) must be produced completely or in part before transferring the thin layer when that layer is fastened to the handle substrate. The adhesion means must therefore be both strong to provide the assembly between the thin layer and the handle substrate, even during the component fabrication processes, and at the same time reversible to enable the final detachment of the handle substrate.

More generally, the problem that arises is that of assembling a wafer with another wafer, which wafers can be substrates, thin layers, or sufficiently thick to be self-supporting, composite or otherwise, composed of at least one or more semiconductor materials, partly, completely processed or unprocessed, the assembly having to be separated thereafter at the assembly interface. Before detachment, it must have been possible to produce components completely or partly on at least one of the two wafers or to carry out a step of epitaxial growth.

Various solutions have been envisaged.

The first solution consists in eliminating the support wafer by abrasion, but in this case the wafer is consumed (destroyed during the process). This is also the case if an etch stop layer is provided between the two wafers: the support wafer is consumed by a combination of abrasion and etching.

Other methods, based on the "lift-off" principle, also separate a thin layer previously bonded to an original support, again without the latter necessarily being consumed. These methods generally use selective chemical etching of a buried intermediate layer, possibly associated with mechanical forces. This type of method is very widely used to transfer III-V elements to different types of support (see C. Camperi et al., IEEE Transactions on photonics technology, vol. 3, 12 (1991), 1123). As explained in the paper by P. Demeester et al., Semicond. Sci. Technol. 8 (1993), 1124-1135, the transfer, which generally takes place after an epitaxial growth step, can be carried out before or after the production of the components (by "post-processing" or "pre-processing", respectively). However, these techniques based on lifting off depend on the fact that it is difficult to obtain lift-off on a lateral scale exceeding 1 mm.

Another situation consists in exploiting the presence of a buried oxide in the case of a silicon on insulator (SOI) structure, however standard the latter may otherwise be (i.e. produced without seeking any particular detachability effect). If the structure is bonded sufficiently strongly to another substrate and a high stress is applied to the structure, uncontrolled fracture, preferentially achieved in the oxide, can lead to a cutting effect on the scale of the entire substrate. The document "PHILIPS Journal of Research", vol. 49, No 1/2, 1995, shows an example of this on pages 53 to 55. Unfortunately, the fracture is difficult to control and necessitates high mechanical stresses to bring it about, which is not free of the risk of breaking of the substrate or damaging the components.

The document EP0703609 A1 discloses transferring a layer onto a final substrate by controlling the bonding energies. However, in the above document, there is a first bonding energy between a thin layer and a first substrate. The bonding energy of the adherent constant between the layer and the second substrate, the target substrate, or the manipulator is then controlled so that it is greater than the first bonding energy, between the layer and the first substrate.

The techniques used to increase a bonding energy between two wafers are widely known. They are used in the situations cited previously, but also in other situations. There is the production of SOI structures, for example.

If SOI structures are to be obtained, the surface preparation operations are intended finally to provide, and often with the aid of annealing carried out after bonding, high bonding energies typically from 1 to 2 $J/m^2$. Conventionally, in the case of SiO2/SiO2 bonding with standard preparation operations, the bonding energy of the structure is a few tens of $mJ/M^2$ at room temperature and 500 $mJ/m^2$ after annealing at 400° C. for 30 minutes, (bonding energy determined by the blade method developed by Maszara (see: Maszara et al., J. Appl. Phys., 64 (10), p. 4943, 1988)). When the structure is annealed at a high temperature (1 100° C.), the bonding energy is generally of the order of 2 $J/m^2$ (C. Maleville et al., Semiconductor wafer bonding, Science Technology and Application IV, PV 97-36, 46, The Electrochemical Society Proceedings Series, Pennington, N.J. (1998)). Other forms of preparation prior to bonding exist, for example exposure of the surfaces to be bonded to a plasma (for example an oxygen plasma), and can yield equivalent bonding energies without always necessitating such annealing (Y A, Li and R. W. Bower, Jpn. J: Appl. Phys., vol. 37, p. 737, 1998). Sealing with energies of this magnitude is incompatible with detachment.

Some variants are known as bonded SOI (BSOI) and bond and etch back SOI (BESOI). In addition to molecular adhesion bonding, these variants are based on physical removal of the original substrate by polishing techniques and/or chemical etching techniques. In this case the substrate is consumed.

The inventors have shown that by modifying the hydrophilic properties and the roughness of the surfaces, different mechanical strengths can be obtained, greater than or less than the mechanical strengths conventionally obtained. For example, as indicated in the paper by O. Rayssac et al. (Proceedings of the 2nd International Conference on Materials for Micro-electronics, IOM Communications, p. 183, 1998), hydrofluoric acid etching increases the roughness of a silicon oxide layer. The paper states that an 8 000 Å rms etch increases the roughness by approximately 0.2 nm to 0.625 nm. It has been verified that $SiO_2/SiO_2$ bonding with an rms roughnesses of 0.625 nm and 0.625 nm for the facing surfaces yields a maximum bonding energy value of the order of 500 $mJ/m^2$ after annealing at 1 100° C., i.e. much lower than in the standard situation.

SUMMARY

The invention therefore consists in a technique of assembling by molecular adhesion bonding two wafers, the resulting structure being intended to be separated at the assembly interface. The detachment or lifting off of the structure is generally carried out after components or sensors have been completely or partly produced on the layer or after a step of epitaxial growth on one of the wafers.

The invention also consists in a structure comprising two wafers joined together by an interface or an intermediate layer having a level of mechanical strength that is easy to control, so that said structure is compatible with the complete or partial production of components (for example the deposition of an epitaxial stack), but also so that said structure can be separated. The literature generally refers to such structures as "detachable structures" or "detachable substrates".

To this end the invention proposes to produce an interface by molecular adhesion bonding of one face of one wafer and one face of another wafer, with a prior treatment step applied to at least one of the faces to bonded to control the level of mechanical strength of the interface. The molecular adhesion bonding can be carried out with or without an intermediate layer (oxide, nitride).

In a situation corresponding rather to detachment at the levels of portions of the wafer (dies, components or sets and subsets of dies, etc.), the preparation of the wafer preferably includes a step whereby at least one fragment of said layer is delimited before the detachment step.

To control the mechanical strength of the interface, a step of preparing at least one of the two faces to be assembled is necessary in order to control the roughness and/or the hydrophilic properties thereof.

To prepare the surface by controlling the roughness, in the case of $SiO_2$ surfaces, for example, hydrofluoric acid etching can be used. Other chemical treatments are possible, of course, as a function of the nature of the material to be etched.

To produce a detachable substrate of the SOI type, the examples of $SiO_2/SiO_2$ and $Si/SiO_2$ bonding are considered. In the case of layers of different kinds ($Si_3N_4$ is another conventional example, but there are also the silicides), it suffices to use suitable chemical treatment (for example $H_3PO_4$ or HF for $Si_3N_4$, by analogy with $NH_4OH/H_2O_2/H_2O$ (also called SC1) for Si).

The mechanical strength of the interface is modified by treatment, for example heat treatment, to strengthen the interface in a controlled manner, i.e. so that it is compatible with subsequent detachment, by controlling the heat treatment parameters (the treatment time, the temperature, the temperature gradient, etc.). The heat treatments include those associated with the subsequent production of components. The faces treated in this way can then be molecular adhesion bonded, with or without an intermediate layer (such as an oxide or nitride layer, for example).

The step of producing the interface is followed by a step of lifting off the two wafers; a step of producing all or part of micro-electronic, opto-electronic, mechanical, pyro-electric, superconductor or magnetic components can be executed after detachment. Between the step of producing the interface and the lifting off step, another bonding step can advantageously be executed to create a second interface. This bonding step advantageously includes molecular adhesion bonding or adhesive bonding (for example using an adhesive hardened by UV radiation, a resin, a polymer adhesive). In this case, a lift-off step at the level of the second interface can advantageously be carried out by acid etching and/or application of mechanical stresses and/or thermal and/or photonic stresses. The wafer that has not been processed or transferred can advantageously be used again after lift-off.

The wafers are preferably of semiconductor materials preferably chosen from Si, Ge, SiGe, SiC, GaN and other equivalent nitrides, AsGa, InP or ferro-electric or piezo-electric materials ($LiNbO_3$, $LiTaO_3$) or magnetic materials, "processed" or otherwise.

A thin layer can be produced in at least one of the two wafers. The thin layer can be obtained by thinning an original substrate.

Thinning is obtained by planing and/or chemical-mechanical polishing or other polishing and/or chemical etching.

The thin layer can be obtained by cutting.

Cutting is achieved by fracturing a weak buried layer.

The weak buried layer is obtained by implantation and the fracture is obtained by heat and/or mechanical and/or chemical treatment.

The substance implanted is a gas (hydrogen, helium, etc.).

In terms of product, the invention proposes an assembly comprising two wafers joined together at a bonding interface whose mechanical strength is at a controlled level, in particular through controlling the surface roughness and/or the hydrophilic properties.

According to preferred features, possibly in combination:

A thin layer can be produced in at least one of the two wafers.

Said layer is further bonded to a second substrate, advantageously by molecular adhesion bonding or adhesive bonding, for example using an adhesive hardened by UV radiation.

The chemical and/or mechanical strength of the interface or connecting layer is modified selectively using localized or non-uniform treatments (heat treatment, UV exposure, laser irradiation, etc.) to reinforce selectively or to weaken selectively some regions more than others, according to whether it is a question of bonding roughened surfaces, porous materials, buried defects, gaseous or non-gaseous microcavities.

The layer is of semiconductor materials (Si, Ge, SiGe, SiC, GaN and other equivalent nitrides, AsGa, InP, etc.) or ferro-electric or piezo-electric materials ($LiNbO_3$, $LiNbO_3$) or magnetic or superconductor materials (YbaCuO, NbN, etc.), whether "processed" or not.

BRIEF DESCRIPTION OF THE DRAWINGS

Aspects, features and advantages of the invention will emerge from the following description, which is given by way of illustrated and non-limiting example and with reference to the appended drawings, in which:

FIG. 16 is a variant of FIG. 13, after cutting trenches or notches between the components, FIG. 17 is a view thereof showing a component being lifted off, for example after hydrofluoric acid etching, FIG. 18 is a view analogous to FIG. 1, FIG. 19 is a diagrammatic view in section of the FIG. 3 assembly after adhesive bonding of a transparent substrate, FIG. 20 is a view of the upper portion of this assembly after lifting off and polishing, FIG. 21 is a view of the upper portion of this assembly after lifting off and polishing.

DETAILED DESCRIPTION

The preferred examples selected for the detailed description primarily relate to silicon, which is generally available in the form of round substrates, for example of 200 mm diameter. These methods transfer readily to other systems characterized in particular by materials other than silicon, in a non-limiting manner and without departing from the scope of the invention.

Some embodiments of the method according to the invention tend to encourage lifting of the layer off its substrate at the overall level, i.e. on the scale of the whole of the substrate, while others tend to lift off delimited fragments.

Figure 1:
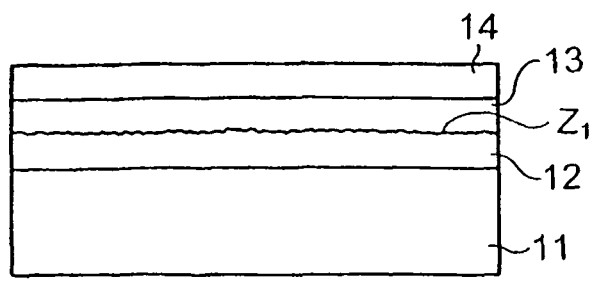
FIG. 1 is a diagrammatic view in section of the combination of a thin layer on a substrate, the interface between the layer and the substrate having a bonding energy.

For producing a detachable SOI substrate, examples of $SiO_2/SiO_2$ and $Si/SiO_2$ bonding are considered. In the case of layers of different kinds ($Si_3N_4$ is another conventional example, but there are also silicides), and by analogy with what is described hereinafter, it suffices to use appropriate chemical treatment (for example $NH_4OH/H_2O_2/H_2O$ (also known as SC1) for Si and $H_3PO_4$ or HF for $Si_3N_4$). FIG. 1 shows the option in which the substrate (11) and the thin layer (14) are of monocrystalline silicon and two intermediate layers (12) and (13) are formed prior to bonding on the substrate (11) and the thin layer (14), respectively. Of course, only one of the two intermediate layers (12) or (13) may suffice, and neither of them may exist (i.e. that of Si/Si bonding). If the intermediate layers (12) and (13) exist and are both of $SiO_2$, the system is referred to as $SiO_2/SiO_2$ bonding. If only one of the two exists, and consists of $SiO_2$, then the system is referred to as $Si/SiO_2$ bonding.

A number of techniques can be employed to produce a structure like that shown in FIG. 1, in addition to specific aspects related to molecular adhesion bonding, including those previously cited, for the production of non-detachable SOI substrates (see Semiconductor Wafer Bonding, Science and Technology, Q. Y. Tong and U. Gösele, Wiley Interscience Publications). Hereinafter the layer (14) is referred to as the active layer, being the layer comprising the components, except for certain special cases in which an additional, for example epitaxial, layer is deposited onto the layer (14). Some variants are known as bonded SOI (BSOI) and bond and etch back SOI (BESOI). In addition to molecular adhesion bonding, these variants are based on physical removal of the original substrate by polishing techniques and/or chemical etching techniques. Other variants, partially described hereinbefore as layer transfer techniques, are based, in addition to molecular adhesion bonding, on detachment by "cutting" along a weakened region, such as the methods described in the documents U.S. Pat. No. 5,374,564 (or EP-A-533551) and U.S. Pat. No. 6,020,252 (or EP-A-807970): detachment along an implanted region, or in the document EP 0925888: detachment by fracture along a buried layer that has been rendered porous.

With reference to specific aspects related to bonding for the production of detachable substrates, in the case of $SiO_2/SiO_2$ (or even $Si/SiO_2$) bonding, the oxide layer can be prepared in several ways (deposition, thermal oxidation of the silicon) and can have a thickness that varies according to the application. For this example, a 1 μm thick thermal oxide is chosen. The following structure is therefore obtained: a silicon substrate covered with 1 μm of oxide.

This is followed by hydrofluoric acid etching to roughen the surface of the oxide, the roughening required increasing with the thickness of oxide removed. For each application, the roughness can be optimized, in particular as a function of the method of producing the components (or of epitaxial growth), which must be used after bonding with no delamination during the production of components and the method adopted for the final detachment. Typically, hydrofluoric acid etching to remove a thickness of oxide of the order of a few tens to a few hundred nanometers is a good starting compromise. The hydrofluoric acid etching increases the roughness of the oxide layer(s) (12) and/or (13). This can be combined with selective wet or dry cleaning to obtain hydrophilic properties specific to the oxide layer. The resulting effect is one of weaker bonding than the standard bonding.

Figure 4:
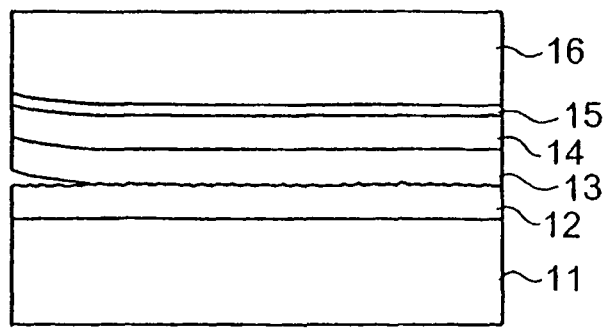
FIG. 4 is a view during a lifting off action at the interface between the thin layer and the first substrate.

Another option for controlling the bonding energy of the detachable interface is to use thermal annealing after the bonding operation. A temperature difference of around 100° in the annealing effected after bonding can, especially in the range of temperatures beyond 800° C., lead to significant variation of the bonding energy. This option can be used in combination with roughening of at least one intermediate layer (12) and/or (13), or on its own (i.e. without any roughening step at all). An option that is highly beneficial, but must not in any way be regarded as limiting on the invention, of implementation for bonding is not to anneal the whole of the structure shown in FIG. 4, or to anneal it at a sufficiently low temperature, preferably a temperature not exceeding that at which the components are to be produced, the epitaxial layer, etc., or for a short time, etc. This alternative is particularly attractive for applications that do not necessitate high temperatures for the production of components and other structures, for applications that do not use mechanical stresses and very aggressive chemical treatment of structures, and for applications that do not necessitate transfer onto a further support after detachment (self-supporting final structures).

Roughening and deposition of oxide have been cited in the situation in which they are carried out on the substrate (11). An alternative is to carry out these operations on the side of the thin layer (14), or even on both sides.

Apart from the production of the detachable substrate itself, using techniques based on molecular bonding, there are several means as to its use and to the means to implement it.

The benefit of the detachable substrate, depending on the thickness of the unprocessed active layer or of the processed active layer (i.e. its thickness when it has been processed to produce all or part of a component), is that it allows detachment of the active layer to obtain either a self-supporting layer (a relatively thick layer, whether the thickness is already present in the detachable substrate as manufactured or obtained during deposition steps subsequent to its fabrication, as is the case in an epitaxial growth step) or a surface layer, which is generally thinner, transferred onto a target support, whether the latter is the final support or merely a temporary support which is itself intended to be detached.

There are various ways to transfer the surface layer to the target substrate.

First of all, transfer can be effected by molecular adhesion bonding of what is to become the thin layer to be transferred to another substrate.

The benefit of detachable substrates is being able at will to "mount" and "demount" thin layers on substrates, allowing, by overturning the layer, total or partial production of components on both faces of the layer.

By way of illustration, a detachment method is described next in the context of producing a new SOI structure that is referred to herein as the second SOI structure. This kind of method, a priori less direct than the techniques previously mentioned, nevertheless has a number of benefits. The example chosen here relates to the production of a second SOI substrate with a buried oxide layer 500 Å thick, which thickness is difficult to obtain using this kind of method directly.

Figure 2:
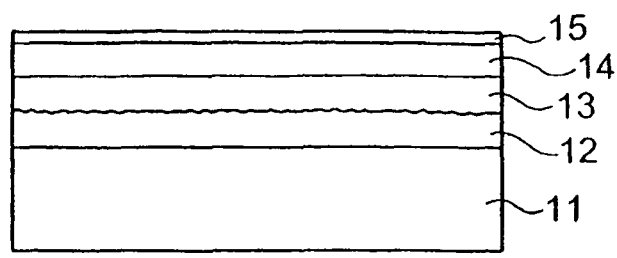
FIG. 2 is a diagrammatic view of the FIG. 1 combination after depositing or growing a surface layer.
Figure 3:
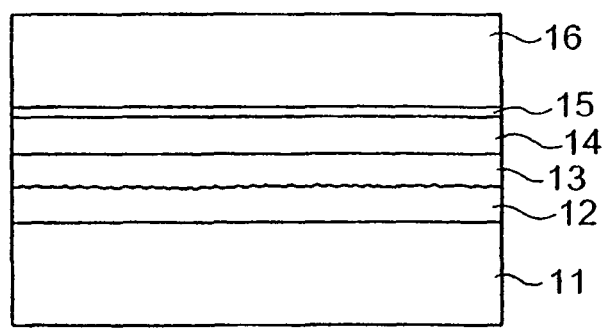
FIG. 3 is a view of the previous structure after molecular bonding a second substrate known as the final substrate.
Figure 5:
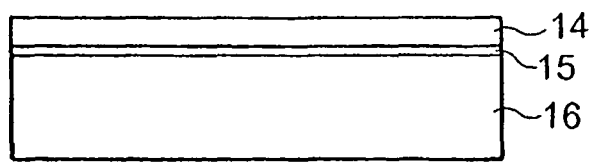
FIG. 5 is a diagrammatic view of a wafer obtained after lifting off and removing the freed interface layer.
Figure 6:
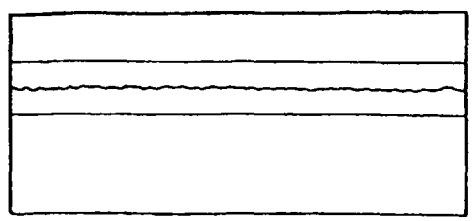
FIG. 6 is a view of a FIG. 1 type detachable assembly.
Figure 7:
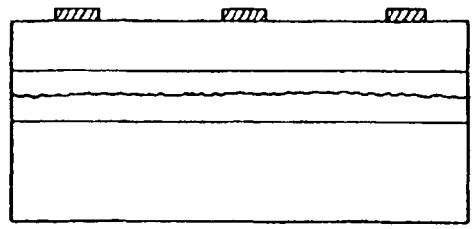
FIG. 7 is a view thereof after the production of components, for example a first transistor gate.
Figure 8:
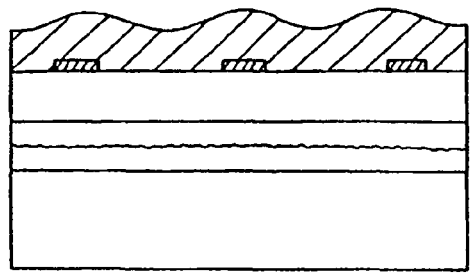
FIG. 8 is a view thereof after depositing oxides.
Figure 9:
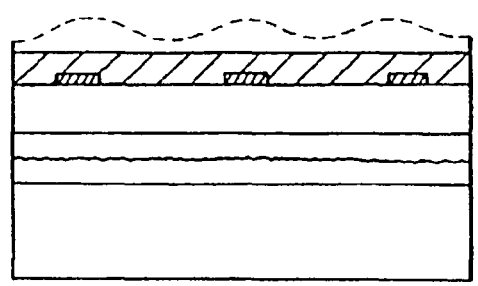
FIG. 9 is a view thereof after planarization (for example by CMP)
Figure 10:
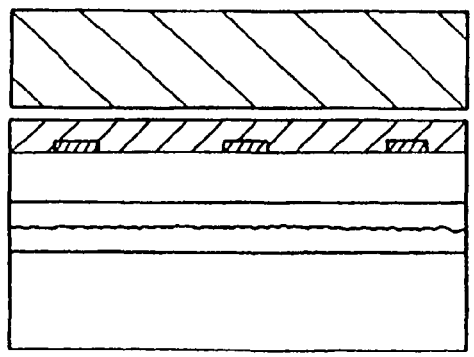
FIG. 10 is a view thereof after molecular adhesion bonding (including heat treatment)
Figure 11:
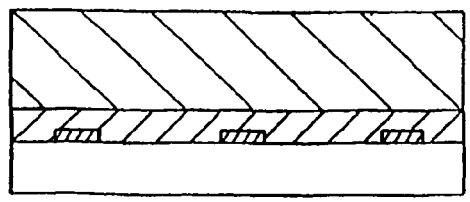
FIG. 11 is a view thereof after detachment and deoxidation to remove the freed interface layer.
Figure 12:
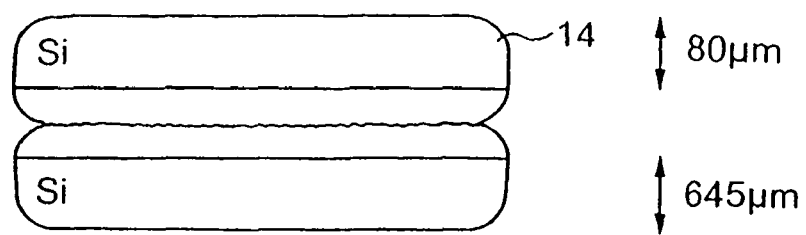
FIG. 12 is a view of a FIG. 1 type detachable assembly.

The first structure is obtained by one of the methods previously described, yielding a detachable substrate corresponding to FIG. 1. In this example the monocrystalline silicon layer 14 is to become the active layer. Onto this detachable substrate, in which the connecting layer has been roughened before bonding and has not undergone any strengthening heat treatment at very high temperatures (preferably less than 1 100.degree. C. and even better less than 1 000.degree. C. or even 900.degree. C.), a 500.ANG. oxide layer 15 is formed by thermal oxidation to yield the structure shown in FIG. 2. This oxide is to become the buried oxide of the second SOI structure. In the present example, the detachable substrate (11+12+13+14+15) is molecular adhesion bonded to a silicon substrate 16 (see FIG. 3) that is to become the final support of the active layer. The stack obtained is preferably stabilized at a high temperature (1 100.degree. C.) to consolidate strongly the second bond at the interface of the layers (15) and (16). The first bond, if subjected to the same treatment, nevertheless has, a mechanical strength less than that of the second bond because it is roughened first. A chemical and/or mechanical lift-off method can be used. For example, the stack obtained as above is first immersed in a hydrofluoric acid bath, one object of which is to overetch the oxide layers (12) and 13, starting from the edges of the assembly. The two interfaces 12/13 and 15/16 are preferentially etched. Moreover, the interface 12/13 of the detachable substrate is advantageously an oxide/oxide interface. This facilitates etching of the interface 15/16 between the oxide and the silicon. Accordingly, during this first lifting off step, there is less surface etching at the interface of the second bond than at the interface of the detachable substrate. Mechanical detachment (by pressurized water jet, as in the document EP 0925888, by compressed air jet, as in the document FR 2796491, by traction, as in the document WO 00/26000, by insertion of a blade, etc.) completely frees the final structure 13+14+15+16 (see FIG. 4). Following removal of the oxide 13, for example by hydrofluoric etching, the final SOI structure is obtained (FIG. 5). The Si wafer 11 that served as a substrate within the detachable substrate can be recycled and reused, for example to produce another detachable substrate (preferably after eliminating the layer 12).

Figure 22:
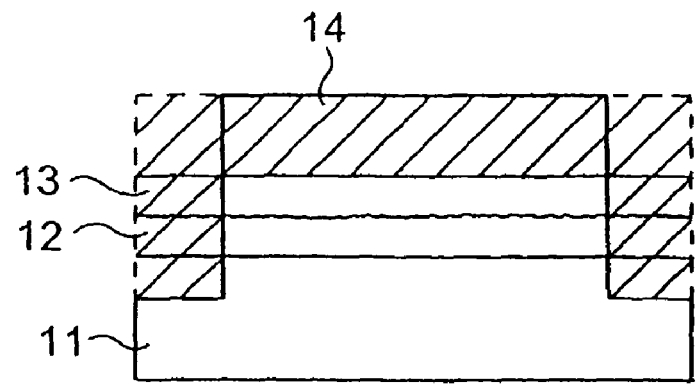
FIG. 22 is an overall view analogous to that of FIG. 1, showing regions that are eliminated by chemical and mechanical cutting.
Figure 23:
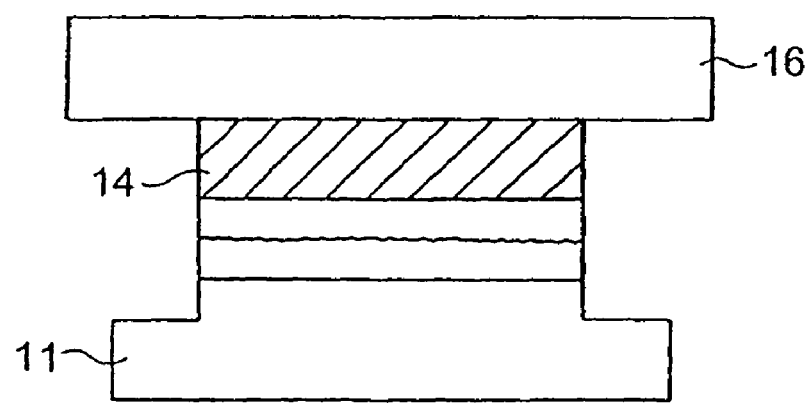
FIG. 23 is a view thereof after bonding an upper substrate.

Another way to facilitate the onset of detachment is to eliminate at least part of an outer ring of the substrate. Wet or dry chemical etching techniques or other mechanical polishing, laser cutting, etc. techniques can be employed for this, localized to the ring (which yields the FIG. 22 configuration in which the cross-hatched areas are to be removed, which yields the FIG. 23 configuration after fixing a second substrate).

Note that the 500 Å thick buried oxide layer 15 formed previously on the layer 14 could have been formed on the substrate 16 before bonding rather than on the layer 14. Another variant divides the 500 Å thickness into two portions, with one portion on the substrate 16, for example 250 Å thick, and the other portion on the layer 14, also 250 Å thick in this example.

Note that if the two molecular adhesion bonded interfaces are both of the oxide/oxide type, stabilization of the second bond at high temperature can be carried out in such a way as to guarantee that preferential hydrofluoric acid etching occurs at the first interface. In this method, the creation of a weak first interface achieves preferential detachment of the complete stack at the first bonding interface.

Another example of the use of the method according to the invention relates to the production of double-gate transistor structures (see FIGS. 6 to 11). The first operations relating to the fabrication of the transistors essentially consist in producing the first CMOS transistor gate (FIG. 7) on a detachable substrate using conventional technology (FIG. 6), as shown in FIG. 1, for example, in exactly the same way as previously described for the production of SOI structures with a thin buried oxide layer. The bonding stabilization temperature can be reduced in a temperature range of the order of 900/1 000° C. An oxide layer with a thickness of the order of 1 µm is then deposited onto this substrate (FIG. 8) using a conventional deposition technique (for example CVD). The oxide is planarized (FIG. 9) using a conventional chemical/mechanical polishing technique. This is followed (FIG. 10) by molecular adhesion bonding to another silicon substrate 16. The bonding is preferentially stabilized at a temperature from 1 000 to 1 100° C. if the structures formed for the first gate can withstand this high a temperature, or at temperatures of the order of 900/1 000° C. otherwise. Finally (FIG. 11), detachment is carried out in exactly the same way as previously (insertion of a blade, pressurized water jet, compressed air jet, etc.). Before resuming the transistor fabrication process, in particular to produce the second gate, the remainder of the oxide layer 13 is removed by chemical etching. Because the oxide is etched with a hydrofluoric acid solution of known etching selectivity with respect to silicon, etching stops naturally once the oxide has been entirely etched, revealing a silicon surface. The major advantage of this detachment technique over other techniques, for example based on fractures obtained by way of implantation for example, is that it does not necessitate excessively complex finishing sequences that are problematic in terms of their potential to create defects, as for a final polishing operation, for example.

The same process can be used in many other applications. If the first SOI structure (see FIG. 1) is used to produce transistors, circuits, components, etc., these can be finally transferred onto many types of dedicated support. For example, the substrate 16 can be chosen for its electrical insulation properties (high-resistivity silicon, quartz, sapphire, etc.) to provide an ideal support for microwave and telecommunication circuits, thereby limiting losses in the substrate. For applications relating to flat screens, a transparent substrate, for example of molten silica, is chosen for the final support.

Another example of detachment is briefly described here in the case of producing circuits on thin substrates (FIGS. 12 to 15). The final thicknesses of interest are typically less than a few hundred µm, even of the order of a few tens of µm. They relate, for example, to power applications or applications to smart cards and other circuits for which some flexibility is required (plastics material supports, curved supports, etc.). This example relates to a type of detachment necessitating no transfer to a target substrate. Here the object is to achieve detachment without transferring the layer 14 after producing the circuits or components, when the layer 14 is sufficiently thick to be self-supporting but too thin to withstand without damage a collective circuit production process (typically less than a few hundred µm thick, and even of the order of a few tens of µm). The method of producing the detachable substrate is identical in every respect to any of those described previously to produce the FIG. 1 structure, for example. In the case of 200 mm diameter silicon wafers, the standard substrate thickness is 725 µm. If the application requires a final substrate thickness of 80 µm, for example, a silicon substrate 725−80=645 µm is chosen (FIG. 12) for the support substrate 11. The resulting assembly therefore corresponds to the standard thicknesses and offers satisfactory resistance to the processes for fabricating components. After production of the latter (FIG. 13), one of the detachment techniques previously cited may be used (FIG. 14), except that the substrate 16 can be omitted. After detachment, the self-supporting layer 14 (FIG. 15) alone represents the final substrate of interest, characterized by a substrate thickness of 80 µm, including the components.

The parameters for preparing the detachment interface have to be adapted to the technological operations that have to be carried out on the detachable substrate prior to detachment, in particular thermal and chemical treatments, and according to the nature of the mechanical stresses. For example, if the detachable substrate consists of a surface layer of germanium having an $SiO_2$—$SiO_2$ bonding interface that has to withstand an epitaxial growth temperature of 550° C. (which is typical in the case of growing GaInAs to constitute a solar cell for use in space), then the rms roughness must advantageously be 0.4 nm for the substrate to be detachable.

Another example of use concerns the production of circuits for smart cards, where the flexibility of the support becomes critical, firstly because of the increase in the size of the circuits, and secondly because the trend is to require cards with ever higher resistance to deformation. A monocrystalline silicon support whose thickness is greater than around 50 µm is too fragile in this context, because its thickness is too high if it is subjected to a bending force, as can happen regularly with a smart card.

Figure 13:
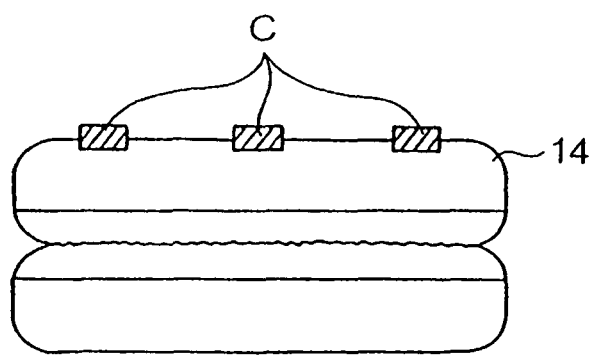
FIG. 13 is a view thereof after production of components.
Figure 14:
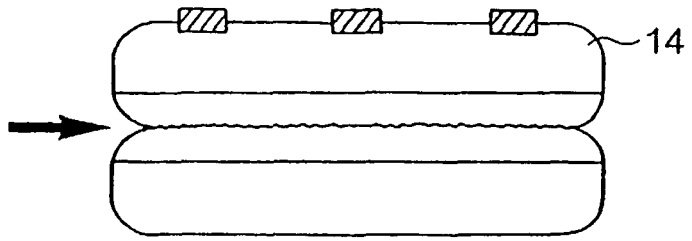
FIG. 14 is a view thereof during detachment by hydrofluoric acid etching and/or application of mechanical forces without transfer to a target substrate.
Figure 15:
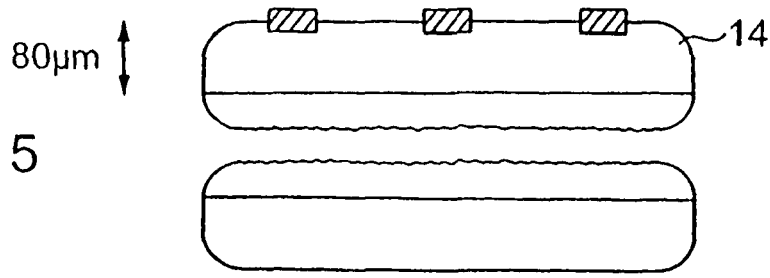
FIG. 15 is a view thereof after detachment into a final substrate and a substrate that can be recycled.

Note that, for the production of dies, there can be provided (see FIG. 16), starting from the FIG. 13 configuration, notches isolating fragments that a pull-off tool SA can remove individually (FIG. 17).

FIG. 18 shows a starting assembly similar to that shown in FIG. 1, with a starting substrate 11' covered with a layer 12' of silicon oxide that is molecular adhesion bonded to a second layer 13' of silicon oxide, in turn covered with a silicon layer 14'. The circuits are produced within the silicon layer 14'. Then, for assembly to the second support 16', an adhesive is preferably chosen that produces a very thin layer 15, whilst having the highest possible mechanical strength at low temperature, for example <400° C., so as not to risk damaging the components of the active layer produced after this bonding step. These can advantageously be adhesives hardened by heat or by exposure to UV radiation (in this latter case, it is sufficient to choose a final substrate 16' that is transparent to UV) (see FIG. 19).

To lift off the detachable substrate (here at the bonding interface 12'/13'), it may appear difficult to produce purely chemical lift-off because adhesives and substrates transparent to UV (in practice made of quartz and glass) are not totally inert to the chemical products (hydrofluoric acid, solvents, etc.). On the other hand, a purely mechanical action may be sufficient to lift off the structure at the interface 12'/13' if the bonding energy at the detachment interface is made lower than the strength of the adhesive and the various layers constituting the integrated circuits (this can be achieved relatively easily). It is then possible to use the substrate 11' several times. To facilitate detachment, it may be advantageous to eliminate an outer ring of the substrate. Apart from limited chemical etching of the outer ring of the substrate, it is further possible to eliminate the ring by making a circular cut in the structure after adhesive bonding. The cutting can advantageously be effected by a laser (see FIGS. 22 and 23).

As a general rule, the residue of the first substrate is obtained, the support of the substrate referred to until now as "detachable" (FIG. 20) and reusable, preferably after polishing the layer 12' and the active layer 14' that is transferred onto another support 16', as in FIG. 21, or alternatively is free and self-supporting if the thickness of the layer 14' is appropriate.

Unlike the preceding examples, the second substrate 16' can instead be merely an intermediate substrate in a much longer process. The structure shown in FIG. 21 can itself be a detachable structure. Production will then continue either with the pure and simple elimination of the intermediate substrate 16' or another layer transfer operation onto a yet further support, generally involving elimination of the substrate 16'. The detachable substrate obtained with the aid of the technique previously described is adhesive bonded to the intermediate substrate after it has been "processed". The intermediate substrate can be rigid or flexible (see the above examples). If it is rigid, it can even be a silicon wafer.

The use of adhesive films known to the person skilled in the art can be envisaged for the adhesive bonding, in particular for the operations of cutting silicon wafers and encapsulating integrated circuits or packaging or back-ending ("Blu Tak", Teflon® adhesive film, etc.). If the adhesive film is double-sided, it may be as well to stick an intermediate substrate to the rear face of the film, to act as a substrate or support for stiffening the assembly at cutting time.

The lift-off techniques that can be envisaged include the application of traction and/or shear and/or bending forces. It may be as well to combine the application of force with chemical etching of the interface, or other means, such as ultrasound. If the interface to be lifted off is of the oxide type, etching the low energy interface is facilitated at the bonding interface and this encourages the transfer of the processed layer to the intermediate substrate. Under these conditions, it is advantageous for the processed layers to be protected (for example by an additional deposit of nitride in the case of hydrofluoric acid etching).

The means for applying stresses can be mechanical (in particular by inserting a blade at the bonding interface), and/or use a lift-off tool (see WO 00/26000), and/or a jet, or involve inserting a gas flow, as described in the document FR 2796491, and/or a liquid (see EP 0925888, EP 0989593). In the case of a gas flow (or even a liquid flow, for example a flow of hydrofluoric acid if the interface is of oxide), the detachable substrate can advantageously be prepared beforehand (for example by chemical etching) to feed the fluid locally to the bonding interface. This facilitates preferential lifting off at the multilayer structure bonding interface, where the lifting off must take place, by protecting the various layers of the structure incorporating the components. Thus it is possible to lift off the bonding interface even when the adhesion between the internal component layers is weak.

The intermediate substrate, which is sometimes referred to as a "handle", can then be cut, totally or in part (to form notches or cutting precursors), into elements corresponding to the electronic components, which can be transferred to different supports. The transfer can be collective, in which case all of the components, even if they are interconnected only by a support, are transferred at the same time in the same technological operation, or component by component (or die by die), if the latter are transferred one after the other. The supports can be of plastics material, as in the case of a smart card, and in this case an adhesive is advantageously used for the transfer. The elements can also be transferred onto a wafer incorporating other electronic or opto-electronic devices, in which case the transfer can again use a molecular adhesion technique (see FIGS. 1 to 5, imagining the additional presence of components formed in the layer (14)). The elements can be transferred by conventional means such as pick and place means. The elements can also be transferred onto another support to improve the thermal properties, for example.

Then, by applying stress or localized heating (for example using a laser), the thin layer, previously bonded to its final support, can be separated (element by element, or globally) from its handle by means of mechanical forces.

As opposed to embodiments of the method according to the invention that tend to encourage detachment of the layer from its substrate at the global level, i.e. on the scale of the whole of the substrate, others tend to delimit fragments, the shape of which is clearly related to the dies or components to be produced from the active layer. One interesting variant consists in using conventional component cutting techniques (sawing, laser cutting, etc.) to cut or delimit trenches, at least partially around dies, fragments, etc. Another beneficial variant is based on the use of chemical etching associated with a photolithography operation to produce identical trenches and/or to remove the connecting region at the contour of the dies. For example, after preparing molecular adhesion bonding over a large area, only layers 3 and 4 are cut (FIG. 16) to the contour shown, after which each fragment is lifted off the substrate, which amounts to considering that the substrate is lifted off each fragment (as an alternative, all the layers or all of the fragments can be cut at one and the same time).

Of course, the embodiments previously described are not limited to the single case of monocrystalline silicon, and can be extended to many materials, such as other semiconductor materials (Ge, SiGe, SiC, GaN and other equivalent nitrides, AsGa, InP, etc.), ferro-electric and piezo-electric materials (LiNbO$_3$, LiTaO$_3$), and magnetic materials, whether components are produced before detachment or not.

As already mentioned, for the situation of a detachable substrate consisting of a surface layer of germanium having an SiO$_2$—SiO$_2$ bonding interface that has to be subjected to an epitaxial growth temperature of 550° C. (as is typical in the case of growing GaInAs to constitute a solar cell for use in space), then the rms roughness should advantageously be 0.4 nm for the substrate to be detachable.

Figure 24:
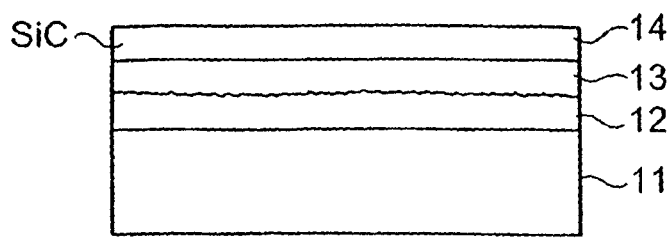
FIG. 24 is a view of an assembly analogous to that of FIG. 1.
Figure 25:
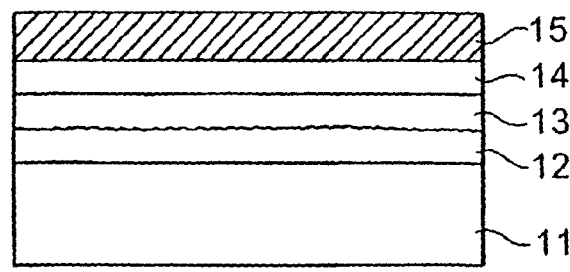
FIG. 25 is a view thereof after depositing an epitaxial stack based on GaN.
Figure 26:
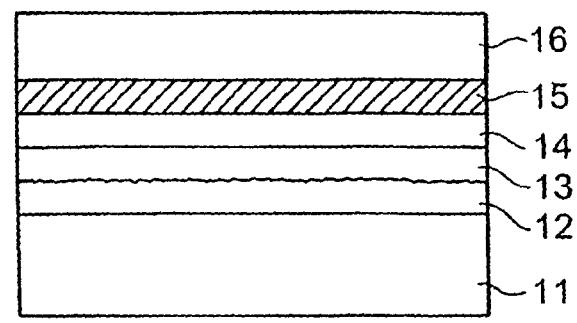
FIG. 26 is a view thereof after bonding of a substrate.
Figure 27:
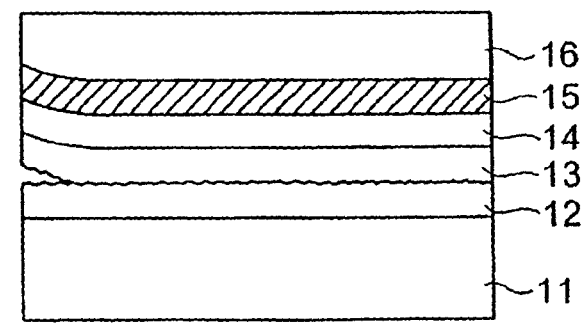
FIG. 27 is a view thereof at the time of lifting off.
Figure 28:
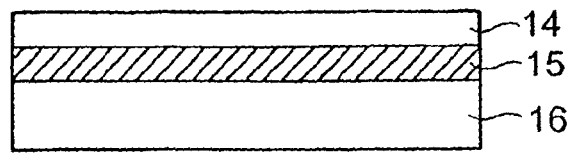
FIG. 28 is a view thereof of the upper portion thereof after removing the freed interface layer.
Figure 29:
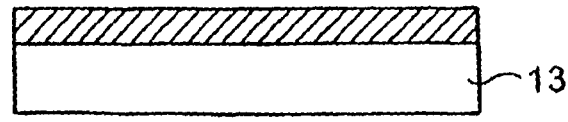
FIG. 29 is a view thereof after removing the layer initially under the stack.

Another example (FIGS. 24 to 29) is that of epitaxially growing an epitaxial stack on a detachable substrate (FIG. 24). This applies in particular to the production of blue and white LEDs and thin layer laser diodes (for example, for improved extraction of the light emitted or improved evacuation of heat, thanks to transfer onto a substrate that is a good conductor of heat, such as copper or diamond). In this case, the epitaxial stack concerned (FIG. 25) is based on composite semiconductors derived from GaN (AlN, GAIN, GaAlInN, etc.). One method consists of using one of the processes previously described to form a detachable structure equivalent to that of FIG. 1 (or the like figures previously cited) in which the layer (14) is of SiC$_6$H (the transferred Si face is at the top in the figures), the layers (12) and (13) are of silicon oxide, as in the FIG. 1 example, and the substrate (11) is of polycrystalline SiC (or sapphire). The stack based on nitrides is grown epitaxially on this structure. The epitaxial techniques used can be those well known to the person skilled in the art, for example, such as molecular beam epitaxy (MBE) for one category, and metallo-organic chemical vapor deposition (MOCVD) for another category. In the former case, the epitaxial growth temperatures rarely exceed 600° C., whereas the typical temperatures for the second category can be as high as 1 100° C. For each of the above two techniques, the choice of parameters related to the mechanical strength of the bonding interface (roughening, strengthening by heat treatment, hydrophilic properties, etc.) must be optimized. In the second case, one of the processes previously described based on roughening of the two oxide layers 12 and 13 by hydrofluoric acid etching is chosen, for example. Subsequent MOCVD epitaxial growth on this structure at 1 100° C. produces a stack whose thickness is of the order of 1 μm. The structure is optionally annealed before the epitaxial growth stage, typically in the temperature range from 900 to 1 200° C., in order to consolidate strongly the mechanical strength of the ring. After the growth step, the assembly is subjected to deposition of oxide, planarization by CMP, and where applicable molecular adhesion bonding of a substrate 16 (for example onto a silicon substrate), and annealing at 1 100° C. to strength this latter bonding. Finally, the detachable substrate is separated at the bonding interface (FIG. 27). A preliminary step consisting of a few hours in a 50% hydrofluoric acid bath is advantageously sufficient to etch the oxide layer laterally to a depth of a few millimeters from the edge of the substrate. This is followed by detachment by means of mechanical forces, for example by inserting a blade, applying a pressurized water jet, or applying a compressed air jet, using the techniques previously described, for example, yielding what is shown in FIG. 28. A final deoxidation step removes the residue of the oxide layer (13). At least the SiC layer 14 that served as a nucleation layer for the epitaxial stack can optionally be eliminated by etching (FIG. 29). Diodes can be produced before or after the final transfer.

Note that, according to the invention, an alternative to roughening or modifying the hydrophilic properties is to use low temperatures for annealing the bonding interface, instead of the traditional temperatures of 1 100 to 1 200° C. in the case of bonding where the surfaces are not necessarily roughened. The annealing temperatures are advantageously optimized to obtain a bonding energy sufficient for the components but sufficiently low to allow detachment at the required time.

In accordance with one aspect of the invention that is original in its own right, there is, after production of the interface, and an optional technological production step (production of homogeneous or non-homogeneous structures, complete or partial production of components, epitaxial growth, etc.) lifting off with chemical etching and/or application of mechanical forces, for example by jets of air or other fluids, localized to the bonding interface of the detachable substrate.

The inventors have thus demonstrated that roughening or modification of the hydrophilic properties of the surfaces can produce detachable bonding interfaces, even after annealing at high temperatures, up to 1 100° C. By judiciously combining the roughening preparation before bonding with suitable thermal annealing treatments, it has been shown that detachable SOI substrates can withstand, without untimely detachment at the assembly interface, most of the steps of a process for the production of CMOS transistors (including in particular heat treatment steps at high temperatures, typically 1 100°

C., as well as steps of depositing constrained layers, for example of nitride), and could a posteriori be separated at the bonding interface by the intentional application of controlled mechanical stresses. This has also been demonstrated for other applications, relating, for example, to the execution of an epitaxial deposition step before separating the substrate.

The invention claimed is:

1. A method of producing a detachable structure by molecular adhesion bonding of one face of a first wafer to one face of a second wafer, the method comprising:
    treating at least one of the faces to modify the hydrophilic properties to produce a controlled level of mechanical strength of a global continuous bonding interface between the first and second wafers,
    wherein treating at least one of the faces comprises applying a chemical agent and increasing the roughness;
    bonding the first and second wafers at the bonding interface;
    producing components on at least a portion of one of the first and second wafers after bonding; and
    subsequently separating the first and second wafers at the global continuous bonding interface by application of one or both of chemical etching or mechanical force.

2. A method according to claim 1, wherein the step of treating at least one of the faces comprises a step of wet or dry cleaning to modify the hydrophilic properties or both of at least one of the faces.

3. A method according to claim 1, wherein a thin active device layer is produced in at least one of the first and second wafers.

4. A method according to claim 3, wherein the thin active device layer is obtained by one or both of chemical or mechanical thinning of at least one of the first and second wafers.

5. A method according to claim 1, further comprising a step of producing all or part of micro-electronic, opto-electronic, mechanical, piezo-electric, superconductor, or magnetic components.

6. A method according to claim 1, further comprising detaching and using at least one of the first and second wafers again.

7. A method according to claim 3, wherein the thin active device layer comprises a layer of semiconductor material.

8. A method of producing a detachable structure by molecular adhesion bonding of a face of a first wafer to a face of a second wafer, the method comprising:
    forming an insulating layer on the face of at least the first wafer or the second wafer, and chemically etching the insulating layer to remove a thickness of the insulating layer, so as to modify the hydrophilic properties and produce a controlled level of mechanical strength of a bonding interface between the first and second wafers;
    bonding the first and second wafers at the bonding interface; and
    producing components on at least a portion of one of the first and second wafers after bonding,
    wherein the bonding is compatible with a subsequent separation of the first and second wafer at the interface.

9. A method according to claim 8, wherein the chemical etching comprises acid etching.

10. A method according to claim 9, wherein the insulating layer comprises an oxide and the acid etching is carried out using hydrofluoric acid.

11. A method of producing a detachable structure by molecular adhesion bonding of one face of a first wafer to one face of a second wafer, the method comprising:
    treating at least one of the faces to modify the hydrophilic properties and to produce a controlled level of mechanical strength of a bonding interface between the first and second wafers
    bonding the first and second wafers at the bonding interface; and
    producing components on at least a portion of one of the first and second wafers after bonding,
    wherein the bonding is compatible with a subsequent detachment of the detachable structure, and
    wherein a thin layer is produced in at least one of the first and second wafers, and wherein the thin layer is obtained by fracturing a buried weak region of the first or second wafers.

12. A method according to claim 11, wherein the buried weak region is obtained by a process comprising implanting gaseous substances.

13. A method of producing a detachable structure, the method comprising:
    treating at least one face of a first or second wafer to modify the hydrophilic properties and to produce a controlled level of mechanical strength of a bonding interface between the first and second wafers that is compatible with the production of components on at least a portion of one of the first and second wafers and that is compatible with a subsequent separation of the first and second wafers at the bonding interface;
    molecular adhesion bonding the face of the first wafer to the face the second wafer to form the bonding interface;
    bonding the first and second wafers at the bonding interface;
    producing components on at least a portion of one of the first and second wafers after bonding the first and second wafers;
    forming a second bond having a bond strength greater than the bond strength of the molecular adhesion bond,
    wherein forming the second bond comprises adhesively bonding the detachable structure to a substrate; and
    subsequently separating the first and second wafers at the bonding interface by application of one or both of chemical etching or mechanical force,
    wherein separating the first and second wafers comprises a phase where at least one of the first and second wafers is cut into at least one element before separating.

14. A method according to claim 13, wherein separating the first and second wafers comprises a phase where at least one of the first and second wafers is cut into at least one element before separating.

15. A method according to claim 14, wherein separating the first and second wafers is carried out component by component.

16. A method according to claim 13, wherein forming the second bond comprises molecular adhesion bonding.

17. A method according to claim 13, wherein said adhesive bonding is carried out using an adhesive hardened by UV radiation.

18. A method according to claim 13, further comprising a step of lifting off the substrate by one or more of chemical etching, application of mechanical, thermal stress, or photonic stress.

19. A method of producing a substrate, the method comprising:
    treating at least one of the faces of a first wafer and a second wafer to modify the hydrophilic properties and to produce a controlled level of mechanical strength of a bonding interface between the first and second wafers;

molecular adhesion bonding the face of the first wafer to the face of the second wafer at the bonding interface to form a detachable structure;

producing components on at least a portion of one of the first and second wafers after molecular adhesion bonding;

bonding the detachable structure to a third substrate; and separating the detachable structure at the bonding interface by application of one or both of chemical etching or mechanical force.

* * * * *

UNITED STATES PATENT AND TRADEMARK OFFICE
CERTIFICATE OF CORRECTION

PATENT NO. : 7,902,038 B2  
APPLICATION NO. : 10/474984  
DATED : March 8, 2011  
INVENTOR(S) : Bernard Aspar et al.

Page 1 of 1

It is certified that error appears in the above-identified patent and that said Letters Patent is hereby corrected as shown below:

On the Title Page

Item (73) Assignee after "Commissariat" replace "A l'Energie" with --a l'Energie--.

Signed and Sealed this  
Twenty-fourth Day of January, 2012

David J. Kappos  
*Director of the United States Patent and Trademark Office*